(12) United States Patent
Mashita et al.

(10) Patent No.: US 6,219,065 B1
(45) Date of Patent: Apr. 17, 2001

(54) METHOD FOR INPUTTING AND ACQUIRING REQUIREMENT

(75) Inventors: Yuichi Mashita, Yokohama; Hisashi Takahashi, Sagamihara; Shoichi Kubo, Tokyo; Katsuhiko Yuura, Kodaira; Miho Saito, Sagamihara, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/496,260

(22) Filed: Feb. 1, 2000

Related U.S. Application Data

(63) Continuation of application No. 08/997,971, filed on Dec. 24, 1997, now Pat. No. 6,034,802, which is a continuation of application No. 08/533,380, filed on Sep. 25, 1995, now Pat. No. 5,729,253, which is a continuation-in-part of application No. 07/852,768, filed on Mar. 17, 1992, now Pat. No. 5,517,604.

(30) Foreign Application Priority Data

Mar. 20, 1991 (JP) .................................. 3-056470
May 29, 1991 (JP) .................................. 3-124350
Sep. 28, 1994 (JP) .................................. 6-232776

(51) Int. Cl.⁷ .................................................. G06T 17/00
(52) U.S. Cl. ........................................ 345/433; 345/334
(58) Field of Search .................................. 345/418, 433, 345/326, 333, 334, 340, 352, 343, 353, 335

(56) References Cited

U.S. PATENT DOCUMENTS

| | | |
|---|---|---|
| 4,656,603 | 4/1987 | Dunn . |
| 4,962,472 | 10/1990 | Seki et al. . |
| 5,019,961 | 5/1991 | Addesso et al. . |
| 5,247,610 | 9/1993 | Oshima et al. . |
| 5,255,363 | 10/1993 | Seyler . |
| 5,572,642 | 11/1996 | Nasu . |
| 5,590,330 | 12/1996 | Coskun et al. . |
| 5,649,180 | * 7/1997 | Danno .................................. 395/601 |
| 5,761,656 | * 6/1998 | Ben-Shachar ........................ 395/326 |

FOREIGN PATENT DOCUMENTS 7-44729    2/1995   (JP) .

OTHER PUBLICATIONS

Abe, Noriyuki et al, "A Study of Switching Service Modeling System," SSE 90–114 of Electronic Information Communication Institute, 1991, pp. 1–6.

Maejima, Yukihito et al "Object–Oriented Description of Exchange of Exchange Service Specification," Japanese paper in the 2nd Workshop of the Institute of Electronics Information and Communication Engineers, Apr. 8, 1997, pp. C–2–1–C–2–4.

van der Meulen, Pieter S. "INSIST: Interactive Simulation in Smalltalk," ACM OOPSLA '87 Proceedings, Oct. 4–8, 1987, pp. 366–376.

(List continued on next page.)

*Primary Examiner*—Cliff N. Vo
(74) *Attorney, Agent, or Firm*—Mattingly, Stanger & Malur, P.C.

(57) ABSTRACT

On a computer, components forming a development subject are arranged on a scenario editor by using basic component parts, and the component data are set. And a procedure call sequence is defined by specifying procedures of defined components in order of call. The call sequence data is generated in the computer as scenario data. Then, the defined group of scenarios are selected and reflected on the model editor. A whole requirement is created. At that time, a procedure name to be called subsequently on the connection line between components is acquired from the defined procedure sequence data, and a program for effecting animation is generated. Finally, by executing the generated animation program, the procedure call sequence is displayed in an animation form and the requirement is created. By interactive operation alone of the screen using the scenario editor and the model editor, therefore, the requirement of the development subject from the customer can be easily acquired and the whole requirement can be created.

4 Claims, 52 Drawing Sheets

OTHER PUBLICATIONS

Rekimoto, Junichi et al, "Canae: A High Level Software Platform for User–Interface Developing Using Editor Parts," Information Processing Society, vol. 31, No. 5, May 1990, pp. 602–611.

Shu (Visual Programming), 1988 by Van Nostrand Reinhold Company, Inc. pp. 190–239.

"ODETTE: Design Support Construction Environment Based on Object–Oriented CLOS," Object–oriented Software Technique Symposium Record, 1991, pp. 1–11.

Pei Hsia et al, "Formal Approach to Scenario Analysis," IEEE Software, Mar. 1994, pp. 33–41.

* cited by examiner

FIG. 34D

| Ref_Pos | No. | — |
| | Position | — |
| Org_Serv_ID | | — |
| Org_Mess | Meth | — |
| | Meth_ID | — |

| Org_Pos | No. | — |
| | Position | — |
| Ref_Serv_ID | | — |
| Ref_Mess | Meth | — |
| | Meth_ID | — |

| Serv | SPECIFIC CUSTOMER ESTIMATE SERVICE | 3501 |
|---|---|---|
| Serv_ID | 2 | 3502 |

FIG. 35B

| Obj | | CUSTOMER | BUSINESS | ENGINEERING | SLIP |
|---|---|---|---|---|---|
| Slot | | — | — | — | CUSTOMER NAME ESTIMATED AMOUNT OF MONEY |
| Meth | | DISCOUNT ESTIMATE ANSWER | ESTIMATE ORDER DISCOUNT ESTIMATE ACQUISITION | DISCOUNT ESTIMATE CALCULATION | — |
| Fig | Pos | x=10,y=10 | x=50,y=10 | x=50,y=30 | x=25,y=20 |
| | Patt | man1 | man2 | man3 | check |

FIG. 35C

| Pos_No 3507 | | (1) 3503 | (2) 3504 | (3) | (4) |
|---|---|---|---|---|---|
| Obj | | BUSINESS | ENGINEERING | BUSINESS | CUSTOMER |
| Mess 3413 | Meth | ESTIMATE ORDER | DISCOUNT ESTIMATE ANSWER | DISCOUNT ESTIMATE ACQUISITION | DISCOUNT ESTIMATE ANSWER |
| | ID 3505 | 3506 2 3508 | 2 | 2 | 2 |
| Args_Obj | | SLIP | SLIP | — | — |
| Set | | — | CUSTOMER NAME = COMPANY A | — | — |

FIG. 35D

| Ref_Pos | No. | ——— |
| | Position | ——— |
| Org_Serv_ID | | ——— |
| Org_Mess | Meth | ——— |
| | Meth_ID | ——— |

FIG. 35E

| Org_Pos | No. | ——— |
| | Position | ——— |
| Ref_Serv_ID | | ——— |
| Ref_Mess | Meth | ——— |
| | Meth_ID | ——— |

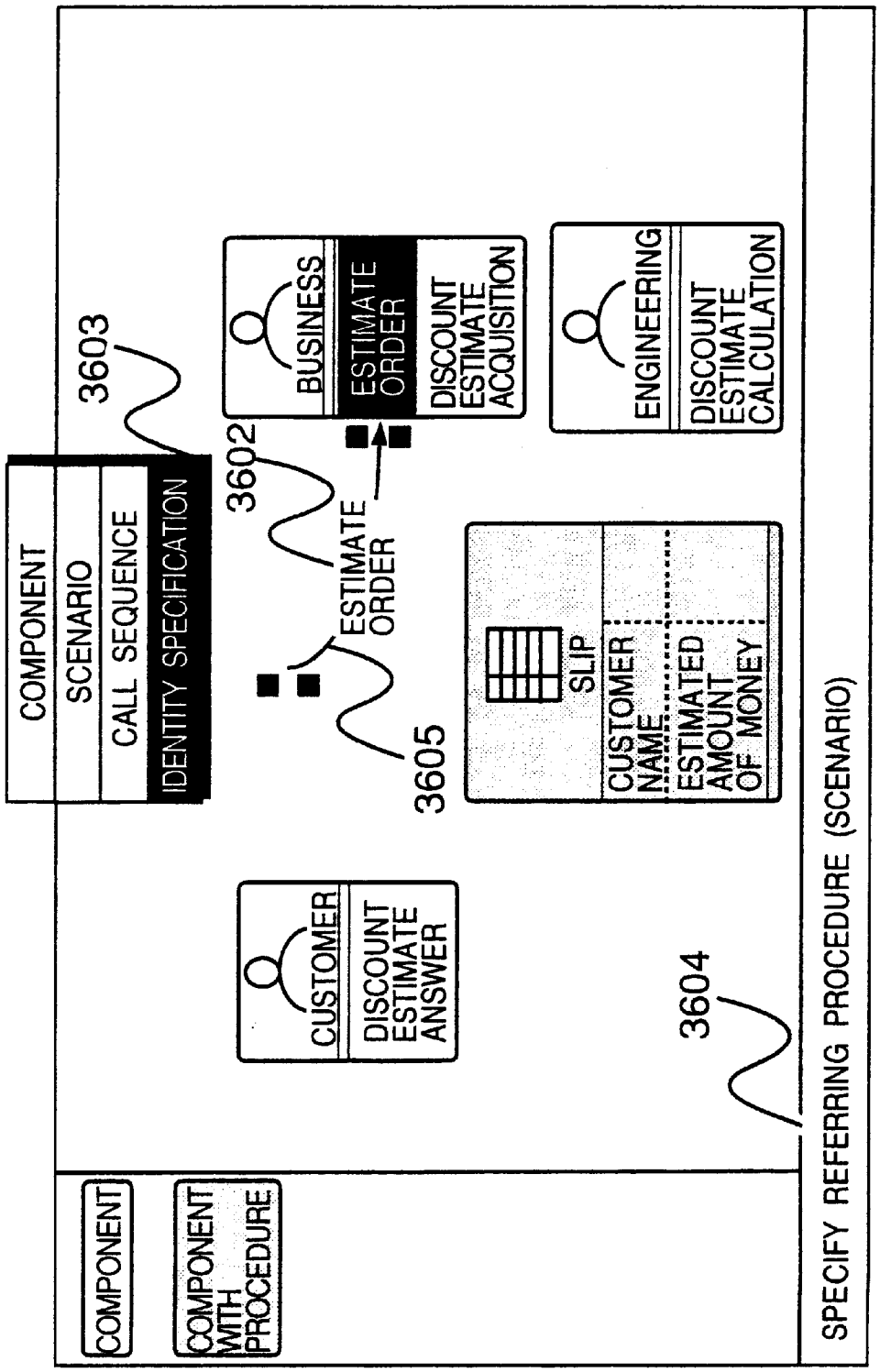

FIG. 39A

| Serv    | GENERAL ESTIMATE SERVICE |
|---------|--------------------------|
| Serv_ID | 1                        |

| Obj | | CUSTOMER | BUSINESS | ENGINEERING | SLIP |
|-----|---|----------|----------|-------------|------|
| Slot | | — | — | — | CUSTOMER NAME ESTIMATED AMOUNT OF MONEY |
| Meth | | ESTIMATE REQUEST ESTIMATE ANSWER | ESTIMATE ORDER ESTIMATE ACQUISITION | ESTIMATE CALCULATION | — |
| Fig | Pos | x=10,y=10 | x=50,y=10 | x=50,y=30 | x=25,y=20 |
|     | Patt | man1 | man2 | man3 | check |

FIG. 39C

| Pos_No | | (1) | (2) | (3) | (4) | (5) |
|--------|---|-----|-----|-----|-----|-----|
| Obj | | CUSTOMER | BUSINESS | ENGINEERING | BUSINESS | CUSTOMER |
| Mess | Meth | ESTIMATE REQUEST | ESTIMATE ORDER | ESTIMATE CALCULATION | ESTIMATE ACQUISITION | ESTIMATE ANSWER |
|      | Meth_ID | 1 | 1 | 1 | 1 | 1 |
| Args_Obj | | — | SLIP | SLIP | — | — |
| Set | | — | — | — | — | — |

| Ref_Pos | No. | — |
| | Position | — |
| Org_Serv_ID | | — |
| Org_Mess | Meth | — |
| | Meth_ID | — |

FIG. 40A

| Serv | SPECIFIC CUSTOMER ESTIMATE SERVICE |
|---|---|
| Serv_ID | 2 |

FIG. 40B

| Obj | | CUSTOMER | BUSINESS | ENGINEERING | SLIP |
|---|---|---|---|---|---|
| Slot | | — | — | — | CUSTOMER NAME ESTIMATED AMOUNT OF MONEY |
| Meth | | DISCOUNT ESTIMATE ANSWER | ESTIMATE ORDER DISCOUNT ESTIMATE ACQUISITION | DISCOUNT ESTIMATE CALCULATION | — |
| Fig | Pos | x=10,y=10 | x=50,y=10 | x=50,y=30 | x=25,y=20 |
| | Patt | man1 | man2 | man3 | check |

FIG. 40C

| Pos_No | | (1) | (2) | (3) | (4) |
|---|---|---|---|---|---|
| Obj | | BUSINESS | ENGINEERING | BUSINESS | CUSTOMER |
| Mess | Meth | ESTIMATE ORDER 4010 | DISCOUNT ESTIMATE ANSWER | DISCOUNT ESTIMATE ACQUISITION | DISCOUNT ESTIMATE ANSWER |
| | ID | 1 | 2 | 2 | 2 |
| Args_Obj | | SLIP | SLIP | — | — |
| Set | | — | CUSTOMER NAME = COMPANY A | — | — |

| Org_Pos | No. | — |
|---|---|---|
| | Position | — |
| Ref_Serv_ID | | — |
| Ref_Mess | Meth | — |
| | Meth_ID | — |

FIG. 46

```
(defclass CUSTOMER () () )       4601
(defclass BUSINESS () () )
    ...
```

```
(defpresentation pn-CUSTOMER
    (pattern "man1")
    (x 10)                        4602
    (y 10) )
(defpresentation pn-BUSINESS
    (pattern "man2")
    (x 50)
    (y 10) )                      4603
    ...
```

```
(defmethod ESTIMATE REQUEST ( (pass::self CUSTOMER ) &rest pass::args)
    (pass::message-head-method-body ' pass::self pass::args))
(defmethod ESTIMATE ANSWER ( (pass::self CUSTOMER ) &rest pass::args)
    (pass::message-head-method-body ' pass::self pass::args))
(defmethod ESTIMATE ORDER ( (pass::self BUSINESS ) &rest pass::args)
    (pass::message-head-method-body ' ESTIMATE ORDER pass::self pass::args))
    ...
```

```
(defmethod
    ((pass::self CUSTOMER ) &rest pass::args)
    (pass::message-around-method-body :head-message
    :send-message   :from CUSTOMER :to BUSINESS :specializers (SLIP)
    :arguments (arg1) :slot-set-form ( (arg1 ' "CUSTOMER NAME
    " COMPANY A ") ) ) )
    ...
```
4604

```
(defmethod balloon-disp1 ( (fromCUSTOMER )
                           (to BUSINESS)
                           (message string)
                           (sheet MODEL ) )
    (let * ( (pn-from (get-presentation from) )         4605
             (pn-to (get-presentation to) )
             (from-pos (get-position pn-from) )
             (to-pos (get-position pn-to) ) )
    (balloon-move
        (make-instance ' BALLOON : string message)
        from-pos to-pos sheet) ) )
        ...
```

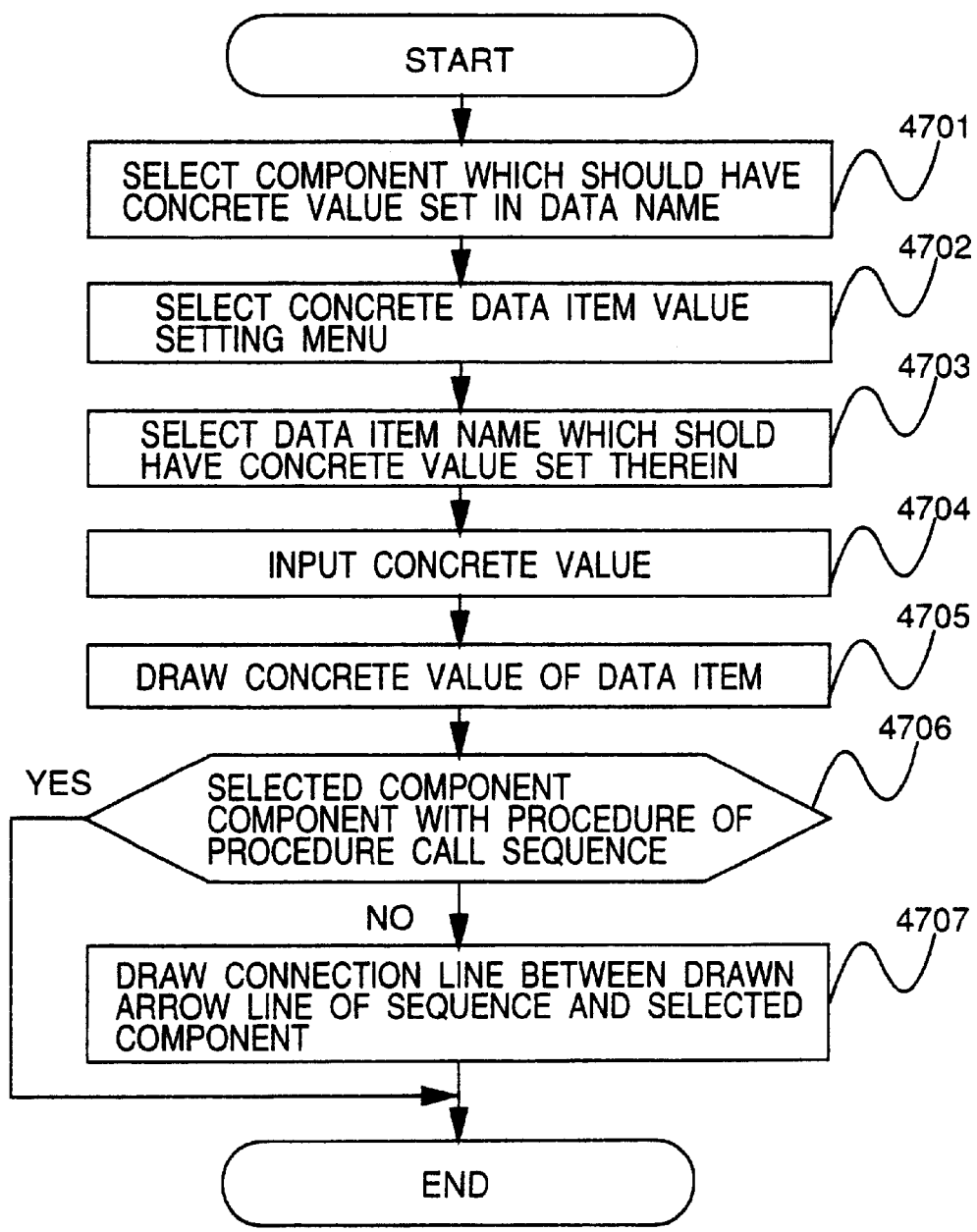

METHOD FOR INPUTTING AND ACQUIRING REQUIREMENT

CROSS-REFERENCE TO RELATED APPLICATION

The present invention is a continuation application of U.S. Ser. No. 08/997,971, filed Dec. 24, 1997, now U.S. Pat. No. 6,034,802 which is a continuation of U.S. Ser. No. 08/533, 380, filed Sep. 25, 1995, now U.S. Pat. No. 5,729,253, which is is a continuation-in-part application of U.S. application Ser. No. 07/852,768 filed Mar. 17, 1992, entitled "Data Input/Output Process and Design Supporting Process", by K. Yuura and H. Takahashi, now U.S. Pat. No. 5,517,604, all disclosure of which is incorporated herein by reference.

BACKGROUND OF THE INVENTION

The present invention relates to acquirement of a requirement in developing application to be developed by using a computer, and in particular to a method for visualizing, defining and acquiring the requirement, and a method for visually displaying the requirement. The "acquiring" means interactively effecting various amendments and alterations upon the visualized requirement and definitely fixing the finally completed requirement.

In development of electronic devices such as computers, support using software is indispensable. Especially in the stage of study of a new kind of machine or a new scheme, it is important to input sketches of various device configurations as models, perform simulation, evaluate the results, repeat them, and examine closely the design principle. Furthermore, it is important to transmit the design principle to the persons concerned accurately and intelligibly.

Likewise, even in the development of a software application system, it has become important business in the design stage of the requirement to produce interactively the requirement and present the requirement to customers in an easily understandable visual form.

On the other hand, creation of the requirement in system development is performed as follows: the customer is asked about the requirement by a system engineer who acquires the requirement from a customer and definitely fixes system specifications; on the basis thereof, the system engineer creates a requirement document; the requirement document is evaluated by the customer; and these steps are repeated until alterations disappear and a final requirement document which satisfies the customer's need is completed. On the basis of the requirement document definitely fixed by the customer and the system engineer, system developers implement the system. In the case where a difference has occurred between the implemented system and the customer's request, the requirement document is recreated and the system is also reimplemented.

For example, in a method described in "ODETTE: Design support construction environment based on object-oriented CLOS," Object-oriented Software Technique Symposium Record, pp. 1–11 (1991), Information Processing Society of Japan, a part which is a design subject is first defined by a program using a programming language and the substance of the procedure of the part is also set by describing a program. Then in order to set display figure data of the part, the operator arbitrarily draws a figure by using a mouse or the like and associates the figure with part data previously programmed and defined. Then an animation program is defined in the program and is set in part attribute definition data and display figure data. In setting the animation program, a procedure for calling the animation is first set in the above described part attribute definition data. And a procedure for the animation is defined by using the above described display figure data and is set in the above described display figure data. Then the operator generates part attribute data on a computer memory by interactive operation. If generation is completed, simulation is executed by executing various procedures of the part attribute data. The result of that simulation is displayed by executing the animation program. To be concrete, execution of the animation program is conducted as described hereafter.

First of all, the animation call procedure is executed, and the animation procedure is called and executed. By execution of the animation procedure, the display figure data is updated. Thereby, the figure is modified so as to conform to new display figure data, and the animation is executed.

Furthermore, in a conventional technique described in JP-A-7-44729, a subject part of a designed system is defined by a data item held by the part and a procedure is defined by programming using the programming language, thereby providing an environment for interactively defining the display figure of the part and operation at the time of implementation of the display figure. Furthermore, simulation of the procedure of the part is executed, and the operation image of the display figure at the time of implementation of the part is displayed in an animation form. Thus, the requirement in the design stage and the image at the time of implementation are confirmed visually, and the requirement is evaluated. For producing requirement satisfying the customer's need more closely, visual evaluation of the requirement must be conducted repetitively.

As for description of the requirement, there is a description method called scenario. The scenario is a method of directly describing the external operation of the system from the view point of the user. For example, in Pei Hsia et. al., "Formal Approach to Scenario Analysis", IEEE Software, March 1994, pp. 33–41 (1994) (paper 2), there are shown, by taking a telephone switching system as an example, operation names of the end user, inputting and confirmation by using a tree of a scenario of system function call, and a procedure leading to phototyping based on a group of inputted scenarios.

In application of the above described conventional technique, the system engineer must have a skill of programming. In the conventional business form, however, the person who hears requirement from the customer, for example, typically does not need the programming technique. For visualizing the requirement, therefore, the person must learn the programming technique. As a result, it was rather difficult for many system engineers to use the conventional technique.

Furthermore, in the above described conventional technique, the program of components must be redefined when a change especially concerning components has occurred in the requirement. Typically, however, it was not easy to add the change while evaluating the requirement.

Furthermore, for visualizing and producing the requirement, it was necessary to abstract contents heard from the customer as a procedure, perform programming, and input it. Typically, the abstracting process for transferring the requirement of the real world to the world on the computer is not easy for the system engineer who hears requirement in a position near the real world.

A change in the requirement needed when the customer evaluated the created visualizing requirement such as an addition of exceptional processing was difficult to effect because the requirements of the whole development subject are produced as a program at a time.

If the whole requirement of the development subject is produced, it is expected that a large number of partial visualized requirements inputted by the user are generated. Furthermore, there is also a possibility that a plurality of users perform the inputting operation. Therefore, it can be expected that it becomes difficult for the user to grasp all of inputted visualized requirements and grasp a visualized requirement edited to create a requirement conforming to the customer's need.

Furthermore, it was not easy to grasp, out of a large number of scenarios, relations between visualized requirements specified intentionally by a user when inputting the visualized requirement.

Furthermore, in the scenario describing method of the paper 2, consideration was not given to showing the scenario intelligibly and it was difficult for the user to confirm each scenario. In addition, since only the operation name and function call were described, it was difficult to represent the requirement concerning the data item flow and changes of the terminal screen. Furthermore, sufficient reference was not made to the method for efficiently generating phototyping from a group of inputted scenarios. Furthermore, since a group of scenarios were inputted by means of one tree, display and interactive editing were difficult in complicated and various scenarios under restrictions of the screen size.

SUMMARY OF THE INVENTION

A primary object of the present invention is to define components and a procedure between components with programless interactive operations when the system engineer acquires the requirement of a development subject from a customer.

Another object of the present invention is to allow components and the procedure to be inputted as a concrete example of business of the real world when the requirement of the development subject is acquired.

Another object of the present invention is to allow components and a flow of the procedure to be inputted with fine units when requirement specifications of the development subject are acquired.

Another object of the present invention is to grasp all of the visualized requirements, which form the whole requirement of the development subject, inputted by the user.

Another object of the present invention is to explicitly display relations subsisted between visualized requirements and specified intentionally by the user when inputting the visualized requirements.

In accordance with the present invention, the requirement is inputted with a scenario by using a scenario editor in order to achieve the above described objects. The scenario is a calling sequence of a procedure held by components of the development subject. It is a continuous sequence having no branches. The scenario is a partial requirement included in the whole requirement of the development subject. Elements forming the scenario are inputted by means of concrete examples. The scenario editor includes an environment for setting and defining components of the scenario out of basic parts forming the base of components of the scenario by using interactive operation, and an interactive operation environment for defining the procedure sequence between the components. The basic part can be defined as any component forming the development subject because any data is not held therein. Furthermore, from the scenario inputted by means of interactive operation, data items of the scenario are automatically generated within the computer.

Furthermore, in accordance with the present invention, a visualized whole requirement of the development subject is created by using a model editor in order to achieve the above described objects. The model editor includes an environment for integrating scenarios defined by the above described scenario editor and an environment for displaying the created whole requirement of the development subject in an animation form. Furthermore, from the integrated group of scenarios, the model editor automatically generates a definition program of components of the whole requirement of the development subject and a program for displaying the call sequence in the animation form on the basis of the procedure sequence data of the scenario.

In accordance with the present invention, identification data are created on the basis of the scenario inputted by using the scenario editor in order to achieve the above described objects. According to operation conducted by the user at the time of scenario input to intentionally-specify relations between scenarios, the scenario editor automatically generates identification data. The identification data means scenario data of portions common to scenarios specified by the user.

In accordance with the present invention, a whole scenario relation diagram of the development subject is created by using a scenario relation diagram editor to visualize all scenarios inputted to create the whole requirement of the development subject, thereby the above described objects being achieved. On the basis of the parallel execution sequence data of scenarios generated by the scenario editor, the scenario relation diagram editor automatically generates relation data of the whole scenario of the development subject. Furthermore, the scenario relation diagram editor includes an environment for visualizing all scenarios included in the whole requirement of the development subject and displaying relations between scenarios on the basis of the automatically generated relation data of the whole scenario of development subject, and an interactive operation environment for acquiring relation data between scenarios.

By setting and defining scenario components, defining a procedure call sequence between components, and automatically generating scenario data items within the computer, with the scenario editor of the present invention and interactive operation, an system engineer who does not need a programming technique can easily create the visualized requirement.

Furthermore, by setting and defining scenario components, with the scenario editor of the present invention, from basic parts which can be defined as any elements forming the development subject, the requirement can be directly inputted to a world of visualized requirement on a computer by means of a concrete example of the real world.

Furthermore, by integrating, with a model editor, a group of scenarios having visualized requirement divided and inputted by means of the scenario editor of the present invention, automatically generating a definition program of components of the whole requirement and a program for displaying the operation of a procedure call sequence in a form of animation on the basis of the procedure call sequence data of a scenario, creating the visualized whole requirement, and interactively altering and adding the divided and inputted requirement when an alteration or an addition has occurred in the requirement, the visualized whole requirement can be easily altered.

Furthermore, by visualizing all scenarios included in the whole requirement and displaying relations between scenarios with the scenario relation diagram editor of the

BRIEF DESCRIPTION OF THE DRAWINGS

FIGS. 34A, 34B, 34C, 34D and 34E show an example of scenario data generated by scenario data generation shown in FIG. 1;

FIGS. 35A, 35B, 35C, 35D and 35E show an example of scenario data generated by scenario data generation shown in FIG. 1;

FIG. 36 shows an example of screen display at the time of conducting procedure identity specification of a scenario inputted by the scenario inputting of FIG. 1 with a different scenario;

FIGS. 39A, 39B, 39C, 39D and 39E show an example of scenario data containing identification data which is generated as shown in FIG. 38;

FIGS. 40A, 40B, 40C, 40D and 40E show an example of scenario data containing identification data which is generated as shown in FIG. 38;

FIG. 46 shows an example of a program generated by program generation of the whole requirement shown in FIG. 1;

FIG. 47 is a flow chart showing the process for setting a concrete value in a data item as a procedure attribute of the procedure call sequence shown in FIG. 18.

DESCRIPTION OF THE PREFERRED EMBODIMENTS

Preferred embodiments of the present invention will now be described by referring to drawing.

Figure 1:
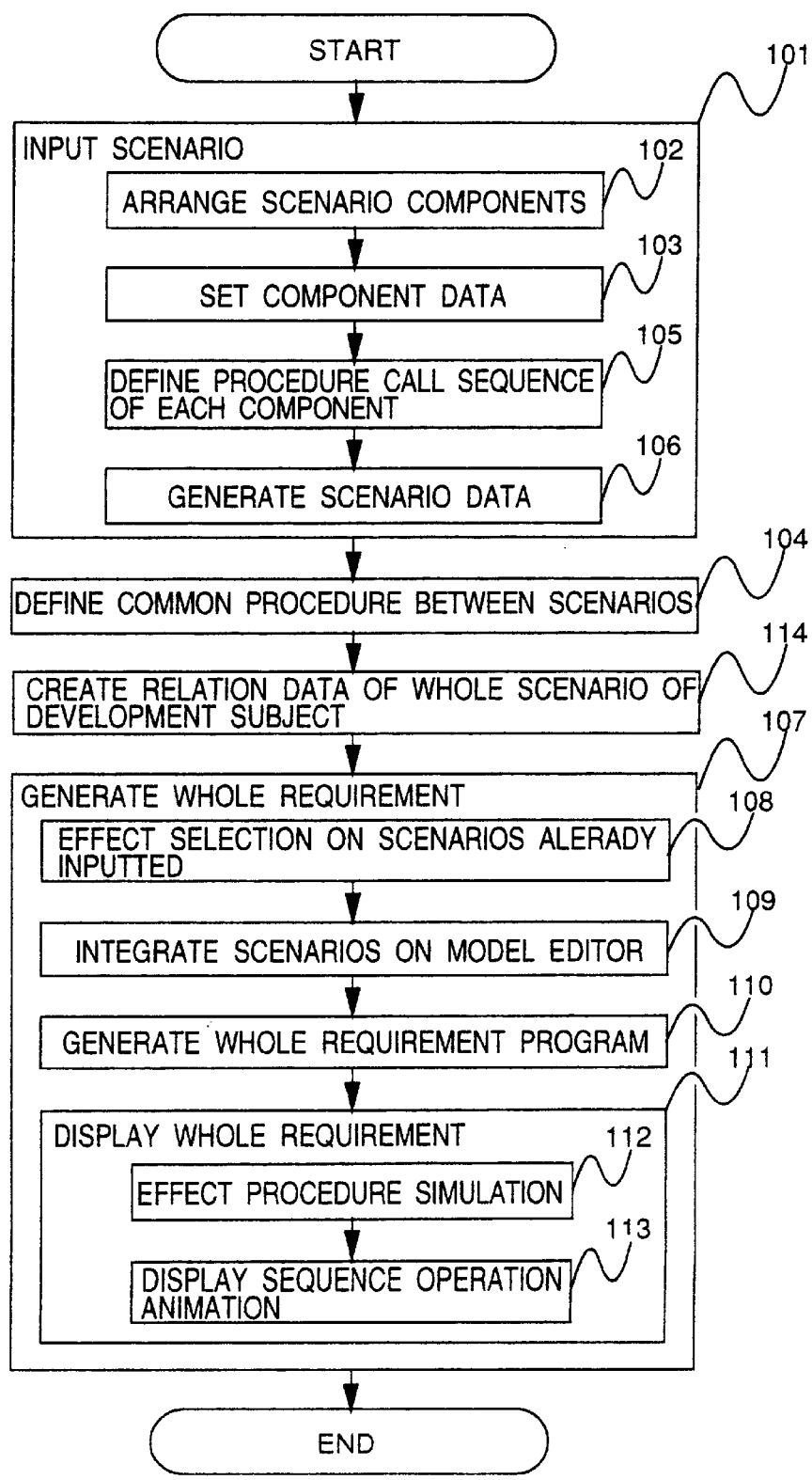
FIG. 1 is a flow chart showing the input and display process of requirement according to an embodiment of the present invention.
Figure 2:
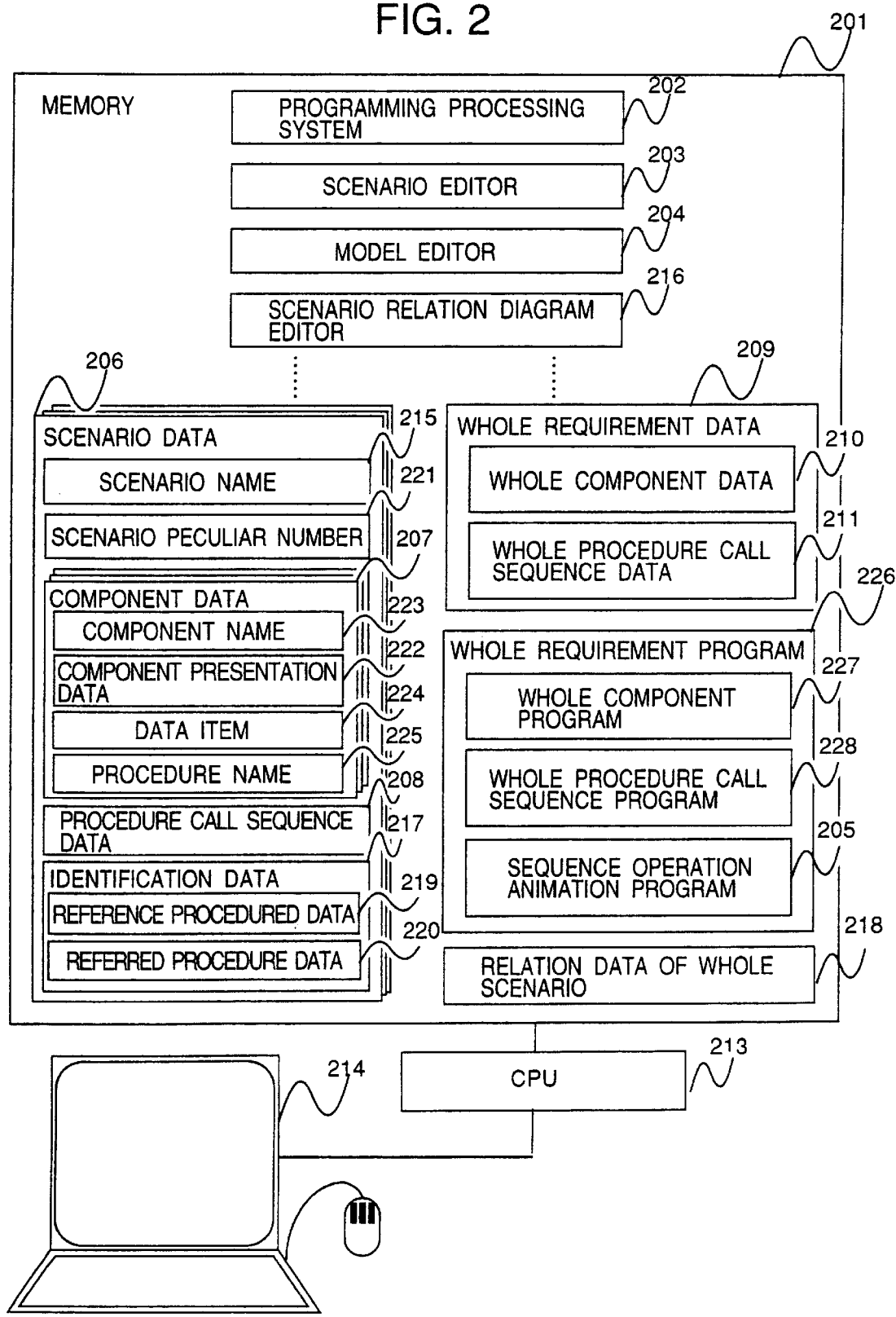
FIG. 2 is a schematic configuration diagram of a system for acquiring and creating the requirement used in the embodiment of FIG. 1.

FIG. 1 is a flow chart showing the process of a requirement input and display method according to an embodiment of the present invention. FIG. 2 shows the schematic configuration of a requirement creation system used in the present embodiment.

First of all, the process of a requirement input and display method according to an embodiment of the present invention will now be described by referring to FIG. 1.

First of all, the customer and the system engineer arrange components forming the development subject on the scenario editor so as to conform to the requirement by taking a scenario as the unit and by using basic component parts (102). Then the customer and the system engineer define component data (103). Defined attribute data includes the name of a component, the name of data held by the component, the name of a procedure, and a display figure. The attribute data is defined by interactive operation. The customer and the system engineer define a procedure call sequence by specifying the procedure of the defined component with a calling order (105). The defined procedure sequence is displayed on the scenario editor. When definition of the scenario is finished, the defined scenario data is generated in the computer as data items of the scenario (106).

Then, it is defined that the procedure call sequence defined by the scenario is common to a procedure call sequence defined by a different scenario (104).

The defined scenarios are selected, and relation data of the whole scenario are created and displayed (114).

Then, in order to create the visualized whole requirement, the defined scenarios are selected (108). The selected scenarios are reflected on the model editor and the scenarios are integrated by taking a component as the unit (109). On the basis of the display figure of the component and the procedure sequence data between components, a connection line is displayed on the model editor. On the connection line between components, a procedure name to be called subsequently is acquired from the defined procedure sequence data and a program for effecting an animation display is generated (110).

By executing the whole requirement created by integrating the scenarios and thereby displaying the procedure sequence of the development subject in the form of animation (113), a visualized requirement is created.

Outline of a requirement creation system used in the present embodiment will now be described.

As shown in FIG. 2, the requirement creation system used in the process (FIG. 1) of the visualized requirement input and display method of the present embodiment includes a memory 201, a CPU 213 and a terminal 214. On the memory 201, a programming language processing system 202, a scenario editor 203, a model editor 204 and a scenario relation diagram editor 216 are mounted beforehand. They operate in accordance with the process of the visualized requirement input and acquiring method. As a result, scenario data 206 which is definition data of each scenario inputted by the operator, . . . , whole requirement data 209, a whole requirement program 226 and relation data 218 of whole scenario are generated. As the scenario data 206, there are held a scenario name 215 of the scenario, a scenario peculiar number 221, each component data 207 forming the scenario, . . . , procedure call sequence data 208, and identification data 217. As the component data 207, there are held component presentation data 222, a component name 223, a data item name 224 and a procedure name 225. Furthermore, as the identification data 217, there are held referred procedure data 220 and reference procedure data 219. As the whole requirement data 209, there are held whole component data 210 and whole procedure call sequence definition 211. As the whole requirement program 226, there are held a whole component program 227, a whole procedure call sequence program 228, and a sequence operation animation program 229.

The programming language processing system 202 is such a language processing system as to satisfy specifications of the CLOS (Common Lisp Object System), and has functions such as class definition, instance generation, generic function control, and slot access. Language specifications of the CLOS are described in, for example, D. G. Boblow, et. al., "Common Lisp Object System Specification", ANSI X3J13 Document 00-002R (1988).

Figure 3:
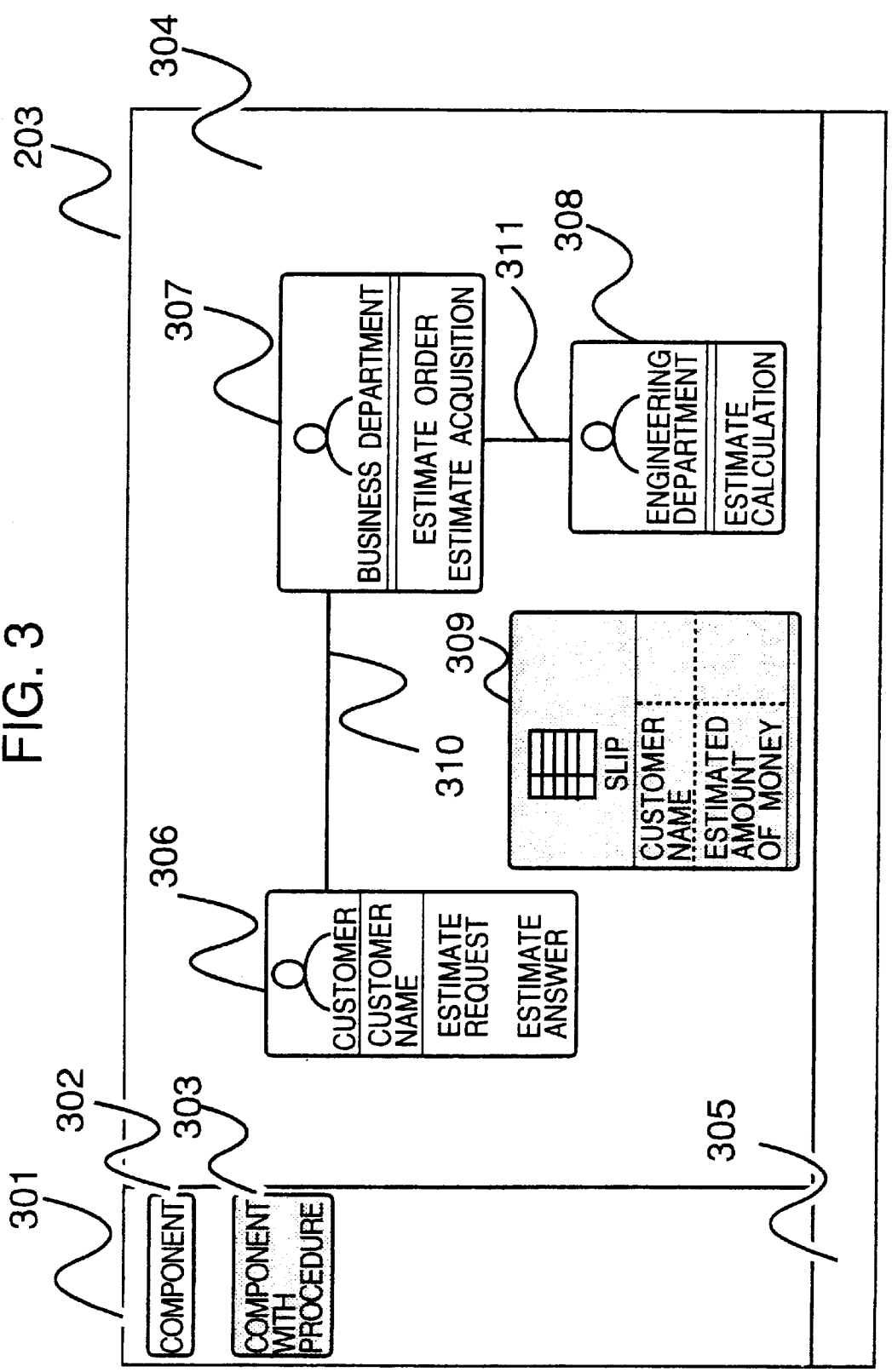
FIG. 3 shows an example of screen display of a scenario inputted on a scenario editor of FIG. 2.
Figure 4:
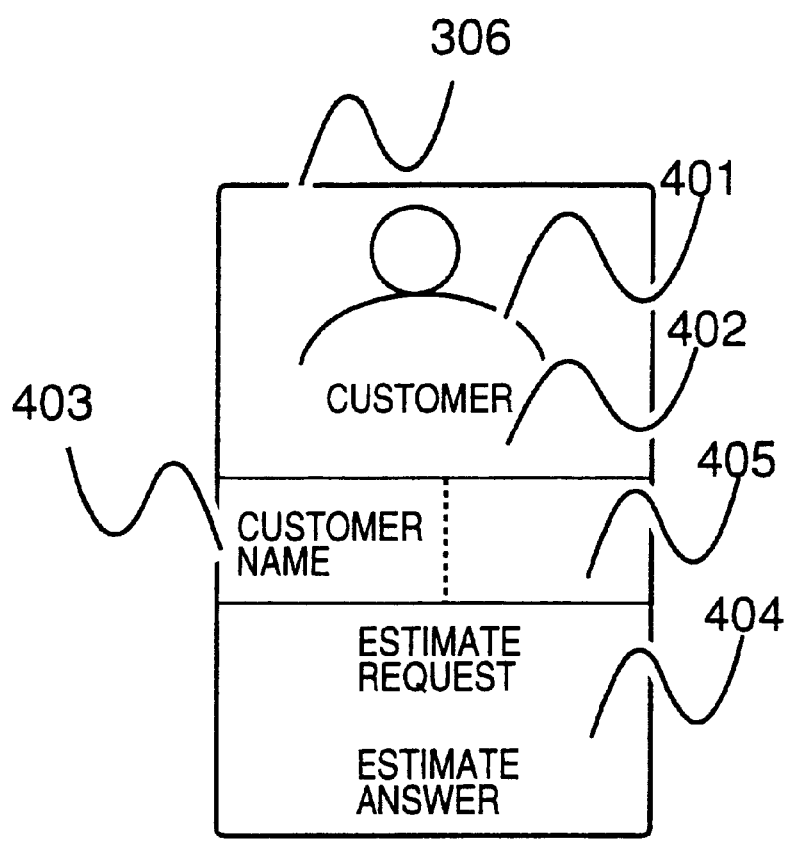
FIG. 4 shows an example of screen display of elements forming the scenario of FIG. 3.

As shown in FIG. 3, the scenario editor 203 includes an area 301 for registering basic parts to create components forming the scenario, a scenario definition area 304, and an input area 305 which is used to display a comment supplied from the system or which is set by the operator. In the present embodiment, a basic part 302 which becomes a static component and a basic part 303 which becomes a component functioning as a component with procedure held by the procedure call sequence are prepared as basic parts registered beforehand to create components forming the scenario, and they are displayed in the area 301 for registering basic parts beforehand. A group of parts drawn on the scenario definition area 304 forms one scenario. Components 306, 307 and 308 are static components which hold the procedure of this scenario and they are created from the basic part 302. A component with procedure 309 is a component which cannot hold the procedure, and it is a component with procedure held by a procedure call sequence which is defined by the scenario. A connection line 310 represents that a procedure call sequence is defined between the components 306 and 307. A connection line 311 represents that a procedure call sequence is defined between the components 307 and 308. The correspondence relation between the area of each component on the scenario definition area 304 and the component data 207 will now be described by using the component 306 as an example. Among the component data 207 possessed by the component, the component figure 222, the component name 223, the data item name 224 and the procedure name 225 are displayed in a component figure display area 401, a component name display area 402, a data item name display area 403 and a procedure name area 404, respectively. Furthermore, in a data item value display area 405, a data item value is displayed.

Figure 5:
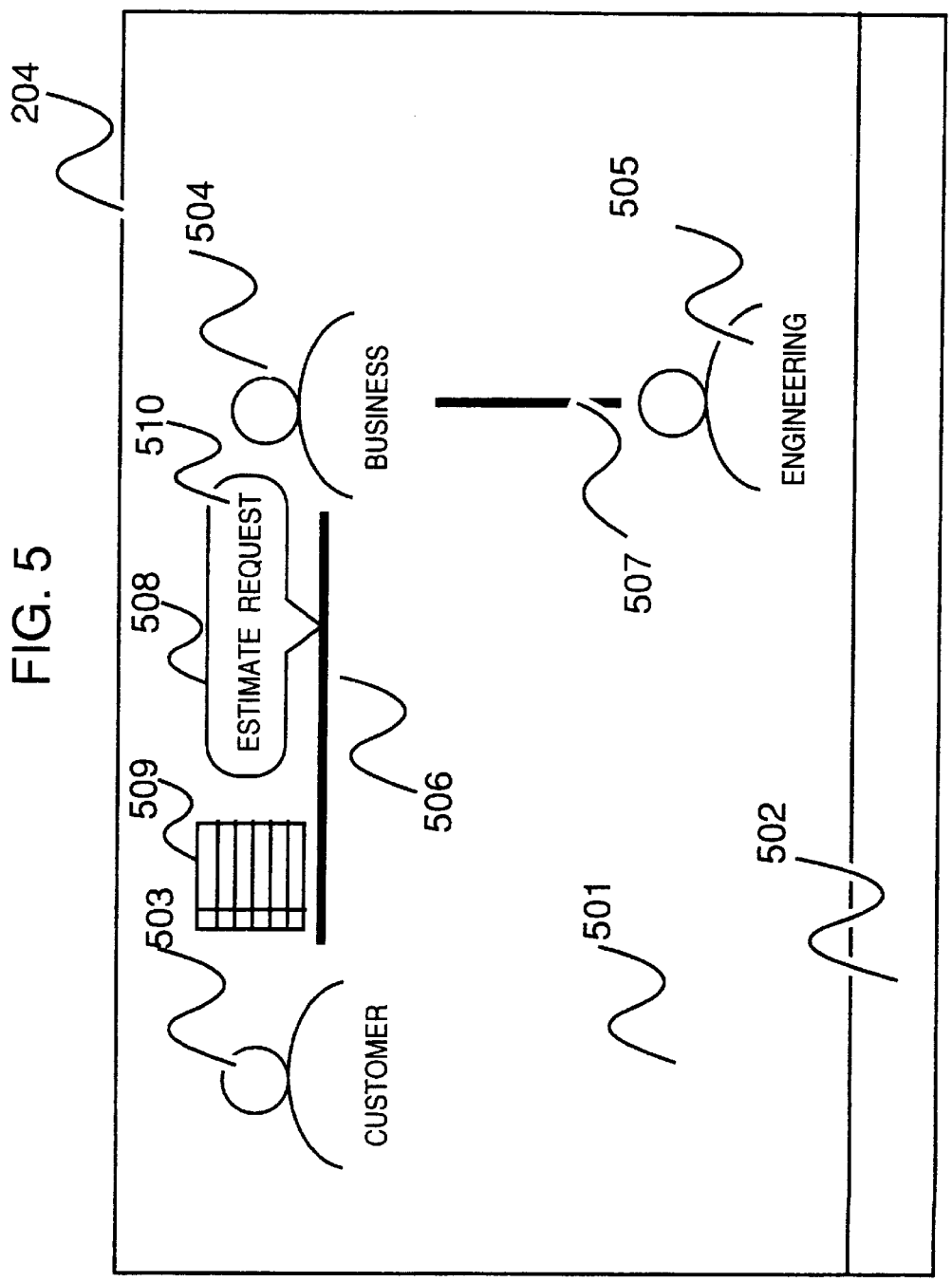
FIG. 5 shows an example of screen display of the requirement created on a model editor of FIG. 2.

As shown in FIG. 5, the model editor 204 includes an area 501 for integrating the inputted scenario and creating and visually displaying the whole requirement and an area 502 for displaying a comment supplied from the system. Parts 503, 504 and 505 drawn on the whole requirement visual display area 501 are components of the visualized whole requirement and display the component figure 222 of the component defined by the scenario. Each of connection lines 506 and 507 represents that a procedure call sequence is defined between components in the whole requirement. A balloon 508 represents a procedure name 510 to be subsequently called, from a component 503 of calling source to a component 504 holding a procedure to be subsequently called. The balloon 508 moves on the connection line 506. A display figure 509 of a component with procedure displays the display figure 509 of the component with procedure held by the procedure to be subsequently called, from the component 503 of calling source to the component 504 holding the procedure to be subsequently called. The display figure 509 moves on the connection line 506.

By taking a sales management system as an example, the procedure of the requirement creation method in the present embodiment will now be described in detail.

First of all, on the scenario editor, one scenario of the sales management system is inputted according to input effected by the operator (step 101). Components forming the scenario are first arranged (step 102), and component data 207 of the component is set (step 103).

Figure 6:
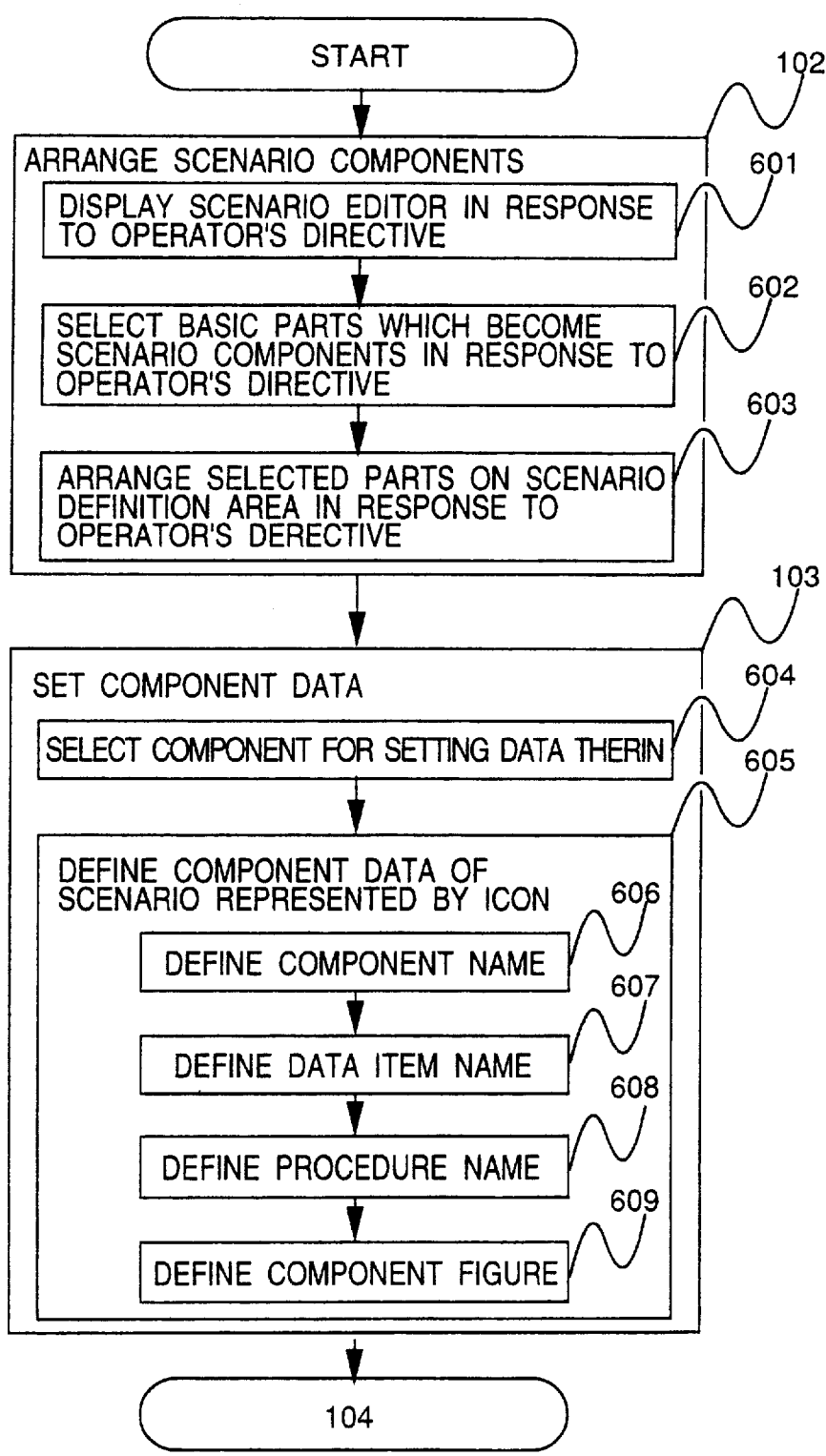
FIG. 6 is a flow chart showing the detailed process for arranging scenario components and setting component data.

FIG. 6 is a detailed flow chart of the process 102 and 103 for arranging the scenario components and setting the component data. FIG. 7 and FIGS. 9 through 12 show screen display examples in the process of FIG. 6. By referring to FIGS. 6 and 7 and FIGS. 9 through 12, the process 102 and 103 for arranging the scenario components and setting the component data will hereafter be described in detail.

Figure 7:
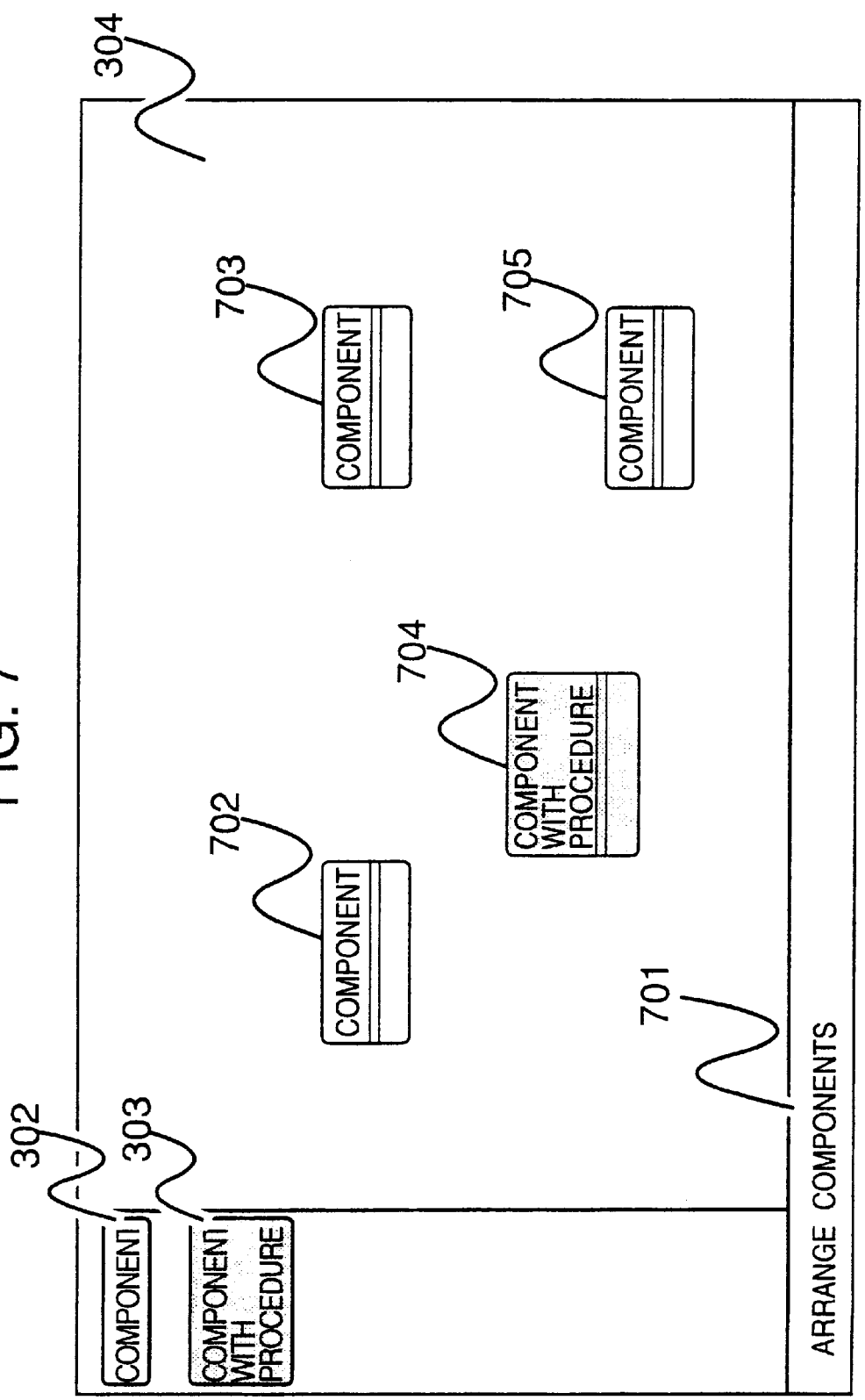
FIG. 7 shows a scenario editor and shows an example of screen display obtained when basic component parts are disposed.

First of all, the scenario editor 203 is displayed by the operator (step 601). According to a displayed system comment 701 of the scenario editor 203, components of the scenario are arranged. The operator selects basic parts 302 and 303 which become components of the scenario of the displayed scenario editor (step 602). Then the operator arrange the selected basic parts on the scenario definition area 304 (step 603). Basic parts 702, 703, 704 and 705 arranged on the scenario definition area 304 of FIG. 7 represent how sources of components forming the scenario are arranged (step 603).

Figure 9:
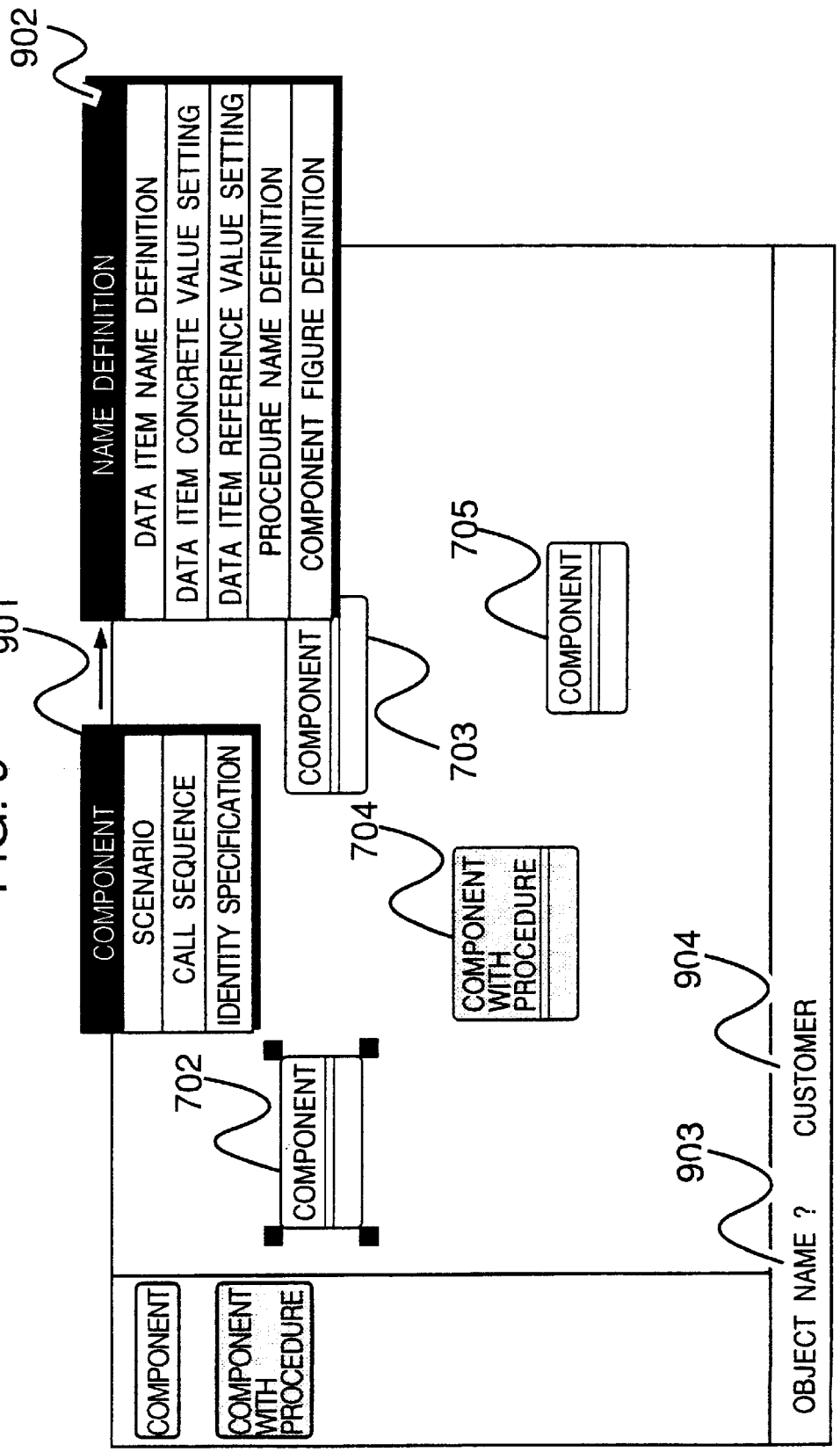
FIG. 9 shows an example of screen display at the time of name setting for a basic component part.

Then, a component of the scenario for setting component data therein is selected (step 604). Then, component data of the selected component is defined (step 605). In order to define the name of the selected component 702 (step 606), a name definition menu 902 included in a component menu 901 is selected out of the menus of the scenario editor 203. FIG. 9 shows the situation obtained when that menu has been selected. According to a displayed system comment 903 of the scenario editor 203, the name of a component of the scenario is inputted. In this case, the component name of the component 702 has been defined as "customer" 904. And the defined component name is displayed in a component 1001.

Figure 10:
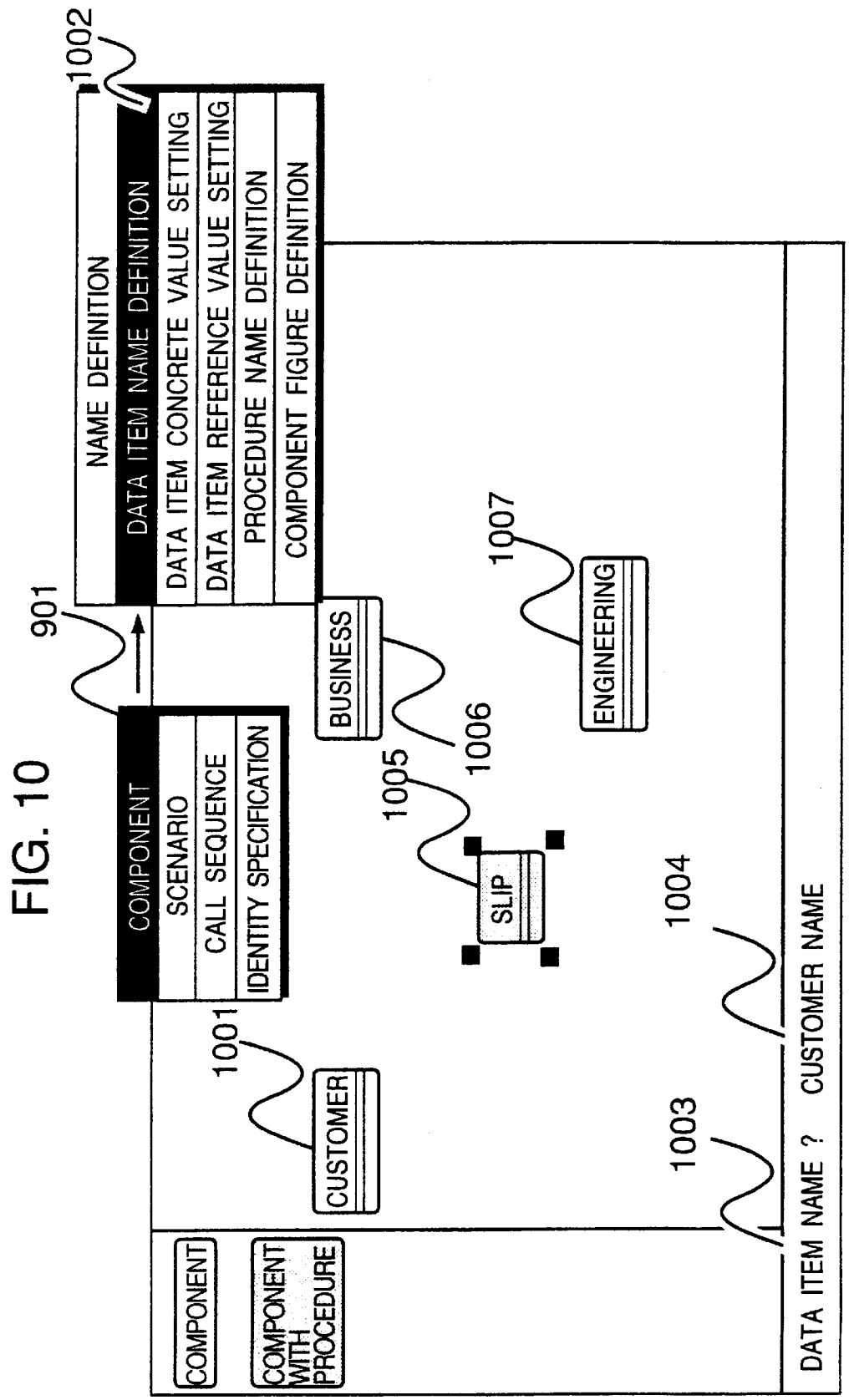
FIG. 10 shows an example of screen display at the time of data item name setting for a component.

Then, in order to define a data item name held by a selected component 1005 (step 607), a data item name definition menu 1002 included in the component menu 901 is selected out of the menus of the scenario editor 203. FIG. 10 shows the situation obtained when that menu has been selected. According to a displayed system comment 1003 of the scenario editor 203, a data item name is inputted. In this case, one of data item names of the component 1005 has been defined as "customer name" 1004. And the "customer name" 1004 defined in a component 1101 is displayed as a data item name 1105 of the component.

Figure 11:
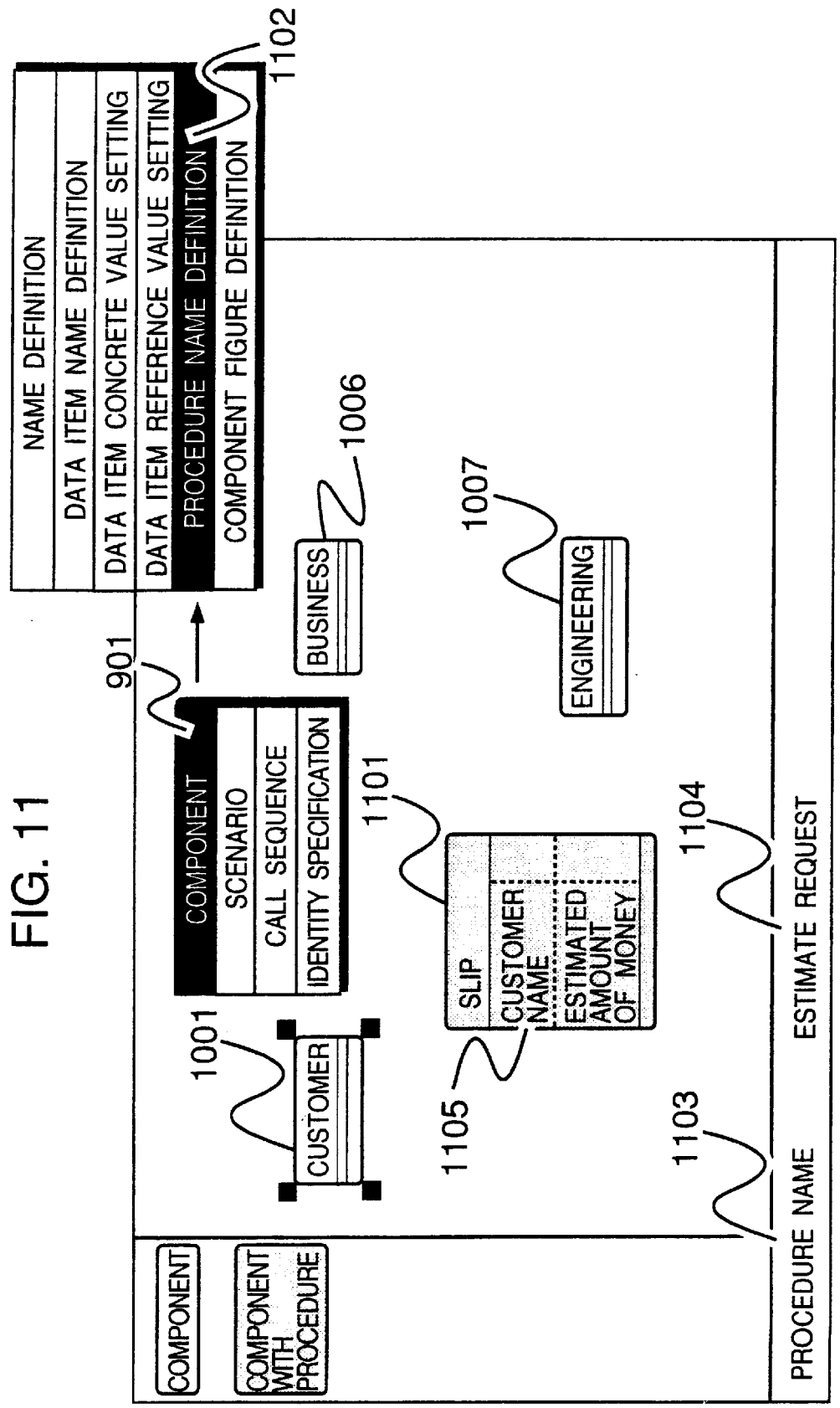
FIG. 11 shows an example of screen display at the time of procedure name setting for a component.

Then, in order to define a procedure name held by the selected component 1001 (step 608), a procedure name definition menu 1102 included in the component menu 901 is selected out of the menus of the scenario editor 203. FIG. 11 shows the situation obtained when that menu has been selected. According to a displayed system comment 1103 of the scenario editor 203, a procedure name is inputted. In this case, one of procedure names of the component 1001 has been defined as "estimate request" 1104. And the "estimate request" 1104 defined in a component 1201 is displayed as a procedure name 1206 of the component.

Figure 12:
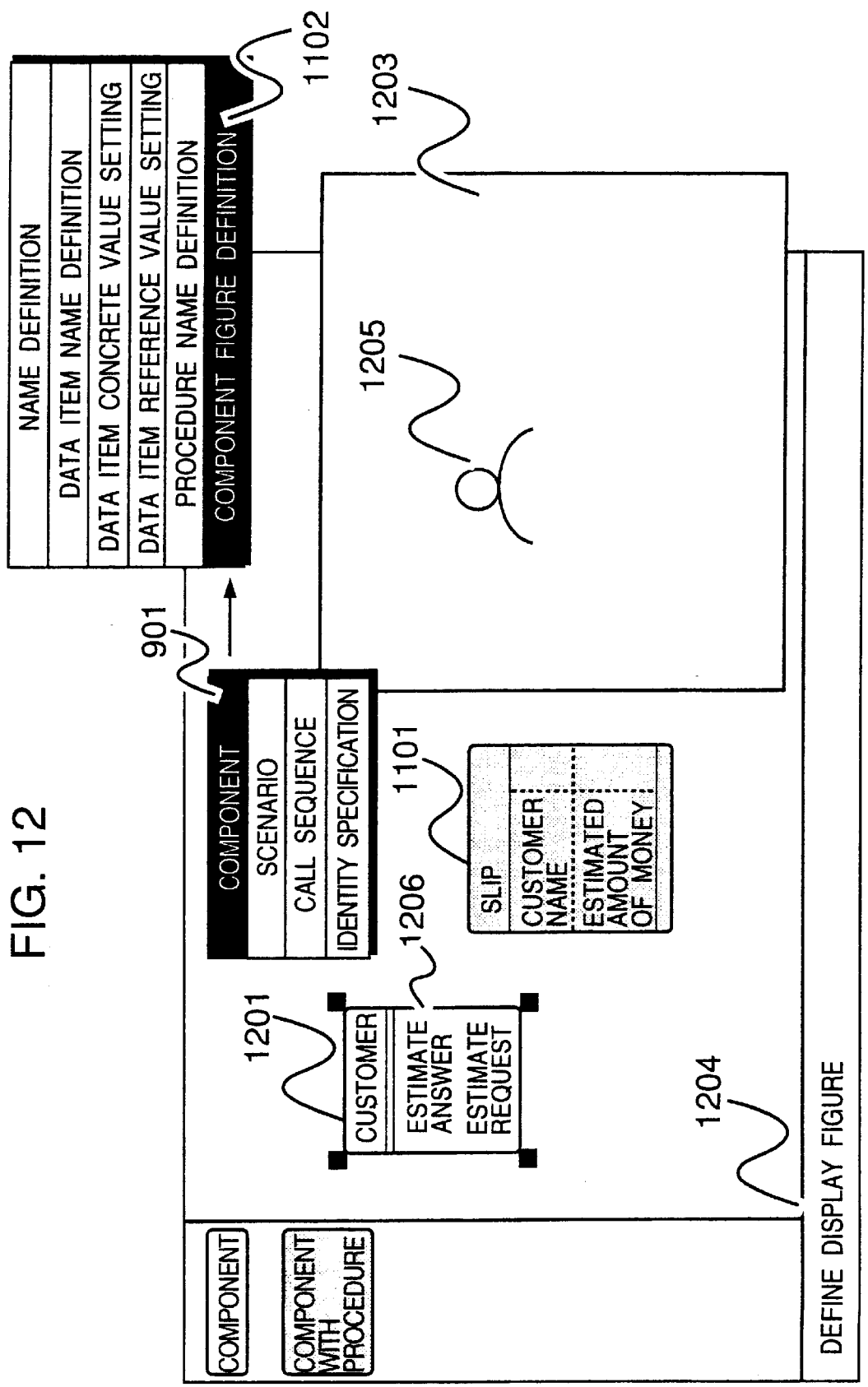
FIG. 12 shows an example of screen display at the time of defining a component figure of a component.

Then, in order to define a component figure of the selected component 1201 (step 609), a component figure definition menu 1202 included in the component menu 901 is selected out of the menus of the scenario editor 203. FIG. 12 shows the situation obtained when that menu has been selected. By selecting that menu, an editor 1203 for figure definition is called and displayed. According to a system comment 1204 displayed on the scenario editor 203, a component figure 1205 of the selected component is defined. And the component figure 1205 defined in a component 1403 is displayed as a component figure 1413 of the component.

As for definition of the data item name held by the component (step 607), definition of the procedure name held by the component (step 608), and definition of the component figure of the component (step 609), definition order is not especially stipulated.

Then, a call sequence of procedures held by the components which have been set is defined (step 105).

Figure 13:
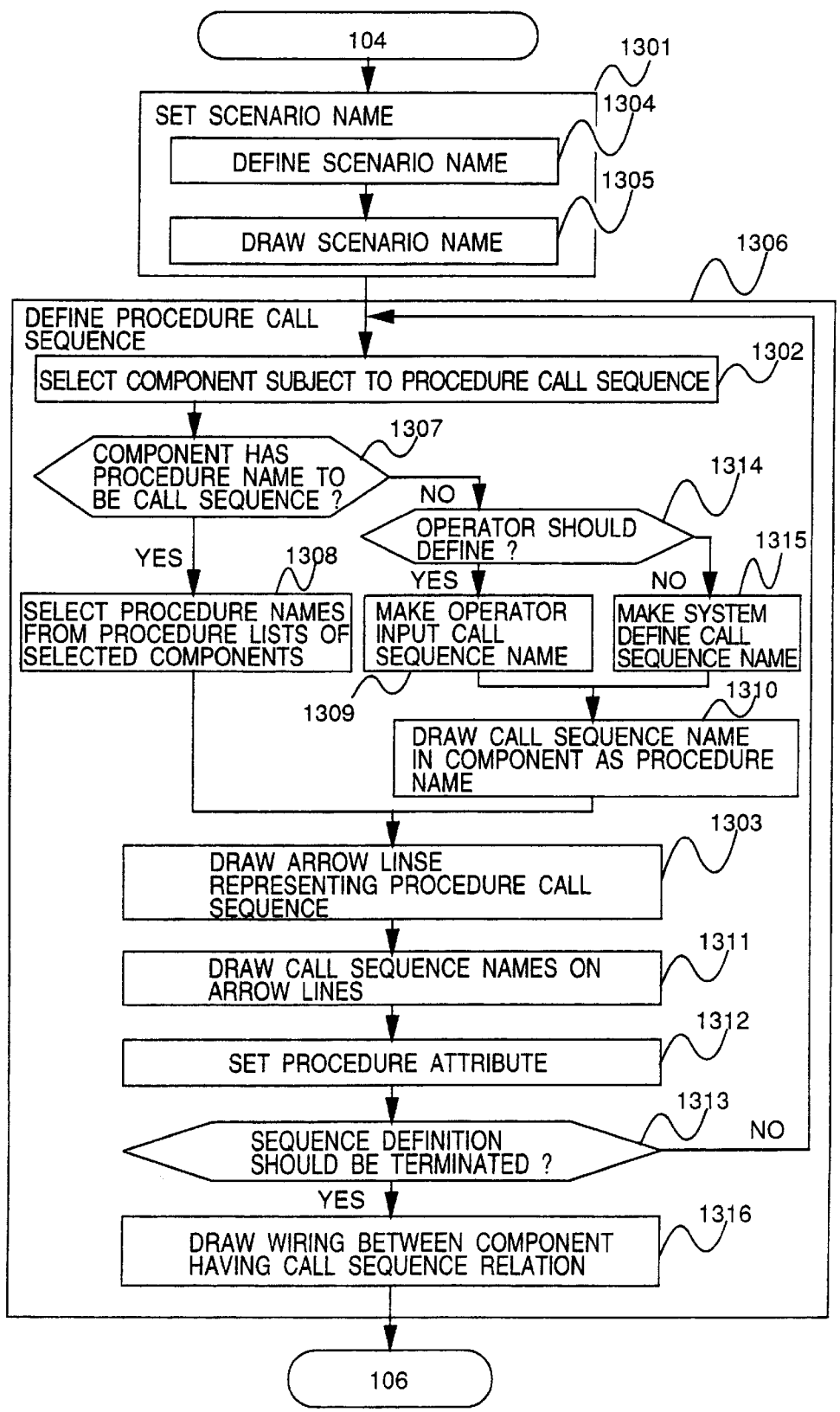
FIG. 13 is a flow chart showing the detailed process for defining the procedure call sequence of each component.
Figure 14:
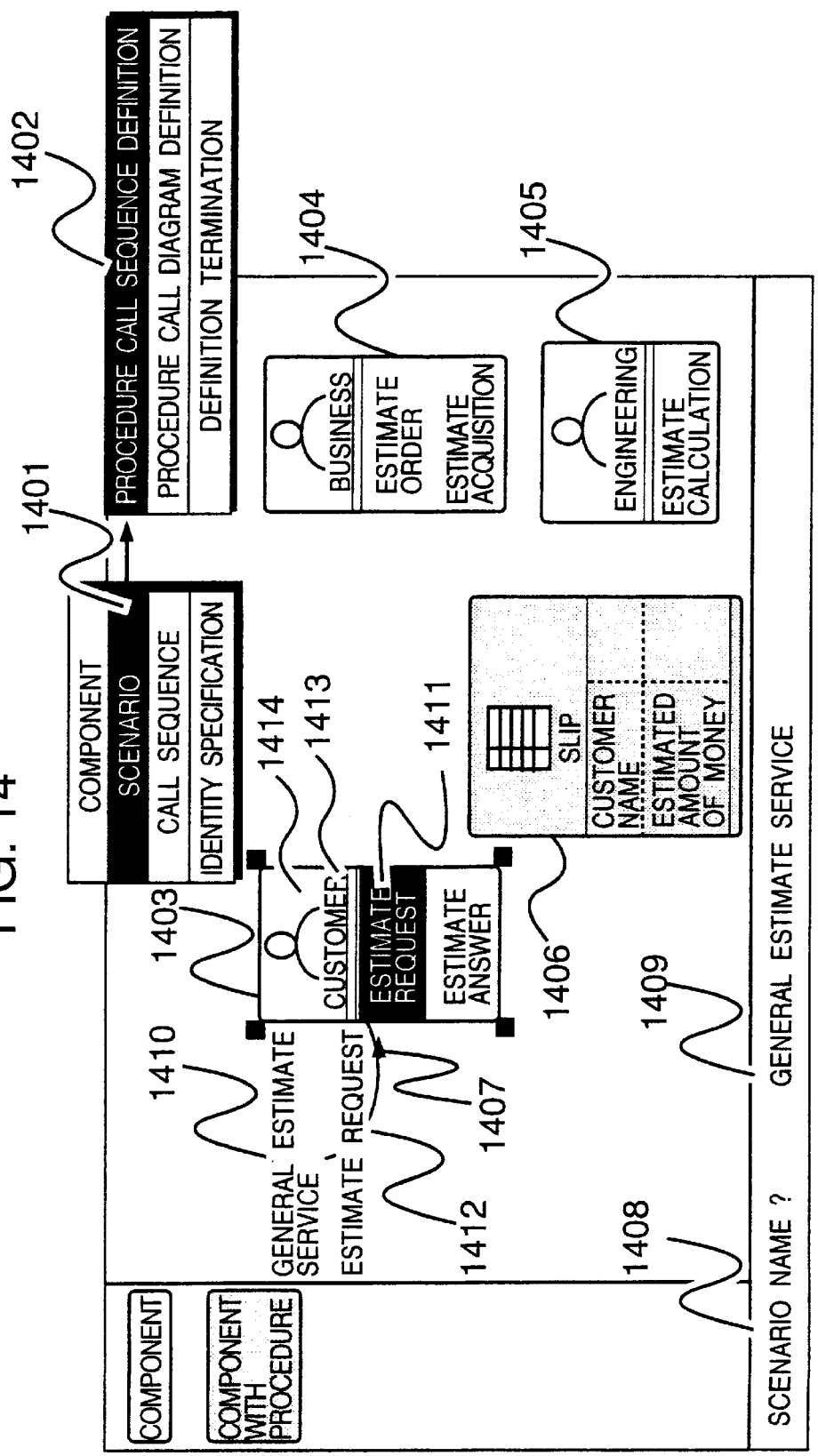
FIG. 14 shows an example of screen display at the time of defining initial call operation of the procedure call sequence shown in FIG. 13.
Figure 15:
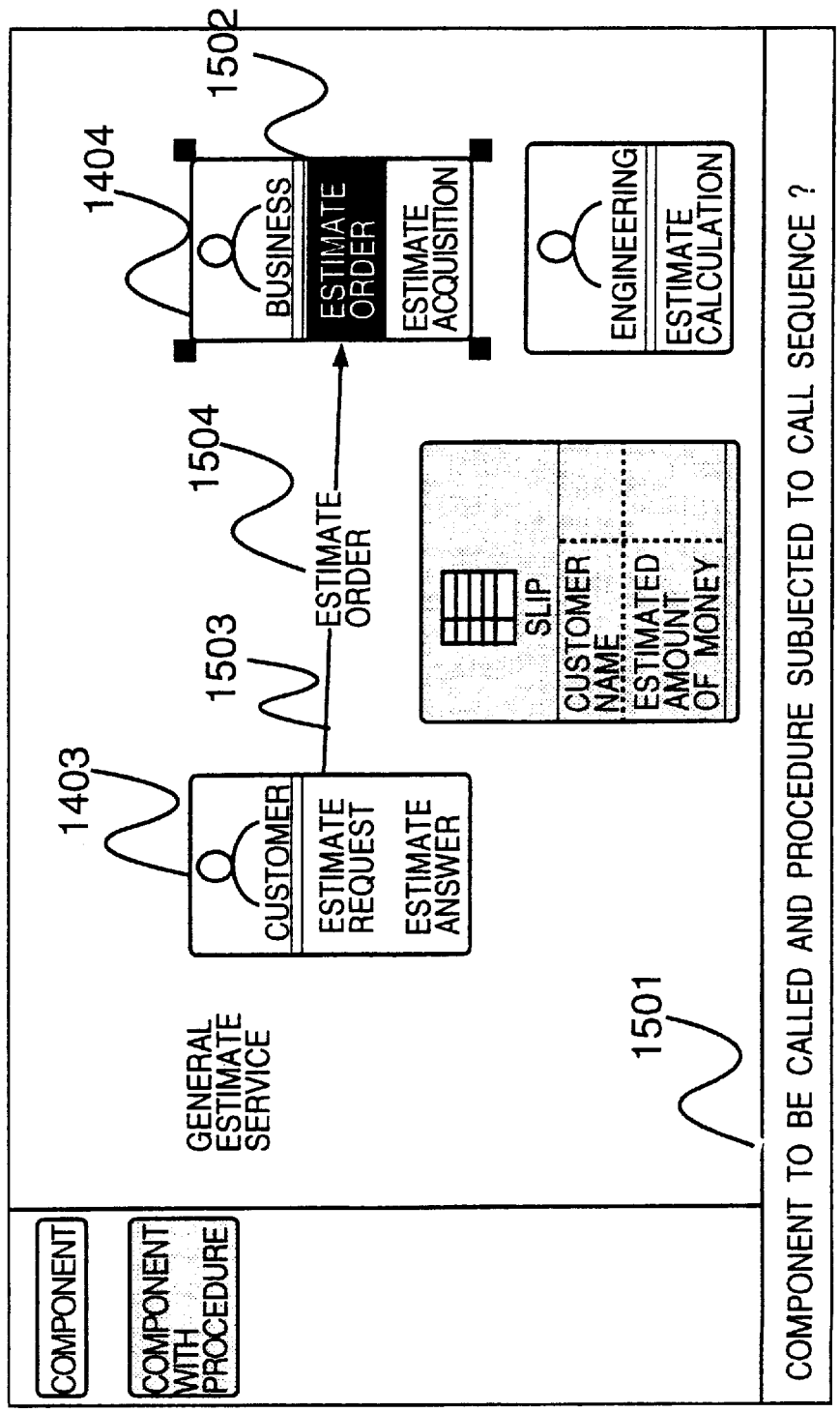
FIG. 15 shows an example of screen display at the time of defining the procedure call sequence.
Figure 16:
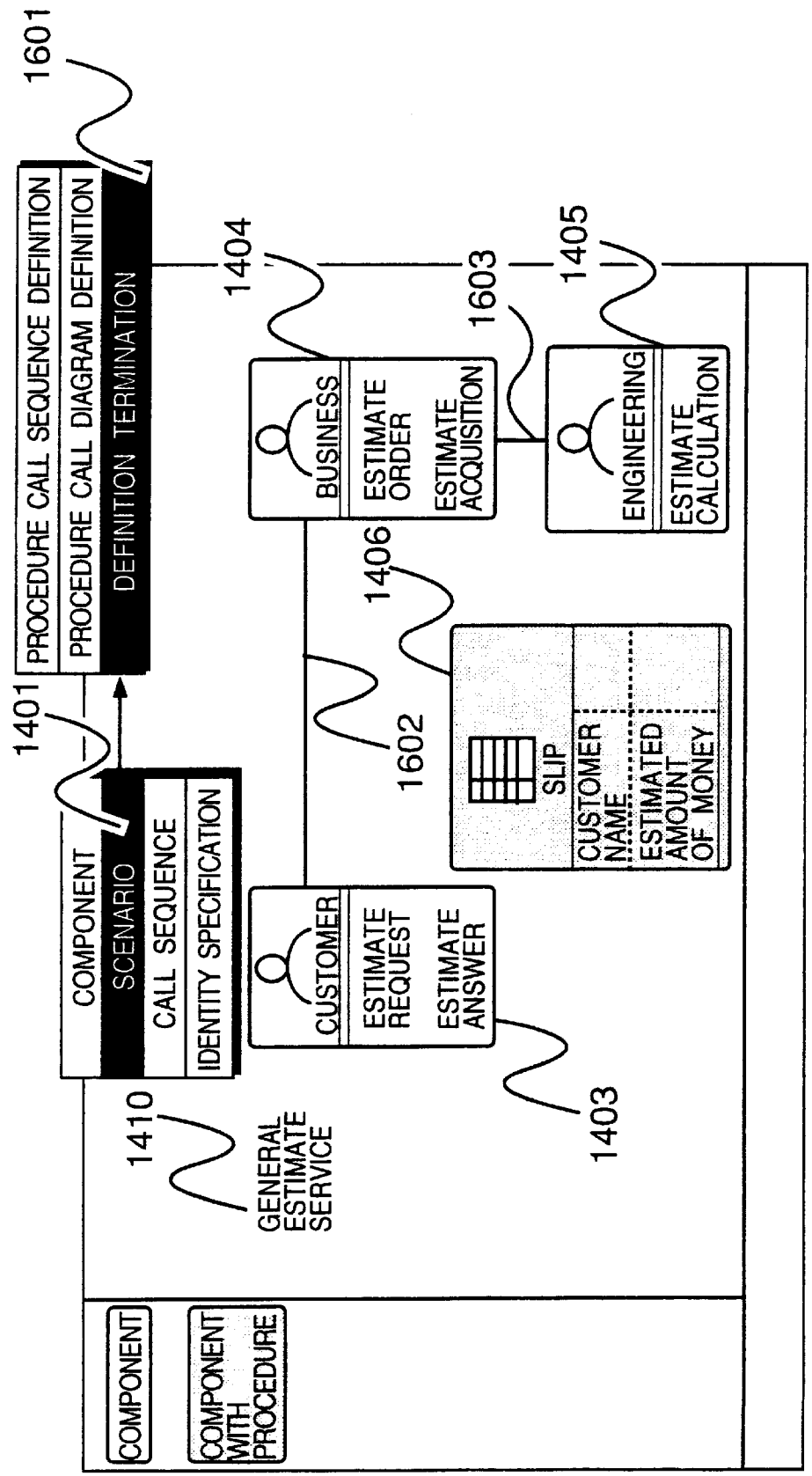
FIG. 16 shows an example of screen display at the time of completion of the procedure call sequence definition.

FIG. 13 is a detailed flow chart of the process 105 for defining the procedure call sequence held by the components. FIGS. 14 through 16 show examples of screen display in the procedure of FIG. 13. By referring to FIGS. 13 through 16, the process 105 for defining the procedure call sequence of the scenario will hereafter be described in detail.

First of all, the operator selects a procedure call sequence definition menu 1402 of a scenario menu 1401 out of displayed menus of the scenario editor 203. FIG. 14 shows the situation obtained when that menu has been selected. On the screen, components 1403, 1404, 1405 and 1406 of the scenario generated by the steps 102 and 103 of FIG. 1 are displayed. Then, in order to define the procedure call sequence, a scenario name is set (step 1301). First of all, in accordance with a displayed system comment 1408 of the scenario editor 203, a scenario name is defined (step 1304). Here, "general estimate service" 1409 is inputted. Then, the inputted scenario name "general estimate service" 1409 is displayed on the scenario definition area 304 included in the scenario editor 203 as represented by 1410 (step 1305).

Then, a call sequence of the procedure held by the component is defined (step 1306). First of all, in accordance with a displayed system comment 1501 of the scenario editor 203, a component holding the procedure to be called is selected (step 1302). In FIG. 14, the component 1403 holding a procedure to be called earlier in the scenario is selected. In FIG. 15, a component 1502 holding a procedure to be called subsequently to a procedure 1411 defined in FIG. 14 is selected. Then, it is decided whether the procedure name to be called is in the component (step 1307). If there is a procedure to be called, procedure names 1411 and 1502 are selected from lists of procedures included in the selected components 1403 and 1502 (step 1308). Then, arrow lines representing the procedure call sequence are drawn on the scenario editor 203 (step 1303). An arrow line 1407 representing the procedure call sequence to be called earlier is drawn between the scenario name 1410 displayed on the scenario definition area 304 and the component 1403 holding the procedure 1411 to be called earlier. An arrow line 1503 representing a procedure call sequence other than that to be called earlier is drawn between the component 1403 holding the procedure 1411 which has been called previously and the component 1404 holding the procedure 1502 to be called. And names of procedures to be called are drawn on the arrow lines 1407 and 1503 representing the sequence between the components, as call sequence names 1412 and 1504 (step 1311). In the case where the above described defined call sequence holds a component with procedure or a call condition of a procedure call sequence, each data is set as a procedure attribute (step 1312).

On the other hand, in the case where a procedure to be called does not exist in the component, a call sequence name is set. First of all, the operator determines whether the operator defines a call sequence name oneself (step 1314). In the case where the operator defines a call sequence name oneself, the operator inputs the name of the call sequence (step 1309). On the other hand, in the case where the operator does not define the call sequence name oneself, the system defines a name other than the procedure names held by the selected components as the name of the call sequence (step 1315). And the defined call sequence name is added to the procedure name 225 of the component data 207 as the called procedure name in the component and drawn as the procedure name of the component drawn on the scenario editor 203 (step 1310). Then, the inputted call sequence name is drawn on an arrow line representing the sequence (step 1311).

When finishing the sequence definition, a definition termination menu 1601 of the scenario menu 1401 is selected out of the menus of the scenario editor 203 (step 1313). When definition of the procedure call sequence has been finished, relations defined by the procedure call sequence among components are represented by connection lines 1602 and 1603 (step 1316).

Then, scenario data items of the scenario inputted at the steps 102, 103 and 105 which should be held within the computer are generated (step 106).

Figure 17:
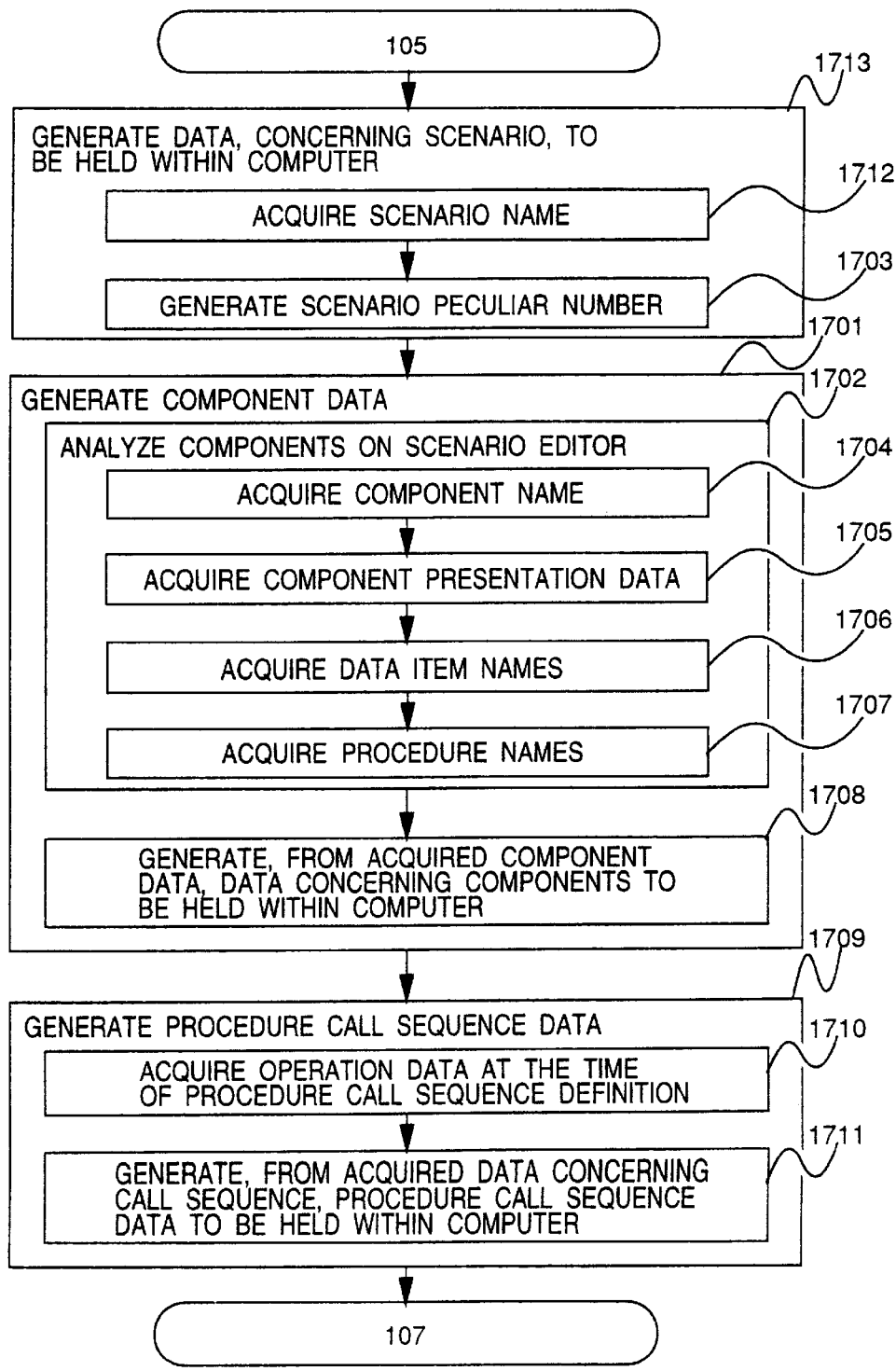
FIG. 17 is a flow chart showing the detailed process of generation of scenario data shown in FIG. 1.
Figure 34A:
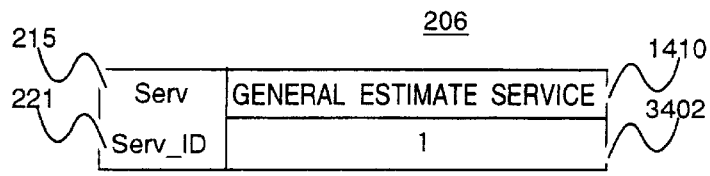

FIG. 17 is a detailed flow chart of the process 106 for generating data items of the scenario to be held within the computer. FIG. 34 shows examples of scenario data items generated by the process of FIG. 17 for the scenario (FIG. 16) inputted by the process of step 101. By referring to FIGS. 16, 17 and 34, the process 106 for generating data items of the scenario to be held within the computer will hereafter be described in detail.

First of all, the scenario name 1410 defined by the operator is acquired from the inputted scenario (step 1712), and a peculiar number 3402 for managing that scenario is generated (step 1703). With respect to the acquired scenario name 1410 and the generated scenario peculiar number 3402, the scenario name 215 and the scenario peculiar number 221 (FIG. 34A) of scenario data to be held within the computer are generated. Here, scenario data 206 holding, in the computer, the acquired "general estimate service" 1410 as the service name 215 and "1" 3402 as the generated scenario peculiar number 221 is generated.

Then, from the inputted scenario, component data of the component are generated as computer data items (step 1701). First of all, components on the scenario editor 203 are analyzed (step 1702). At the step 1702, component names 1413, . . . are acquired from data of the components 1403, 1404, 1405 and 1406 inputted onto the scenario editor (step 1704). As component presentation data, component FIGS. 1414, . . . and display positions are acquired (step 1705). Data item names 1604, . . . are acquired (step 1706).

Figure 34B:
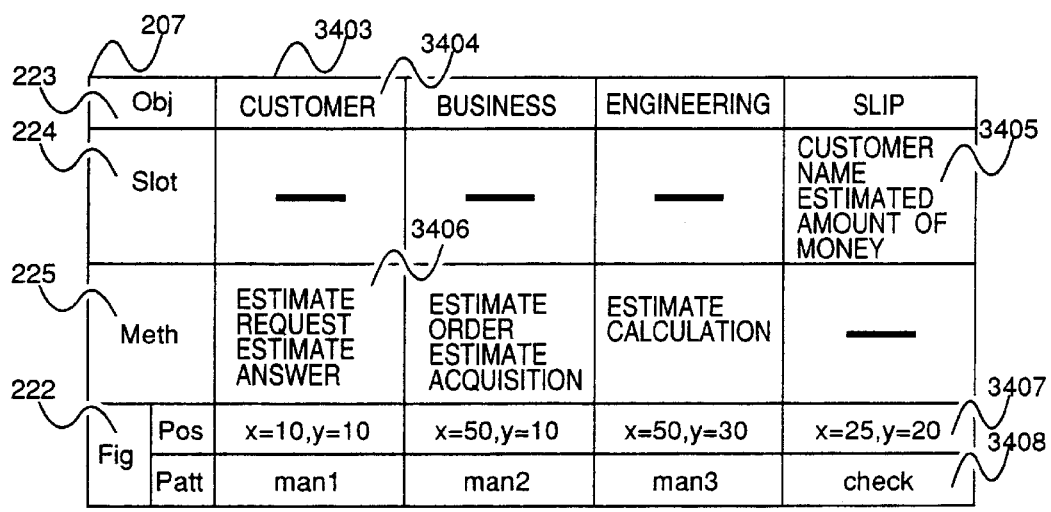
Figure 34C:
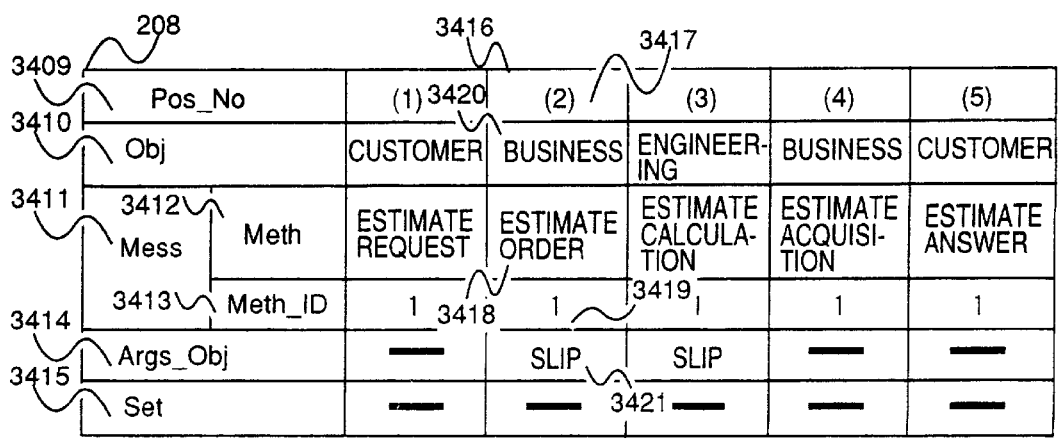

Procedure names 1411, . . . are acquired (step 1707). In association with the acquired component data, scenario data 206 (FIG. 34B) for component data held within the computer is generated (step 1708). For the acquired component name 1413, "customer" 3404 is generated as the component name 223 of scenario data held within the computer. For the acquired component figure 1414 and the display position, 3407 and 3408 of FIG. 34B are generated as the component presentation data 222 of the scenario data held within the computer. For the acquired data item name 403 of the component, the data item name 224 (3405 of FIG. 34B) is generated within the computer. For the acquired procedure name 404 of the component, the procedure name 225 (3406 of FIG. 34B) is generated within the computer.

Then, from the procedure call sequence defined by the scenario editor 203, procedure call sequence data is generated as a computer data item (step 1709). First of all, definition history of the procedure call sequence defined on the scenario editor 203 is acquired from data of interactive operation (step 1710). From the acquired history data of procedure call sequence definition, scenario data (FIG. 34C) concerning the procedure call sequence between components held within the computer is generated (step 1711).

Figure 8:
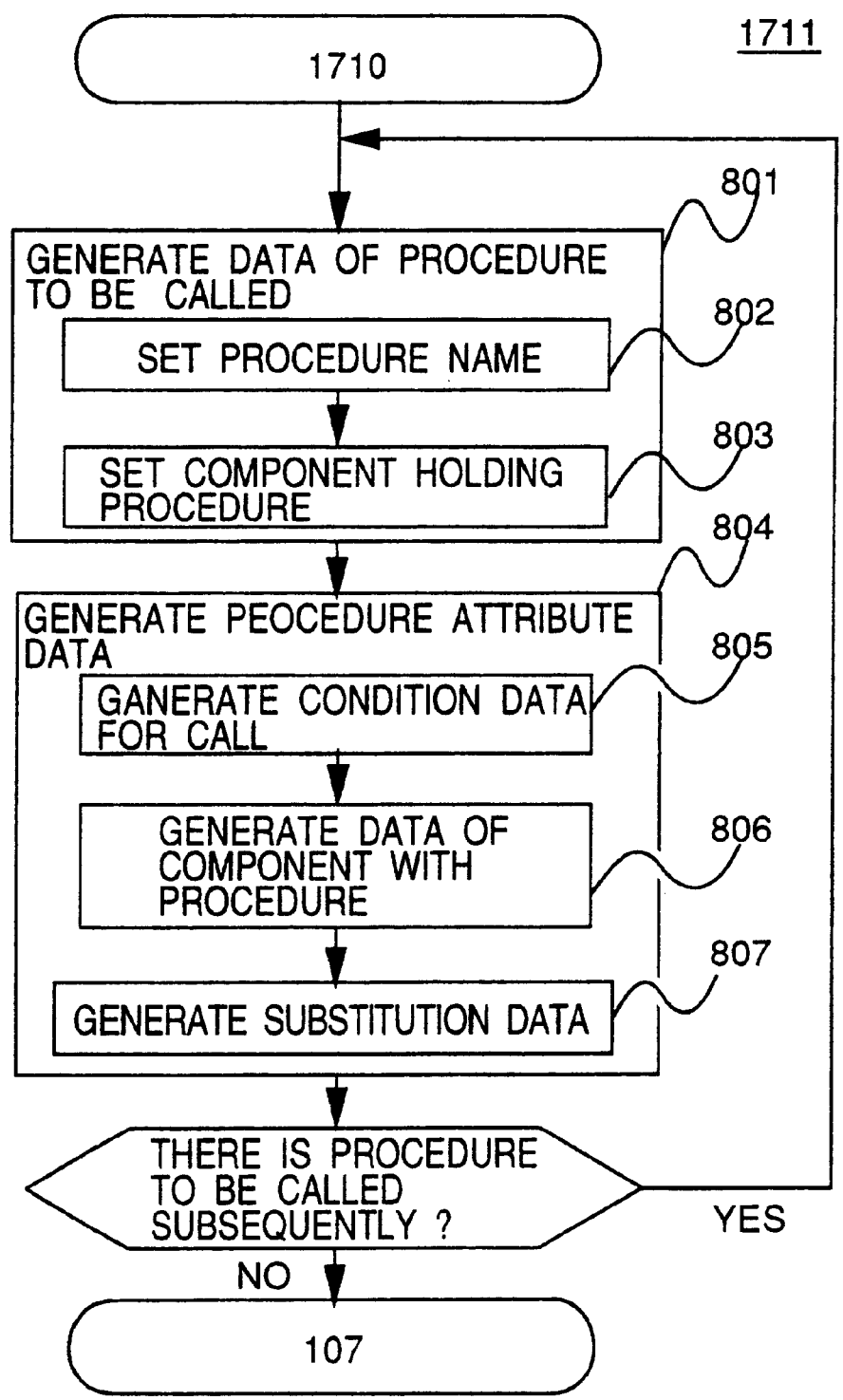
FIG. 8 is a flow chart showing the detailed process of generation of procedure call sequence data.

FIG. 8 is a detailed flow chart of the process 1711 for generating, from the acquired history data of procedure call sequence definition, scenario data concerning a procedure call sequence between components held within the computer. By referring to FIG. 8, the process for generating, from the acquired history data of procedure call sequence definition, scenario data concerning a procedure call sequence between components held within the computer will hereafter be described in detail.

First of all, data of the procedure to be called is generated from the history data of the procedure (step 801). First of all, on the basis of the acquired interactive operation data, a procedure name to be called is set as procedure data to be called (step 802). A component holding the procedure is set as procedure data to be called (step 803).

Data set as the procedure attribute of the procedure call sequence are arranged for every data kind and generated as procedure attribute data (step 804). First of all, as for the call condition for the procedure to effect call, condition data for call is generated from the set history data of the procedure attribute (step 805). Data of component with procedure to be held by the procedure call sequence is now generated (step 806). And substitution data to be held by the procedure call sequence is generated (step 807).

It is determined whether there is a procedure to be called subsequently. If there is a procedure to be called subsequently, the above described process is repeated. If there are no procedures to be called subsequently, generation of the procedure call sequence data is terminated.

The procedure attribute setting (step 1312) of the procedure call sequence definition (FIG. 13) will now be described by referring to an embodiment.

Figure 18:
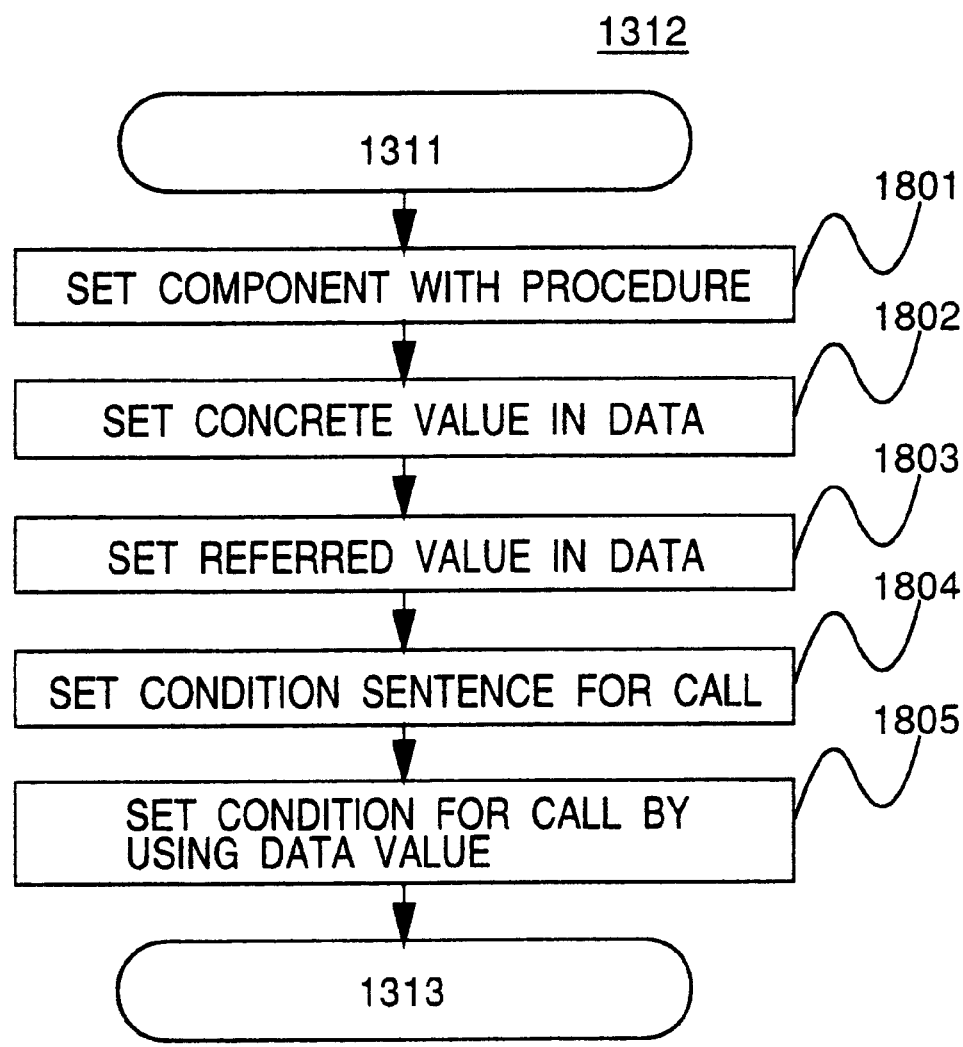
FIG. 18 is a flow chart showing the process for setting a procedure attribute in the procedure call sequence, and it is a flow chart showing the process for making a component with procedure held.

FIG. 18 is a detailed flow chart of the procedure 1312 for setting the procedure attribute to be held by the procedure call sequence. The process for setting the procedure attribute to be held by the procedure call sequence will hereafter be described by referring to FIG. 18.

As the procedure attribute to be held by the procedure call sequence, the operator can set a component with procedure (step 1801). Furthermore, as the procedure attribute, the operator can set a concrete value in a data item held by a component (step 1802) or a data item value of another component in the data (step 1803). As the procedure attribute, the operator can set a condition sentence representing the condition for the procedure to effect call (step 1804) or set a condition using a data item value held by the component (step 1805). There are no restrictions on the order in which the operator sets the component with attribute, concrete data item value, referred data item value, condition sentence for call, and condition data item value for call, which are the procedure attributes.

Setting of the procedure attributes held by the procedure call sequence will now be described.

Figure 19:
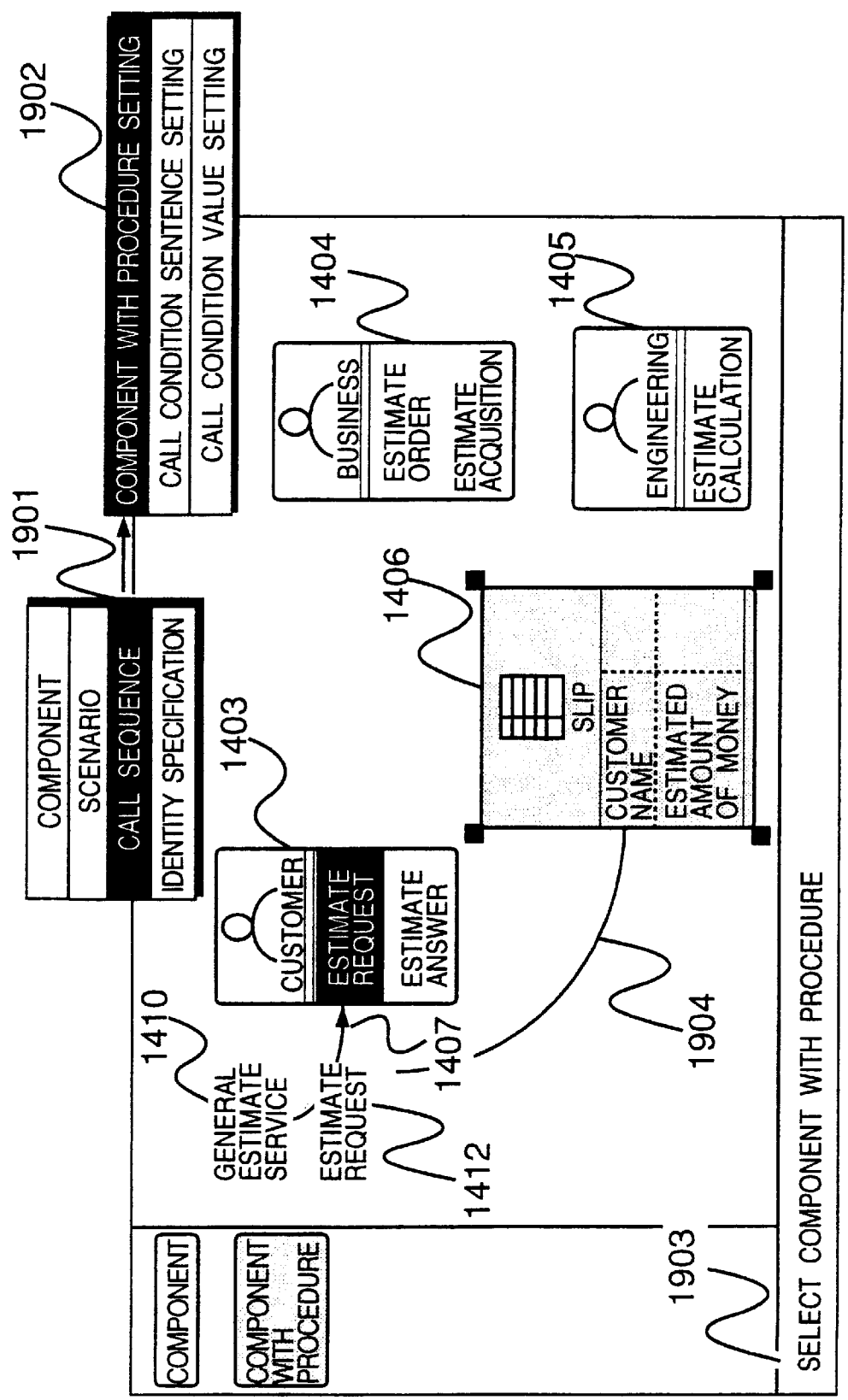
FIG. 19 shows an example of screen display of initial setting of the component with procedure which is set as a procedure attribute of the procedure call sequence of FIG. 18.
Figure 21:
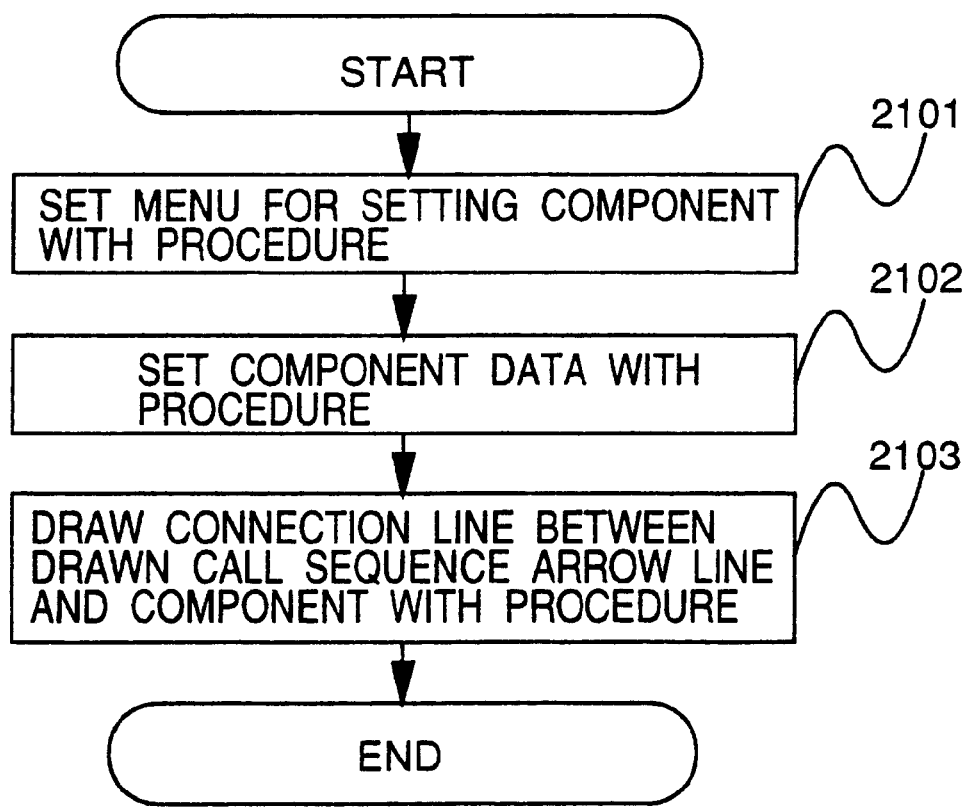
FIG. 21 is a flow chart showing the process for making a procedure attribute of the procedure call sequence of FIG. 18 hold a component as a component with procedure.

First of all, FIG. 21 is a detailed flow chart of the process 1801 for setting a component with procedure as a procedure attribute to be held by the procedure call sequence. FIG. 19 shows a screen display example of the process in FIG. 21. By referring to FIGS. 21 and 19, the process 1801 for setting a component with procedure as a procedure attribute held by the procedure call sequence will hereafter be described in detail.

Out of displayed menus of the scenario editor 203, the operator first selects the procedure call sequence definition menu 1402 of the scenario menu 1401. The operator calls the definition function of the procedure call sequence and draws the call sequence 1407 of the procedure which is desired to hold a component with procedure as a procedure attribute. Then the operator sets a component with procedure in a procedure attribute of the drawn call sequence (step 1801). Out of the menus of the scenario editor 203, a menu 1902 for setting a component with procedure included in a message menu 1901 is first selected (step 2101). FIG. 19 represents how the menu has been selected. On the screen, the components 1403, 1404, 1405 and 1406 of the scenario generated by the steps 102 and 103 of FIG. 1, and initial operation data 1407, 1410 and 1412 of the procedure call sequence generated by the step 1301 are displayed. In accordance with a displayed system comment 1903 of the scenario editor 203, the component with procedure 1406 is selected (step 2102). And a connection line 1904 is drawn from the selected component with procedure 1406 to the call sequence name 1412 located on the drawn arrow line 1407 (step 2103).

Figure 20:
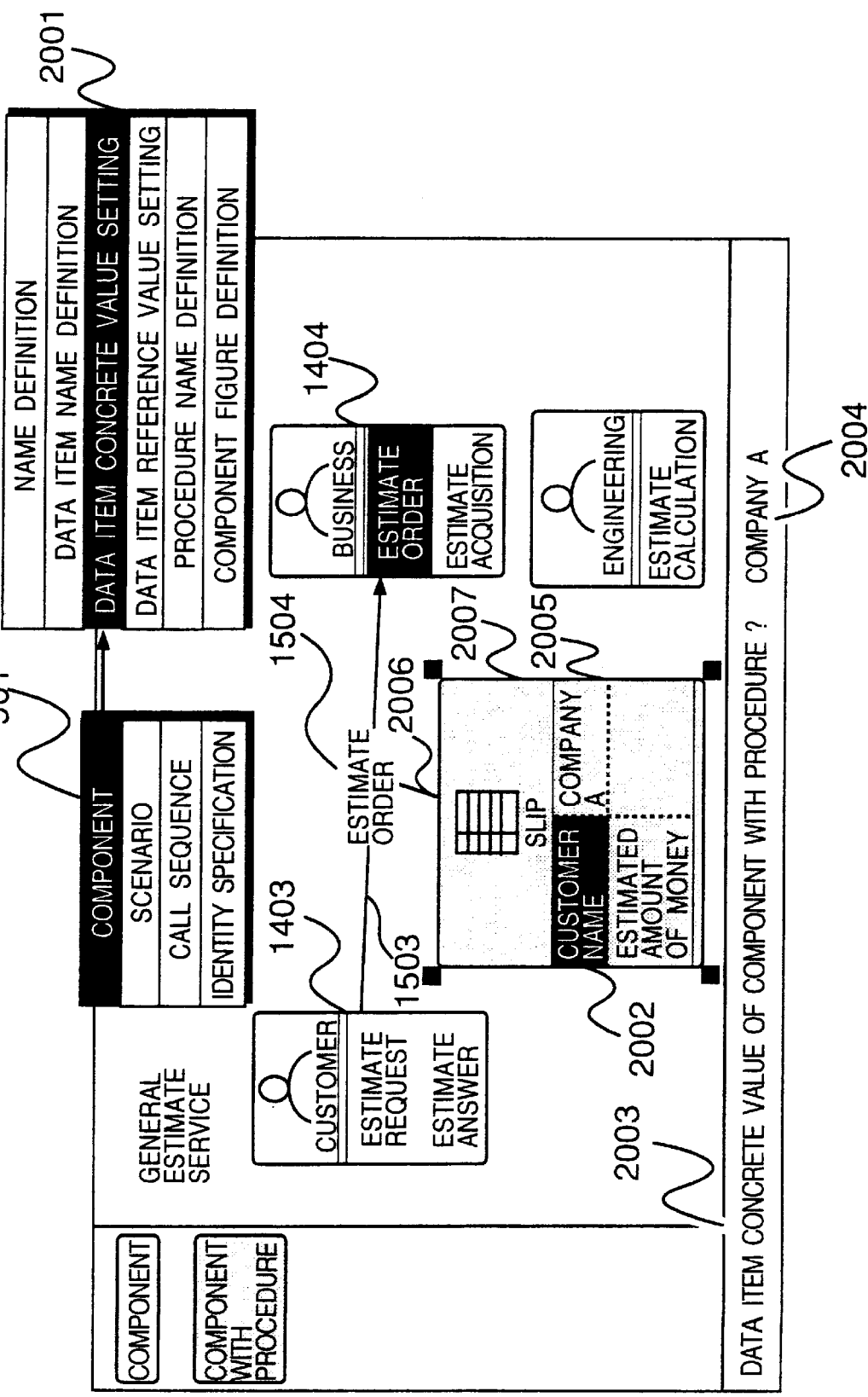
FIG. 20 shows an example of screen display of setting of a data item value which is set as a procedure attribute of the procedure call sequence of FIG. 18.

FIG. 47 is a detailed flow chart of the process 1802 for setting a concrete value in a data item of a component as a procedure attribute held by the procedure call sequence. Furthermore, FIG. 20 shows a screen display example of the process shown in FIG. 47. By referring to FIGS. 47 and 20, the process for setting a concrete value in a data item of a component as a procedure attribute held by the procedure call sequence will hereafter be described in detail.

Out of displayed menus of the scenario editor 203, the operator first selects the procedure call sequence definition menu 1402 of the scenario menu 1401. The operator calls the definition function of the procedure call sequence and draws the call sequence 1503 of the procedure which is desired to have a concrete value set in a data item of a component as a procedure attribute. Then the operator sets a concrete value in a data item of a component (step 1802). First of all, a component which is desired to have a concrete value set in a data item is selected (step 4701). Out of the menus of the scenario editor 203, a concrete data item value setting menu 2001 of the component menu 901 is selected (step 4702). FIG. 20 represents how the menu has been selected. A data item name 2002 which is desired to have a concrete value set in the data item is selected (step 4703). In accordance with a displayed system comment 2003 of the scenario editor 203, a concrete value is inputted to the data item (step 4704). In this case, "company A" 2004 is inputted. In association with the data item name 2002 included in the selected component, a concrete value 2005 of the inputted data item is drawn (step 4705). And it is determined whether the component is already set as a component with procedure of the drawn procedure call sequence (step 4706). In the case where the component is not a component with procedure of the drawn procedure call sequence, a connection line 2006 is drawn between the call sequence name 1504 located on the drawn arrow line 1503 and the selected component 1406 (step 4707).

Figure 45:
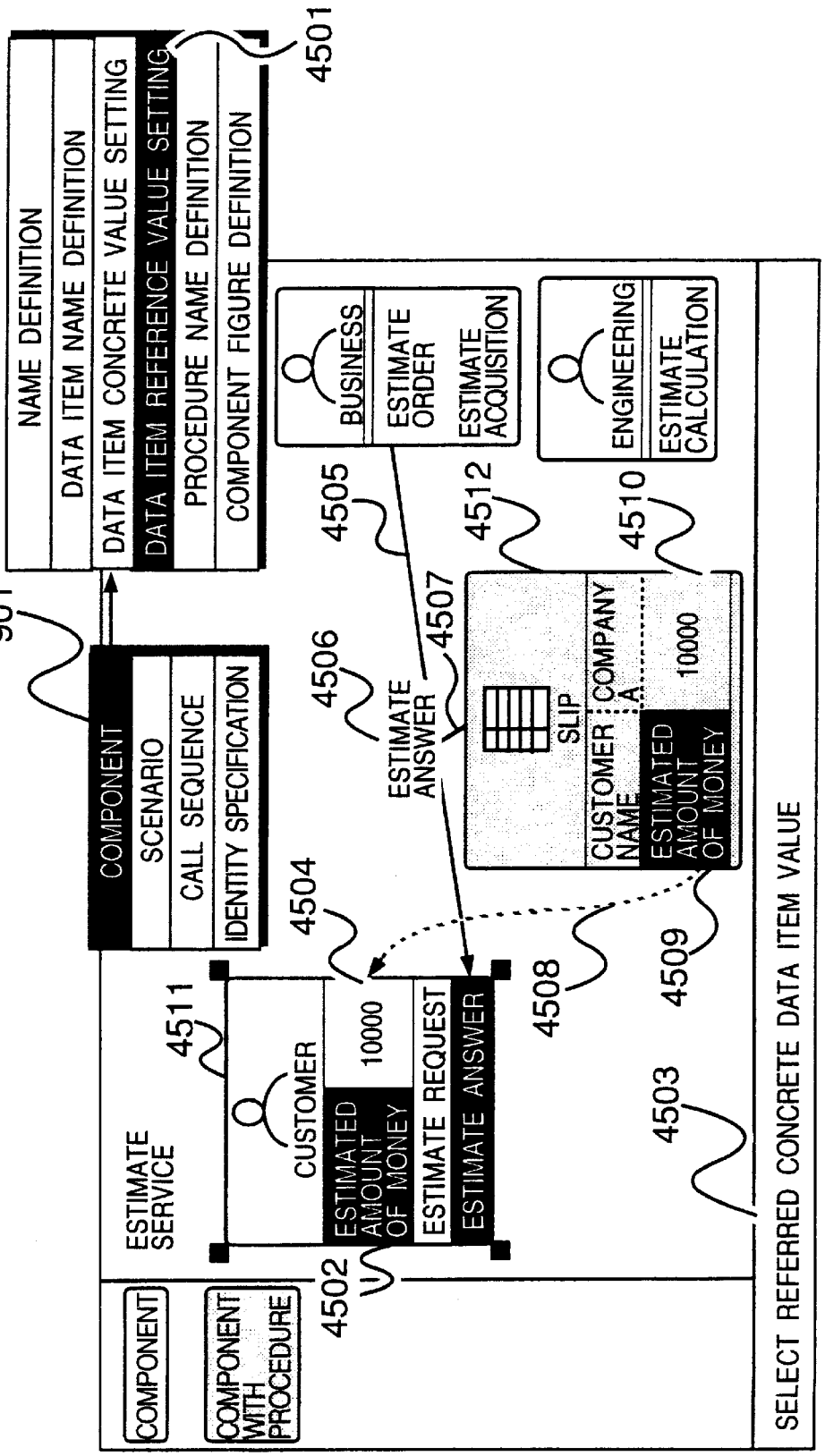
FIG. 45 shows an example of screen display at the time of setting, in a data item, a value held by a different data item, as a procedure attribute of the procedure call sequence.
Figure 48:
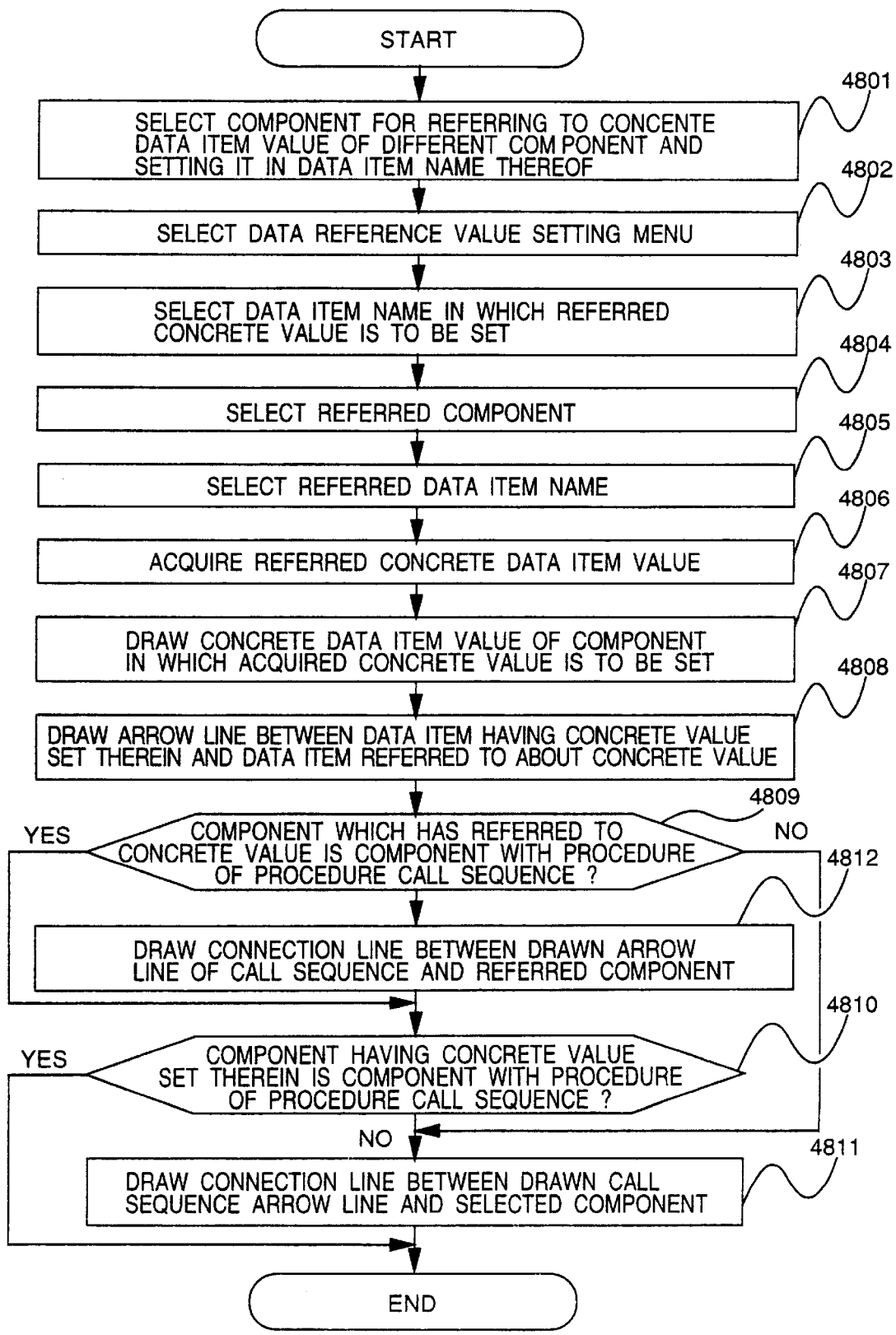
FIG. 48 is a flow chart showing the process for setting, in a data item, a value held by a different data item, as a procedure attribute of the procedure call sequence.

FIG. 48 is a detailed flow chart of the process 1803 for setting, in a concrete value of a data item of a certain component, a concrete value of a data item of a different component as a procedure attribute held by the procedure call sequence. Furthermore, FIG. 45 shows a screen display example of the process shown in FIG. 48. By referring to FIGS. 48 and 45, the process 1803 for setting, in a concrete value of a data item of a certain component, a concrete value of a data item of a different component as a procedure attribute held by the procedure call sequence will hereafter be described in detail.

Out of displayed menus of the scenario editor 203, the operator first selects the procedure call sequence definition menu 1402 of the scenario menu 1401. The operator calls the definition function of the procedure call sequence and draws the call sequence 1407 of the procedure which is desired to set, in a concrete value of a data item of a certain component, a concrete value of a data item of a different component as a procedure attribute held by the procedure call sequence. Then, in a concrete value of a data item of a certain component, a concrete value of a data item of a different component is set (step 1803). First of all, a component which is desired to have a concrete value set in a data item is selected (step 4801). Out of the menus of the scenario editor 203, a concrete data item value reference menu 4501 of the component menu 901 is selected (step 4802). FIG. 45 represents how the menu has been selected. A data item name 4502 which is desired to have a concrete value set in the data item is selected (step 4803). In accordance with a displayed system comment of the scenario editor 203, a component 4512 to be referred to is first selected (step 4804). Then, in accordance with a displayed system comment 4503 of the scenario editor 203, a data item 4509 of the referred component is selected (step 4805). In this case, there is selected an estimated amount of money 4509 which is a data item of a slip 4512 which in turn is a component with procedure. And a concrete value 4510 held by a referred data item is acquired (step 4806). In association with the data item name 4502 included in the component which is desired to have a concrete value set in the data item, a concrete value 4504 of the selected referred data item is drawn (step 4807). Furthermore, an arrow line 4508 is drawn between the data item 4502 which is desired to have the concrete value set therein and the referred data item 4509 (step 4808). And it is determined whether the component which is desired to have the concrete value set therein and the component referring the concrete value are already set as components with procedure of the drawn procedure call sequence (steps 4809 and 4810). In the case where the component is not a component with procedure of the drawn procedure call sequence, a connection line 4507 is drawn between the call sequence name 4506 located on the drawn arrow line 4505 and the component which is desired to have the concrete value set in the data item, and between the call sequence name 4506 located on the drawn arrow line 4505 and the component 4512 referring the concrete value of the data item (steps 4811 and 4812).

Figure 22:
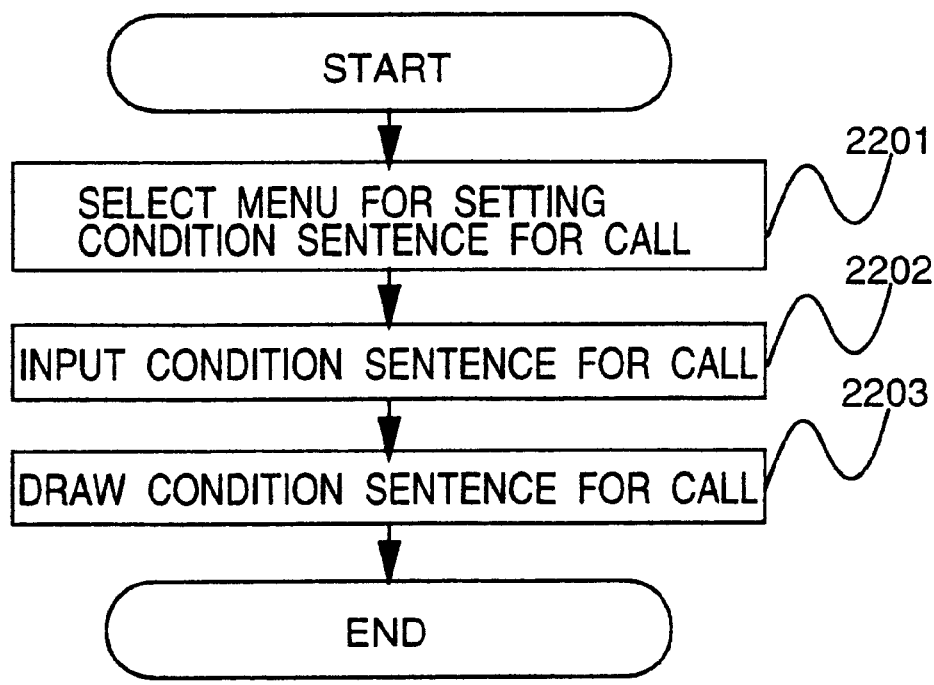
FIG. 22 is a flow chart showing a procedure for setting a procedure calling condition sentence in a sequence attribute of the procedure call sequence of FIG. 18.
Figure 23:
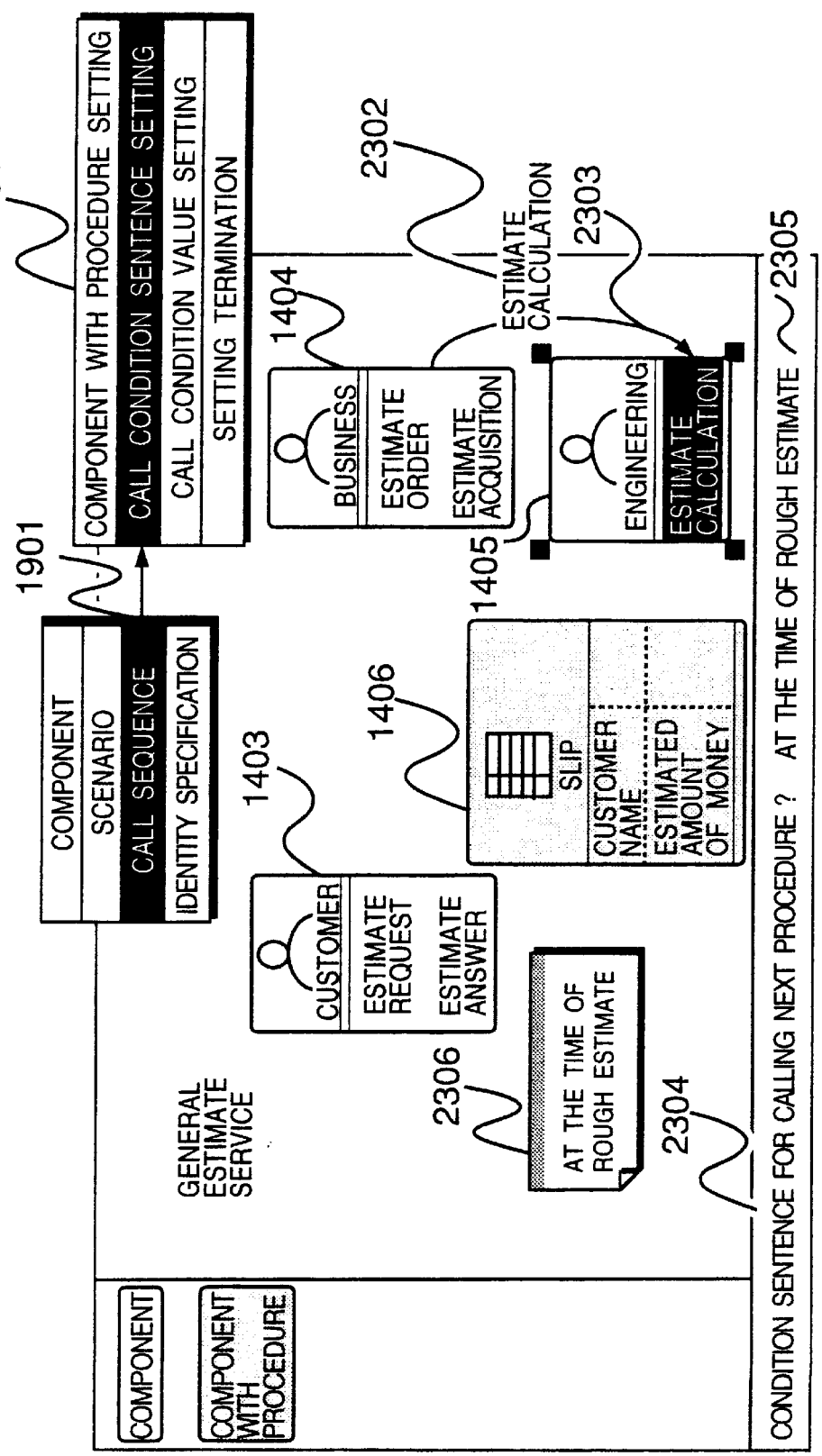
FIG. 23 shows an example of screen display at the time of setting a procedure calling condition sentence as a procedure attribute of the procedure call sequence.

FIG. 22 is a detailed flow chart of the process 1804 for setting a condition sentence for procedure call as a sequence attribute held by the procedure call sequence. FIG. 23 shows a screen display example of the process shown in FIG. 22. By referring to FIGS. 22 and 23, the process 1804 for setting a condition sentence for procedure call as a procedure attribute held by the procedure call sequence will hereafter be described in detail.

Out of displayed menus of the scenario editor 203, the operator first selects the procedure call sequence definition menu 1402 of the scenario menu 1401. The operator calls the definition function of the procedure call sequence and draws the procedure call sequence 2303 which is desired to have a condition sentence for procedure call set therein as a procedure attribute. Then the operator sets a condition sentence for procedure call (step 1804). Out of the menus of the scenario editor 203, a menu 2301 for setting a condition sentence for call of the call sequence menu 1901 is first selected (step 2201). FIG. 23 represents how the menu has been selected. On the screen, the components 1403, 1404, 1405 and 1406 of the scenario generated by the steps 102 and 103 of FIG. 1, and the procedure call sequence 2303 generated by step 105 and specified as described above are displayed. In accordance with a displayed system comment 2304 of the scenario editor 203, a condition sentence for procedure call is inputted (step 2202). In this case, "at the time of rough estimate" 2305 is inputted. And a condition sentence 2306 for call of the inputted procedure is drawn on the scenario editor 203 (step 2203).

Figure 24:
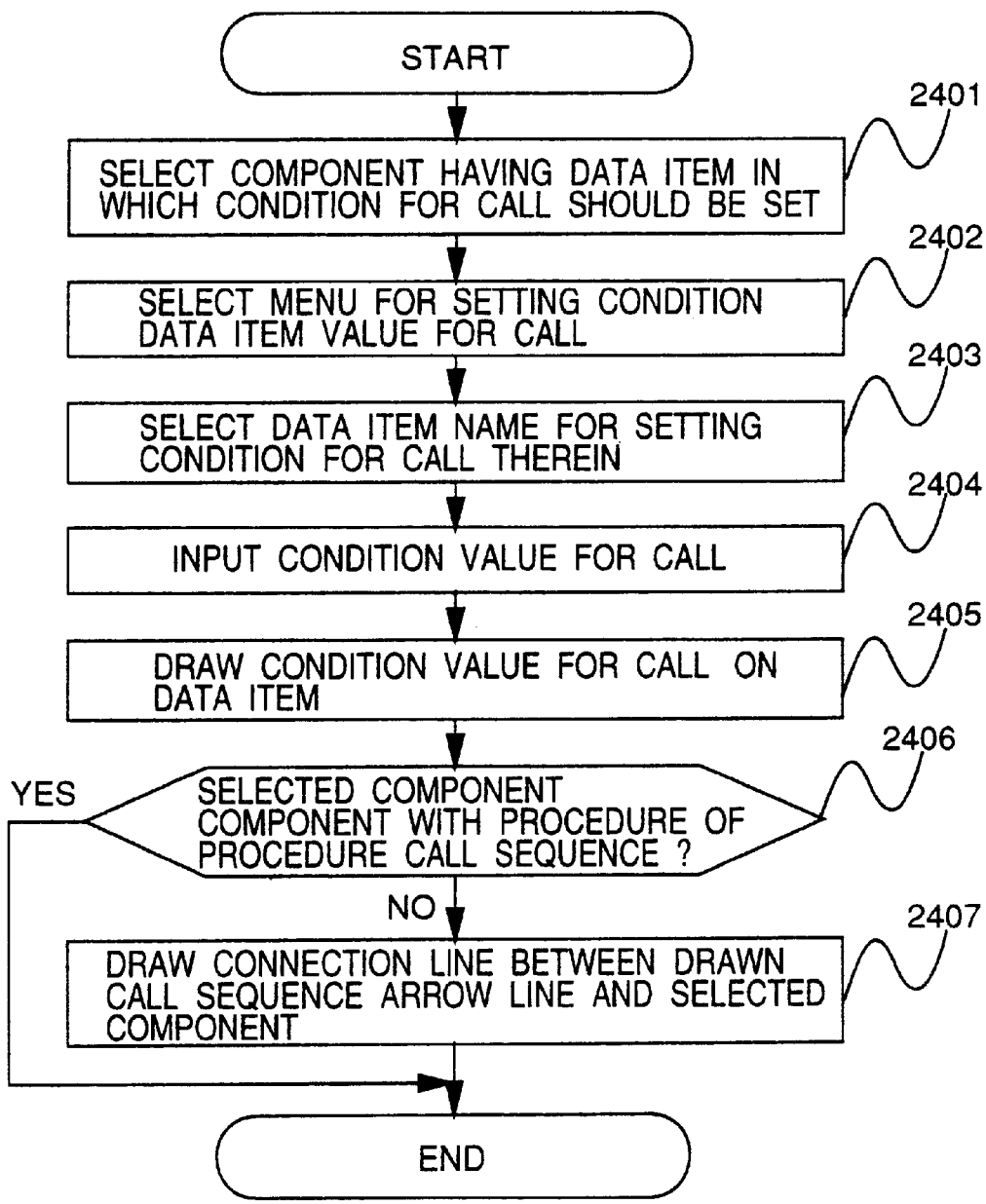
FIG. 24 is a flow chart showing the process for setting, in a data item of a component, a call condition value for calling a procedure in a procedure attribute of the procedure call sequence.
Figure 30:
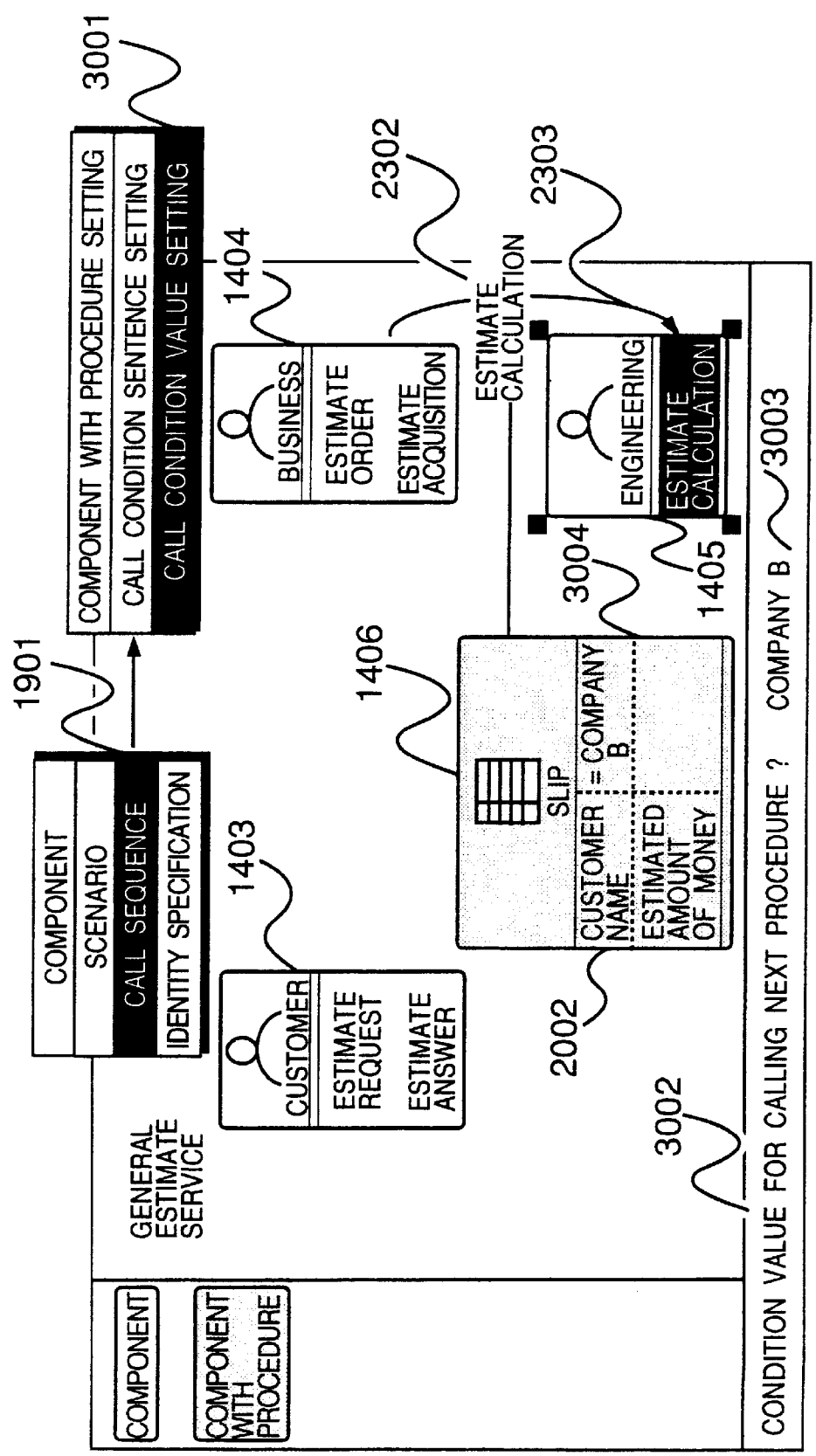
FIG. 30 shows an example of screen display at the time of setting a procedure calling condition value as a procedure attribute of the procedure call sequence as shown in FIG. 18.
Figure 31:
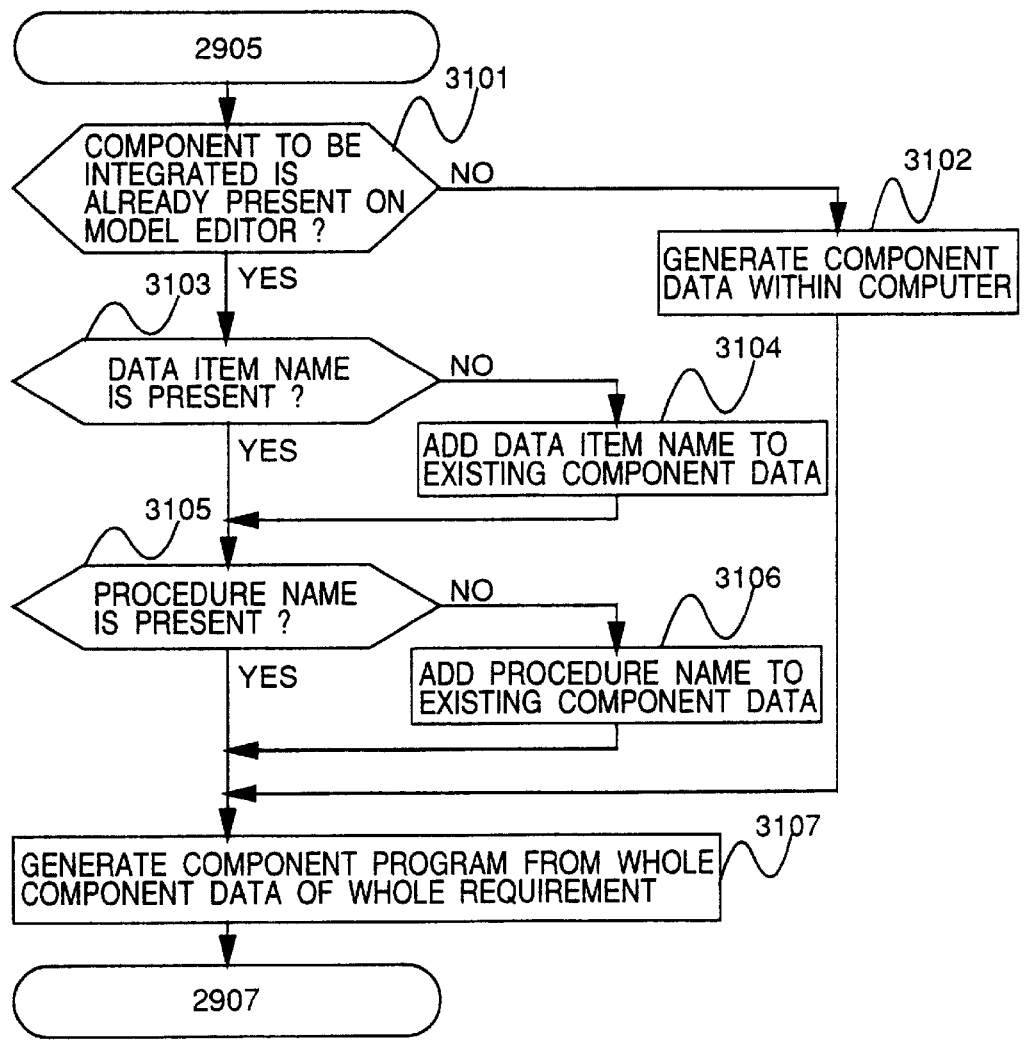
FIG. 31 is a flow chart showing the detailed process of component program generation shown in FIG. 29.
Figure 32:
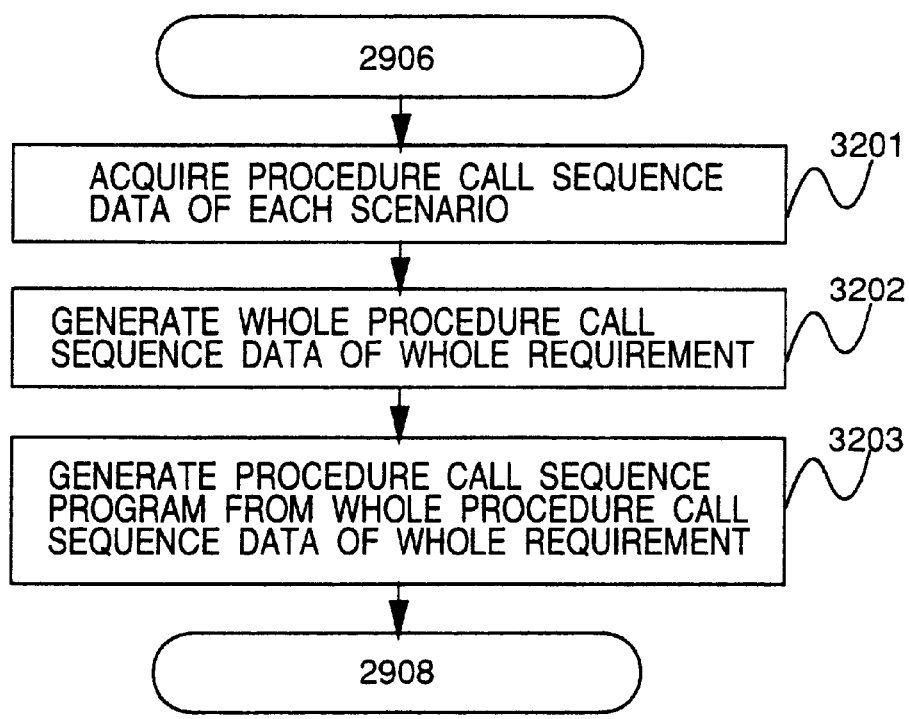
FIG. 32 is a flow chart showing the detailed process of procedure call sequence program generation shown in FIG. 29.

FIG. 24 is a detailed flow chart of the process 1805 for setting a data item value of a component as a condition value for call as a procedure attribute held by the procedure call sequence. Furthermore, FIG. 30 shows a screen display example of the process shown in FIG. 24. By referring to FIGS. 24 and 30, the process for setting a data item value as a condition value for call as a procedure attribute held by the procedure call sequence will hereafter be described in detail.

Out of displayed menus of the scenario editor 203, the operator first selects the procedure call sequence definition menu 1402 of the scenario menu 1401. The operator calls the definition function of the procedure call sequence and draws the call sequence 1503 of the procedure which is desired to have a condition value for procedure call set therein as a procedure attribute. Then the operator sets a condition value for procedure call (step 1805). First of all, a component which is desired to have a condition value for procedure call set in a data item thereof is selected (step 2401). Out of the menus of the scenario editor 203, a menu 3001 for setting a condition value for call of the call sequence menu 1901 is selected (step 2402). FIG. 30 represents how the menu has been selected. Then, a data item name 2002 of a component which is desired to have a condition value for procedure call set therein is selected (step 2403). In accordance with a displayed system comment 3002 of the scenario editor 203, a condition value for procedure call is inputted to the data item (step 2404). In this case, "company B" 3003 is inputted. In association with the data item name 2002 included in the selected component, the inputted condition value for call is drawn (step 2405). And it is determined whether the component has already been set as a component with procedure of the drawn procedure call sequence (step 2406). In the case where the component is not a component with procedure of the drawn procedure call sequence, a connection line 3005 is drawn between the call sequence name 2302 located on the drawn arrow line 2303 and the selected component 1406 (step 2407).

The method for displaying a scenario inputted at step 101 by using an event flow diagram will now be described.

Figure 25:
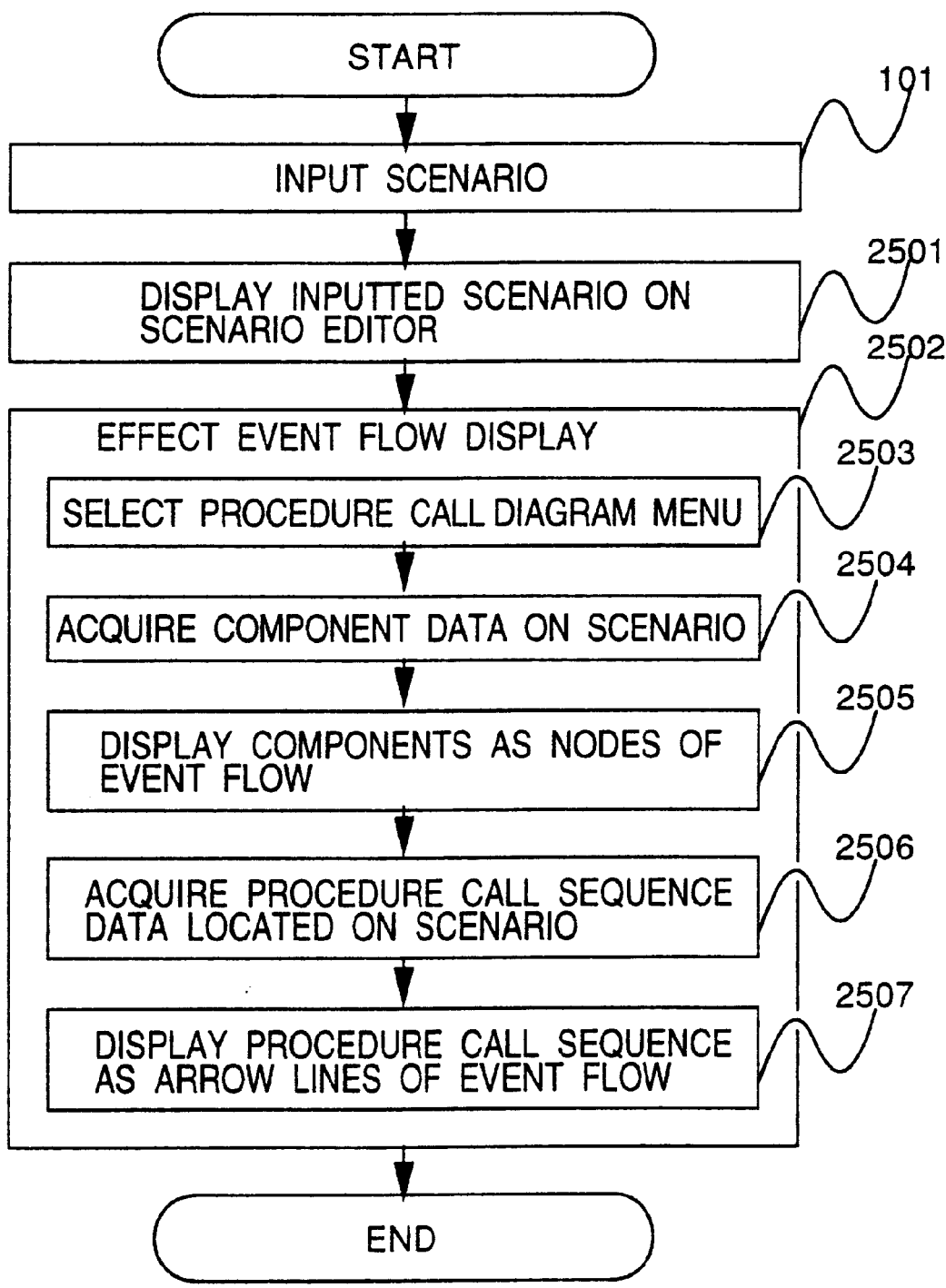
FIG. 25 is a flow chart showing the process for creating and displaying an event flow diagram on the basis of the scenario data inputted as shown in FIG. 1.
Figure 26:
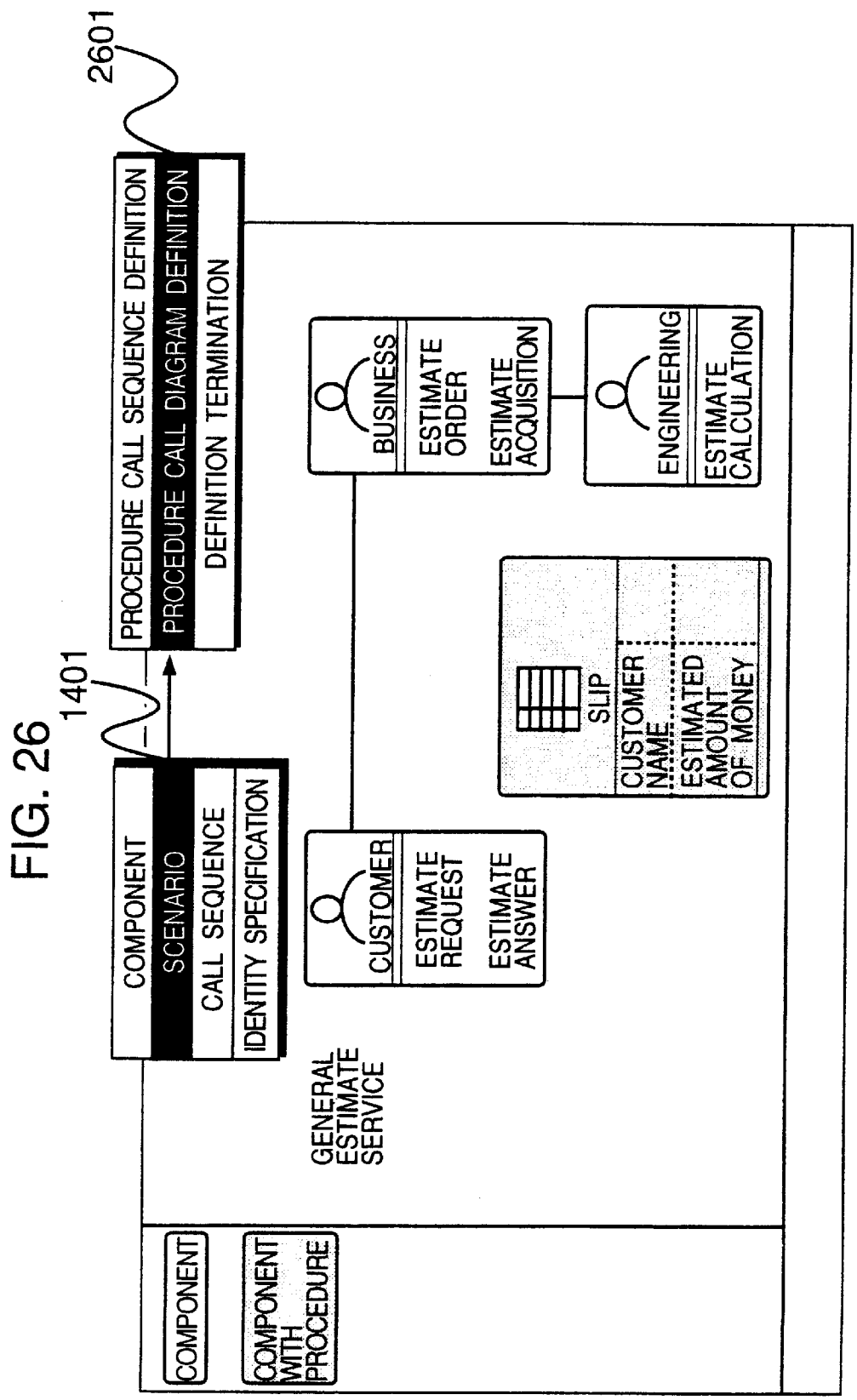
FIG. 26 shows an example of screen display of the scenario inputted as shown in FIG. 1.
Figure 27:
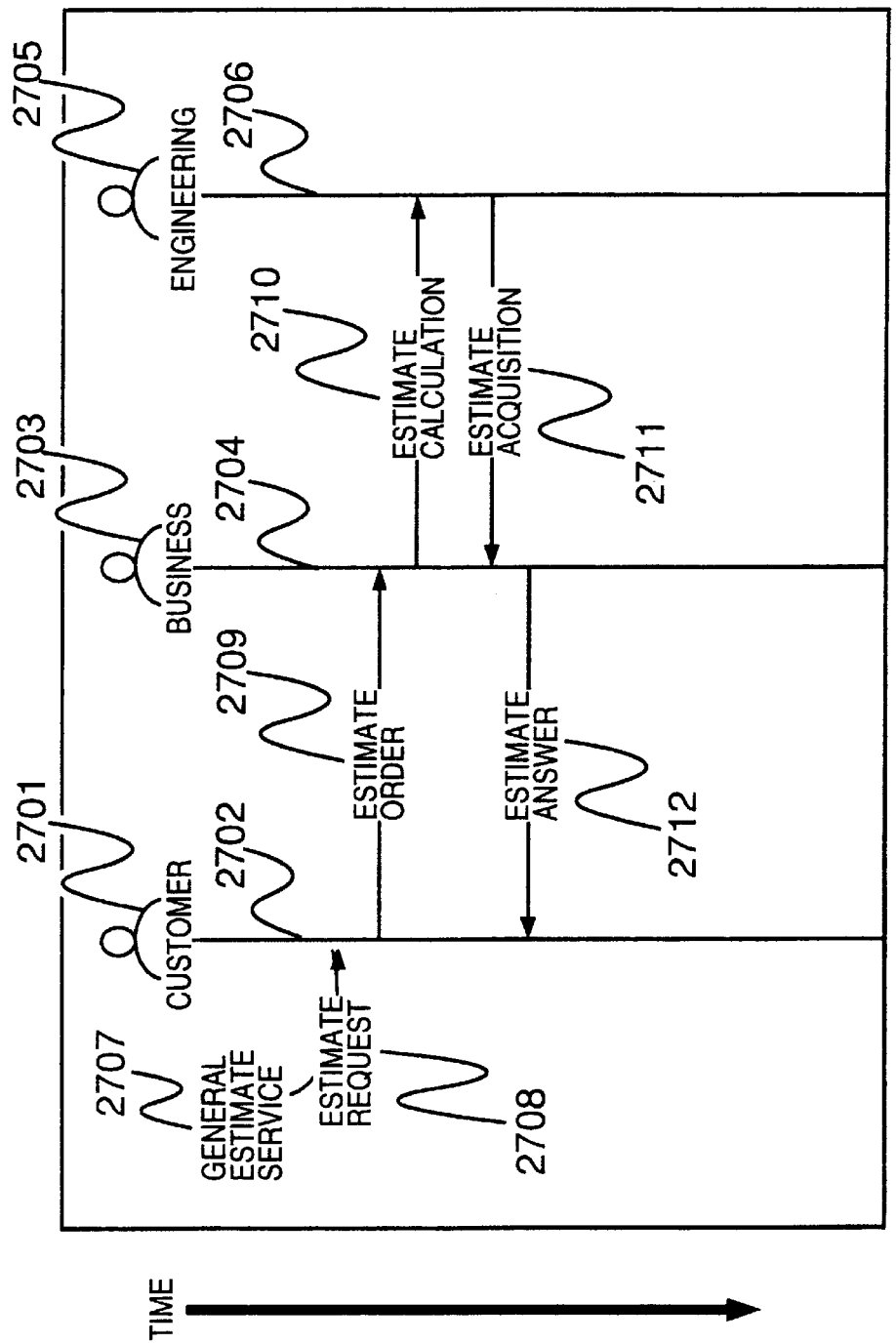
FIG. 27 shows an example of screen display of an event flow generated from the scenario data which is displayed as shown in FIG. 26.

FIG. 25 is a flow chart of the process for displaying an inputted scenario by using an event flow diagram. Furthermore, FIGS. 26 and 27 show a screen display example of the process shown in FIG. 25. By referring to FIGS. 25 through 27, the process for displaying the inputted scenario by using an event flow diagram will now be described.

First of all, the operator inputs a scenario (step 101). The inputted scenario is displayed on the scenario editor 203 (step 2501). Then, the displayed scenario is displayed by using an event flow diagram (step 2502). Out of menus of the scenario editor 203 displaying the inputted scenario, the operator first selects the procedure call diagram definition menu 2601 of the scenario menu 1401 (step 2503). FIG. 26 represents how the menu has been selected. On the screen, there are displayed connection lines 1602 and 1603 between the scenario components 1403, 1404, 1405 and 1406 generated by steps 102 and 103 of FIG. 1 and the component having the procedure call sequence defined therein generated by step 106. Then, component data on the scenario is acquired (step 2504). Respective components are displayed as nodes 2701, 2703 and 2705 on the event flow (step 2505). All of the procedure call sequence data of the scenario are acquired (step 2506). By representing the displayed nodes as terminals, all arrow lines representing the procedure call sequence are displayed on the basis of the acquired procedure call sequence data (step 2507). FIG. 27 shows an example of display of the procedure call sequence of an inputted and specified scenario (FIG. 26) using an event flow diagram. Nodes of the event flow includes combinations 2701, 2703 and 2705 of component figures and component names and straight lines 2702, 2704 and 2706 functioning as terminals of call sequence arrow lines. The straight lines 2702, 2704 and 2706 represent time elapse of the call sequence from the top toward the bottom. As for displayed procedure call sequence data, a scenario name 2707 is displayed. All procedure call sequences in the scenario are represented by arrow lines and procedure names 2708, 2709, 2710, 2711 and 2712.

Then, the visualized whole requirement of the development subject is created (step 107).

Figure 29:
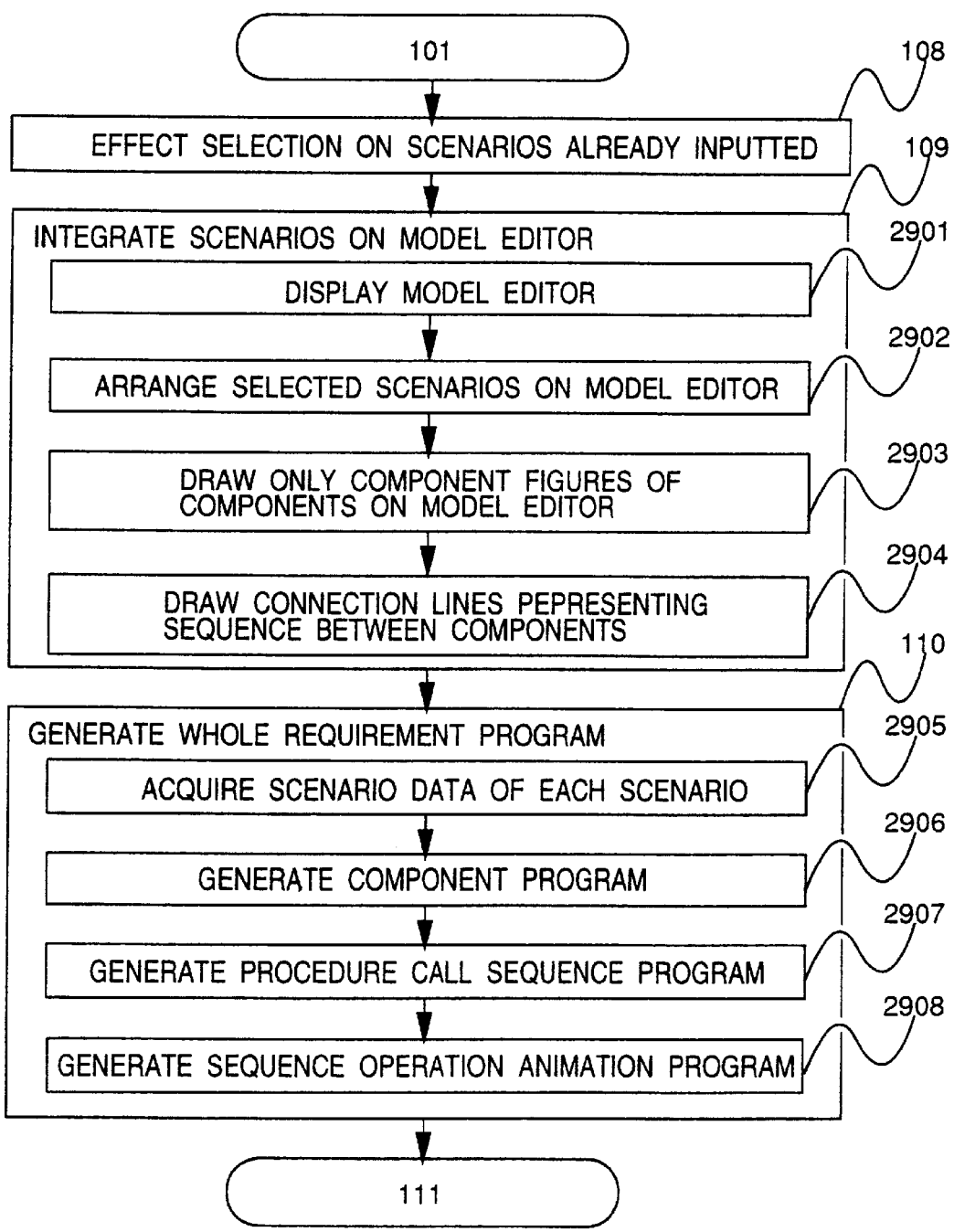
FIG. 29 is a flow chart showing the detailed process of the creation of the whole requirement as shown in FIG. 1.
Figure 33:
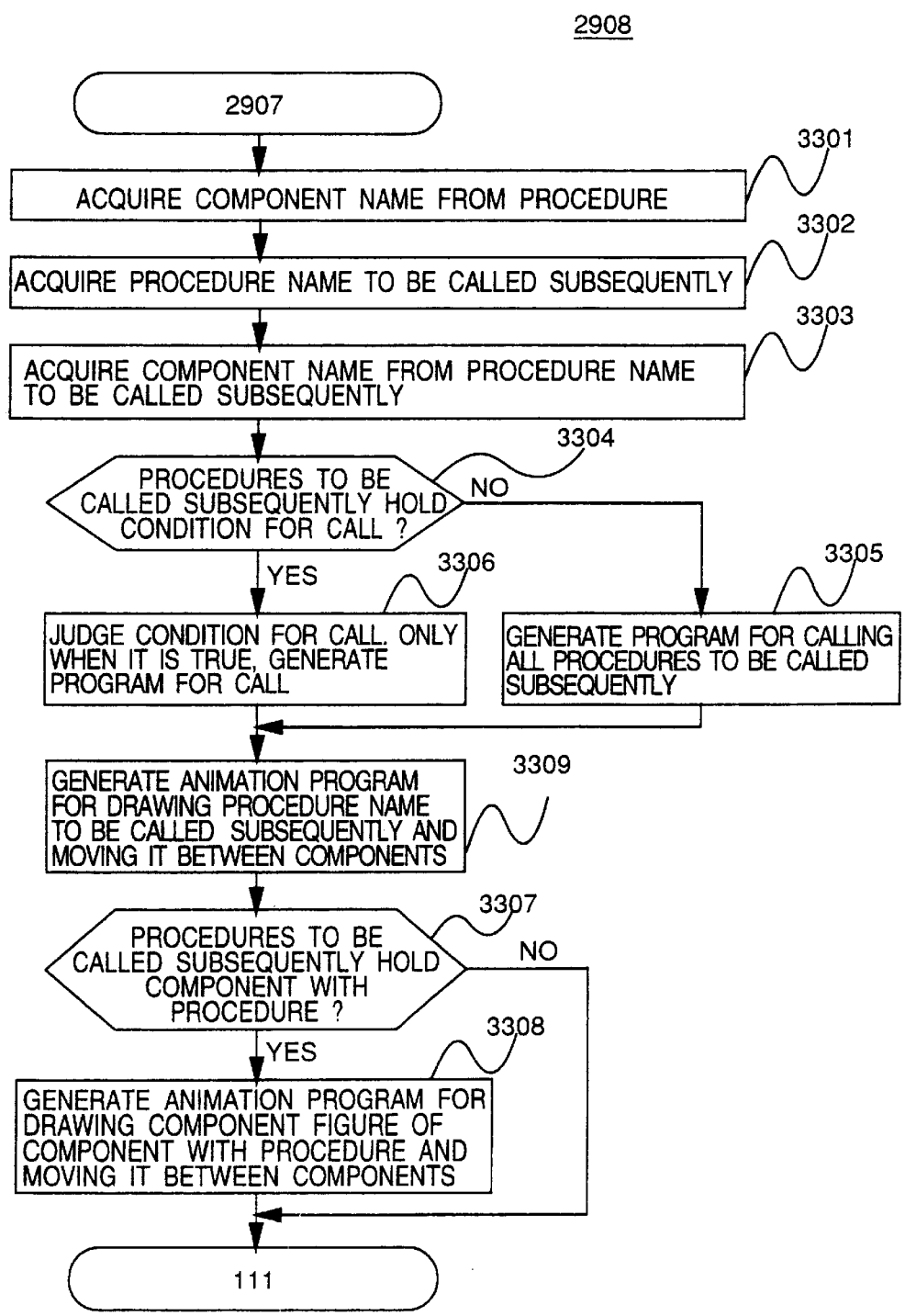
FIG. 33 is a flow chart showing the detailed process of sequence operation animation program generation shown in FIG. 29.

FIG. 29 is a detailed flow chart showing, up to display, the process 107 for creating the visualized whole requirement of the development subject. FIG. 5 shows a screen display example of the visualized whole requirement of the development subject created by the process of FIG. 29. FIG. 46 shows an example of a program of the visualized whole requirement of the development subject created by the process of FIG. 29. FIG. 33 is a detailed flow chart of the step 110 for creating the program of the visualized whole requirement of the development subject shown in FIG. 29. By referring to FIGS. 29, 5, 46, and 31 through 33, the process 107 for creating the visualized whole requirement of the development subject will hereafter be described in detail.

First of all, a scenario inputted at step 101 is selected (step 108).

Then, selected scenarios are integrated on the model editor 204 (step 109). The model editor 204 is first displayed (step 2901). The selected scenarios are arranged and integrated on the model editor 204 by means of interactive operation (step 2902). And only the component FIGS. 503, 504 and 505 of components of the arranged scenarios are drawn as components of the visualized whole requirement of the development subject (step 2903). Then, the connection lines 506 and 507 representing the procedure call sequence between components are drawn (step 2904).

A program corresponding to the visualized whole requirement of the development subject integrated on the model editor 204 is generated (step 110). First of all, scenario data 206 of each of the integrated scenarios held within the computer is acquired (step 2905).

Then, the component data 207 of each scenario are integrated by taking a component as the unit. From the integrated whole component data 210 of the development subject, the component program 227 is generated (step 2906). At step 2906, it is first determined whether a component on the integrated scenario is present on the model editor 204 (step 3101). If the component is not present, it is generated as the component data 210 held by the visualized whole requirement of the development subject (step 3102). On the other hand, if the component is present, it is determined whether the data item name is present in the existing components 210 (step 3103). If the data item name is not present, the data item name is added to the existing component data 210 (step 3104). On the other hand, if the data item name is present, it is determined whether the procedure name is present in the existing components 210 (step 3105). If the procedure name is not present, the procedure name is added to the existing component data 210 (step 3106). From the component data 210 of the visualized whole requirement of the development subject generated by the above described process, the corresponding component program 227 is generated (step 3107). In association with the component name of the component data of the visualized whole requirement of the development subject, a program 4601 is generated. In association with the component presentation data, a program 4602 is generated. In association with the procedure, a program 4603 is generated.

Then, the procedure call sequence data 211 of the visualized whole requirement of the development is generated, and the corresponding procedure call sequence program 228 is generated (step 2907). First of all, the procedure call sequence data 208 of each of integrated scenarios to be held within the computer is acquired (step 3201). For each procedure name, the procedure call sequence data 211 of the visualized whole requirement of the development subject is generated (step 3202). For each procedure name, the procedure call sequence data 221 of the visualized whole requirement of the development subject holds a scenario administration peculiar number, a component name holding the procedure, a procedure name to be called subsequently, and data of component with procedure and condition data for call held by the procedure call sequence to be called subsequently. In the above described process, from the procedure call sequence data of the visualized whole requirement of the development subject, the corresponding procedure call sequence program 228 is generated (step 3203).

Then, a processing program 205 for displaying the call sequence in an animation form is generated from the procedure call sequence data 211 of the visualized whole requirement of the development subject generated by the above described process 2907 (step 2908). First of all, the component name defined from the procedure name is acquired (step 3301). Then, the procedure name to be called subsequently is acquired (step 3302). The component name having the procedure name to be called subsequently defined therein is acquired (step 3303).

Then, it is determined whether the condition data for call, data of condition data item value for call, or data of condition sentence for call has already been set as a procedure attribute for procedures to be called subsequently (step 3304). If condition data for call are not set for all procedure attributes of the procedures to be called subsequently, a program for starting all of those procedures is generated (step 3305). If data of condition data item value for call has already been set as a procedure attribute for the procedures (step 1805), then it is determined whether the data item value of a specified component coincides with the condition data item value for call which has been set and only in the case where it is true the program for calling the next procedure is generated (step 3306). If data of condition sentence for call has already been set as a procedure attribute for procedures (step 1804), then the condition sentence for call is displayed and only when the operator has selected that the condition sentence for call is true the program for calling the next procedure is generated (step 3306).

Then, there is generated a processing program for drawing and moving the procedure name 508 to be called subsequently, on the connection line 506 between the components 503 and 504 acquired at the steps 3301 and 3303, from the calling component 503 toward the called component 504 (step 3309).

Then, it is determined whether a component with procedure has already been set as a procedure attribute of the procedure call sequence (step 3307). If a component with procedure has already been set as a procedure attribute of the procedure call sequence, then there is generated a processing program 4605 for drawing and moving the component figure 509 of the component with procedure, on the connection line 506 between the components 503 and 504 acquired at the steps 3301 and 3303, from the calling component 503 toward the called component 504 (step 3308).

By taking a sales management system as an example, the process of the method for defining scenarios including the procedure call sequence in which procedure calls are executed in parallel from a certain time point and the relating method for visually displaying the whole scenario of the development subject will now be described in detail.

Figure 28:
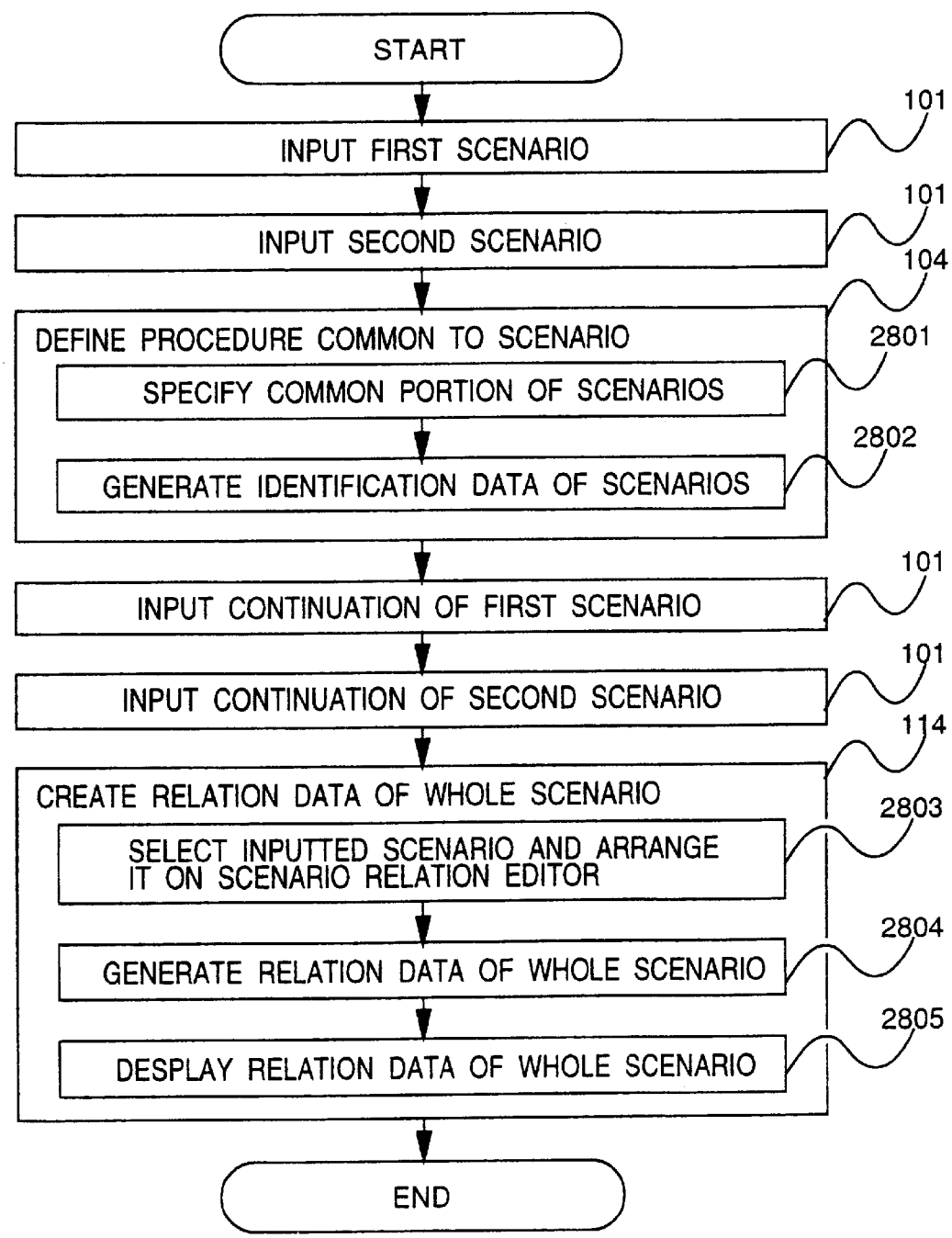
FIG. 28 is a flow chart showing the process for creating relation data of the scenario of the whole requirement.
Figure 37:
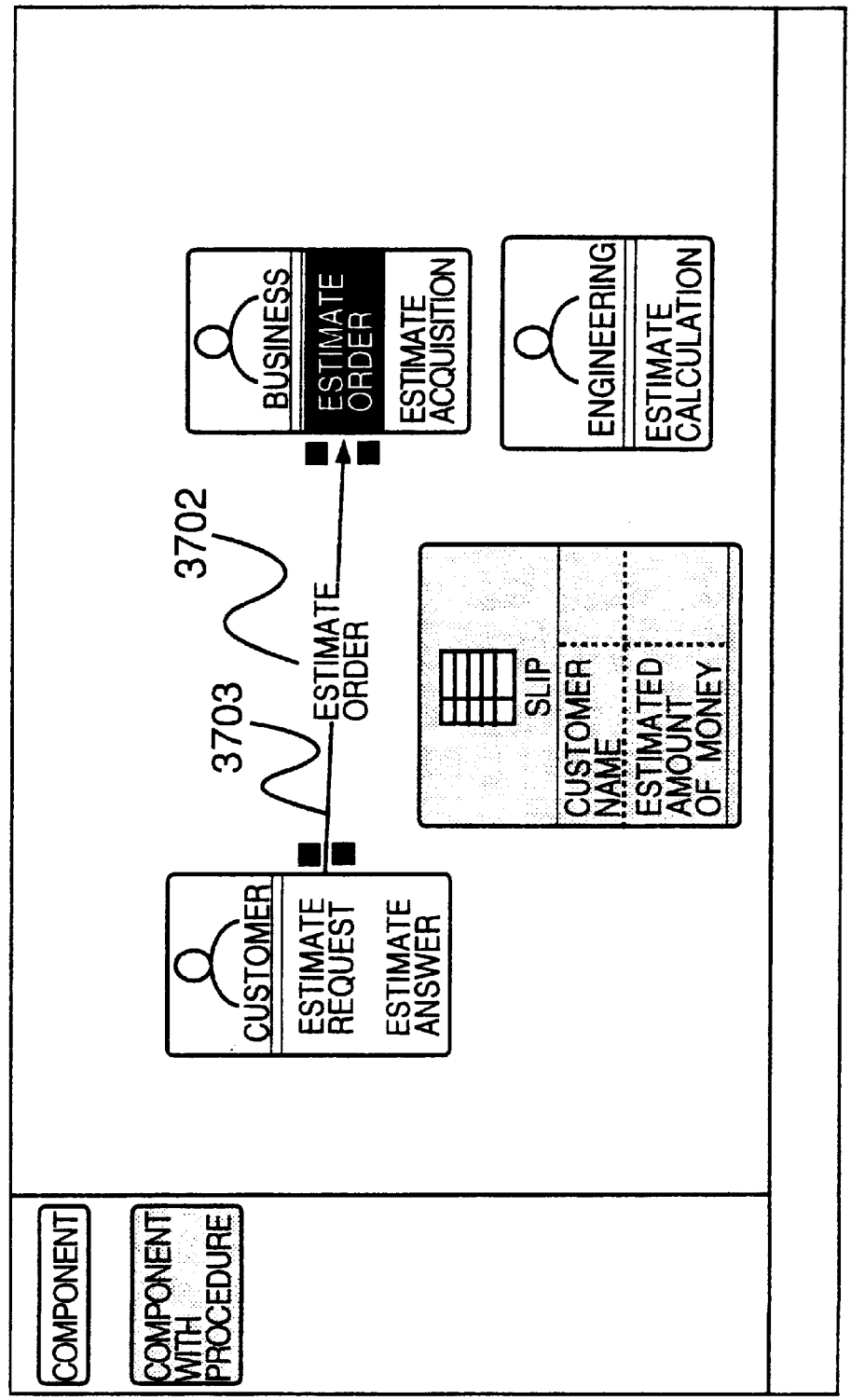
FIG. 37 shows an example of screen display of a scenario inputted by the scenario input of FIG. 1.

FIG. 28 is a detailed flow chart of the process 104 for defining scenarios including the procedure call sequence in which procedure calls are executed in parallel from a certain time point and the relating process 114 for visually displaying the whole scenario of the development subject. FIGS. 34A through 34E and 35A through 35E show scenario data inputted in the earlier stage of FIG. 28. FIGS. 36 and 37 show screen display examples of specification of a common portion of the scenario in FIG. 28. By referring to FIG. 8 and FIGS. 34 through 37, the method for defining scenarios including the procedure call sequence in which procedure calls are executed in parallel from a certain time point and the relating method for visually displaying the whole scenario of the development subject will hereafter be described.

First of all, a first scenario to be referred to is inputted in accordance with step 101 and first scenario data (FIG. 34) is generated. Then, a second scenario which refers to the first scenario is inputted in accordance with step 101 and second scenario data (FIG. 35) is generated.

Then, it is specified that the procedure call sequence of the second scenario must refer to a certain procedure call sequence of the first scenario and it is specified that the specified procedure call sequence must be common to the first and second scenarios (step 2801). First of all, an arrow line 3605 representing a referred procedure call sequence on the referred second scenario 3601 is displayed and a procedure 3602 is selected. Out of menus of the scenario editor 203, the identity specification menu 3603 is then selected. FIG. 36 shows how the menu 3603 has been selected. In accordance with a displayed system comment 3604 of the scenario editor 203, the first scenario 3701 is displayed on the scenario editor 203 (FIG. 37). An arrow line 3703 of a procedure call sequence whereby the procedure call sequence of the second scenario is displayed and a referred procedure 3702 is selected.

Then, in order to represent that a procedure specified to be common exists in scenario data of the specified first scenario (FIG. 34) and scenario data of the second scenario (FIG. 35), identification data is generated (step 2802).

Figure 38:
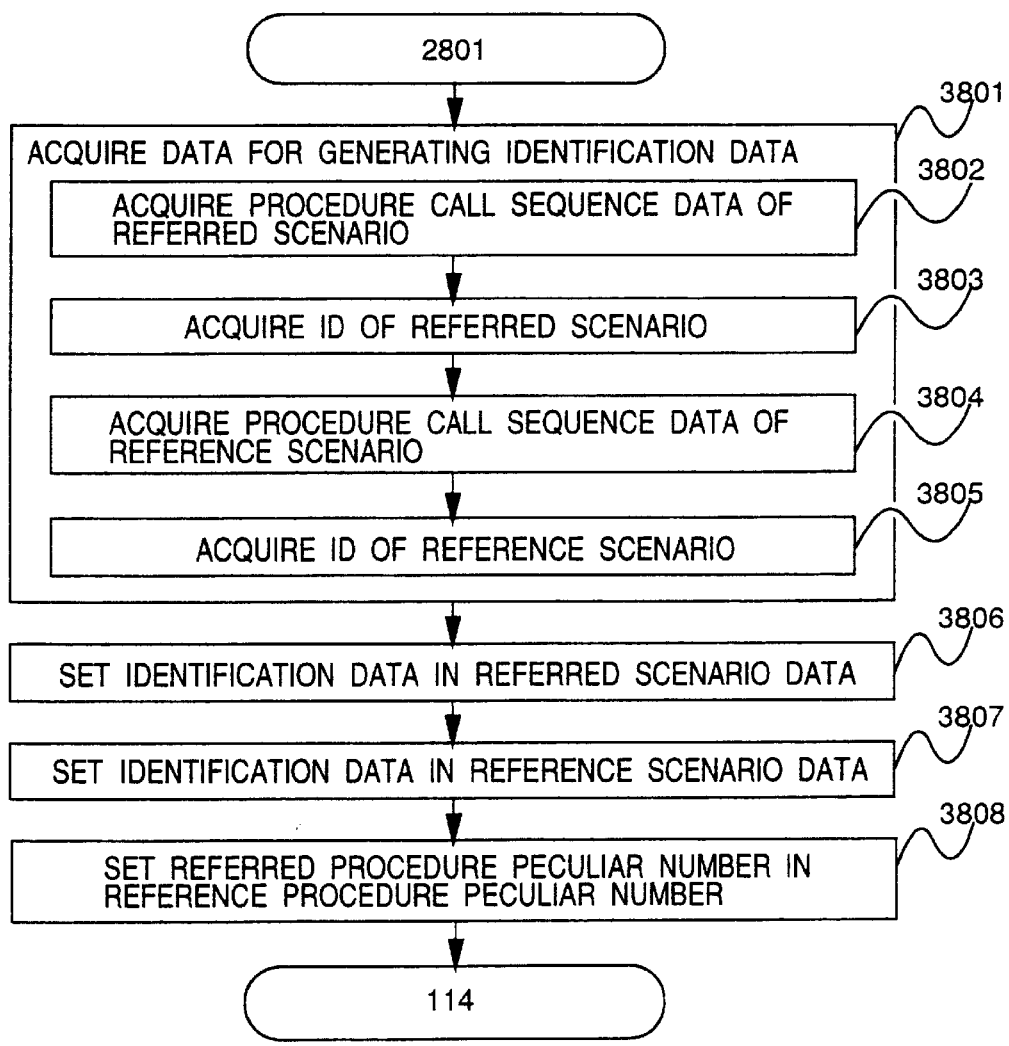
FIG. 38 is a flow chart showing the detailed process of identification data generation of the scenario shown in FIG. 28.
Figures 39D, 39E:
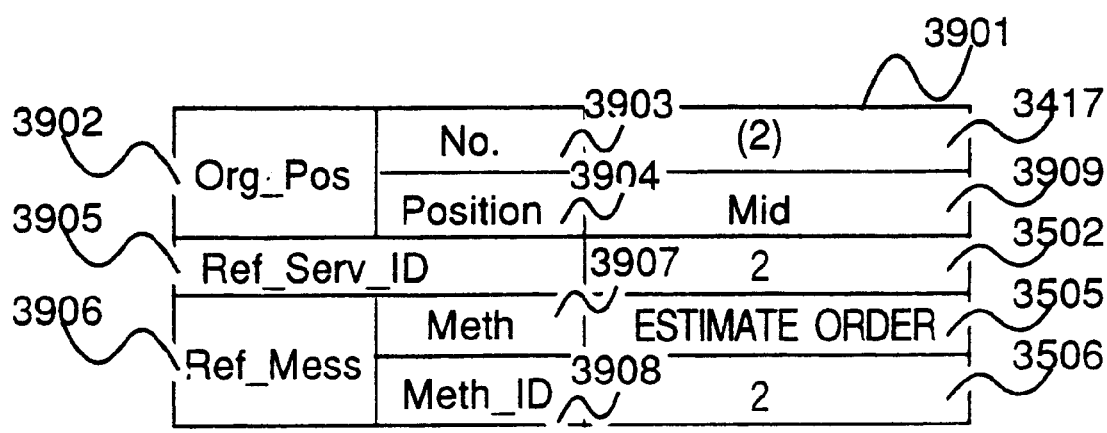
Figures 40D, 40E:
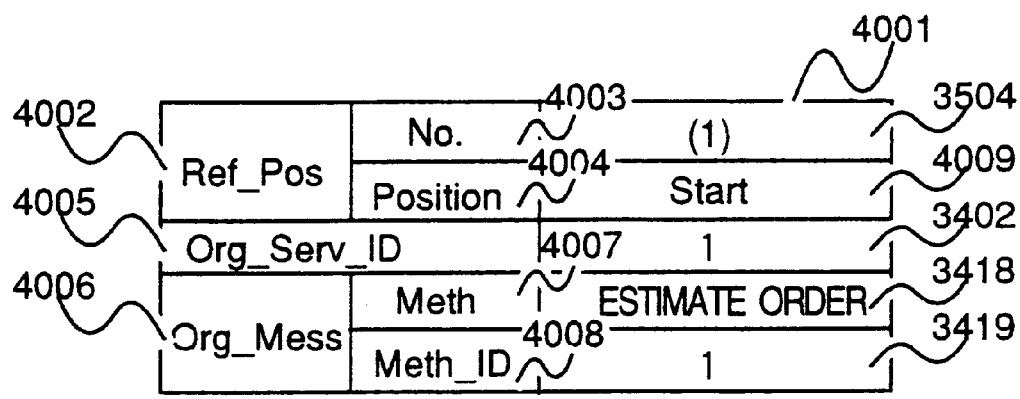

FIG. 38 is a detailed flow chart of the scenario identification data generation process 2802. FIGS. 39 and 40 show examples of scenario data containing identification data generated by the process of FIG. 38. By referring to FIGS. 38 through 40, the scenario identification data generation process 2802 will hereafter be described in detail.

First of all, data for generating identification data in the first scenario data (FIGS. 34A through 34E) and the second scenario data (FIGS. 35A through 35E) is acquired (step 3801). Procedure call sequence data 3416 of the referred scenario (the first scenario) is first acquired (step 3802). Then, a peculiar number 3402 of the referred scenario is acquired (step 3803). Then, procedure call sequence data 3503 of the reference scenario (the second scenario) is acquired (step 3804). Then, a peculiar number 3502 of the reference scenario is acquired (step 3805).

From the identification data generating data acquired by the above described process 3801, identification data 3901 is generated in scenario data of the referred scenario (step 3806). On the basis of the acquired referred procedure call sequence data 3416, order 3903 of the sequence from the top in the scenario is first set from a portion 3417 of the acquired data 3416 as position data 3902 of the referred procedure call sequence of the referred identification data 3901. And from the data 3416, concept position data 3904 representing whether the sequence position is located in the top position, in an intermediate position, or in the last position is generated. The position of the referred procedure call sequence in the present embodiment is an intermediate position 3909. Then, the peculiar number 3502 of the acquired referred scenario is set as referred identification data 3905. On the basis of a procedure name 3505 and a procedure peculiar number 3506 of the acquired reference procedure call sequence data, the data are respectively set in 3907 and 3908 as referred identification data 3906 concerning the procedure.

From the identification data generating data acquired by the above described process 3801, identification data 4001 is generated in scenario data of the referred scenario (step 3807). On the basis of the acquired reference procedure call sequence data 3503, order 4003 of the sequence from the top in the scenario is first set from a portion 3504 of the acquired data 3503 as position data 4002 of the reference procedure call sequence of the reference identification data 4001. And from the data 3503, concept position data 4004 representing whether the sequence position is located in the top position 4909, in an intermediate position, or in the last position is generated. The position of the reference procedure call sequence in the present embodiment is the top position 4009. Then, the peculiar number 3502 of the acquired referred scenario is set as reference identification data 4005. On the basis of a procedure name 3418 and a procedure peculiar number 3419 of the acquired referred procedure call sequence data, the data are respectively set in 4007 and 4008 as referred identification data 4006 concerning the procedure.

An acquired referred procedure peculiar number 4010 is set in a reference procedure peculiar number 3413 of the reference scenario data (step 3808).

In the case where a procedure defines a call sequence continuously for the inputted first and second scenarios, a scenario is inputted.

In order to create relation data of whole scenario of the development subject, relation data 218 of whole scenario of development subject are created from the identification data 217 of the scenario data 206 of the defined scenarios (step 114). First of all, a scenario inputted at step 101 is selected and arranged on the scenario relation diagram editor 216 (step 2803).

Then, relation data of the whole scenario of the development subject are generated (step 2804).

Figure 41:
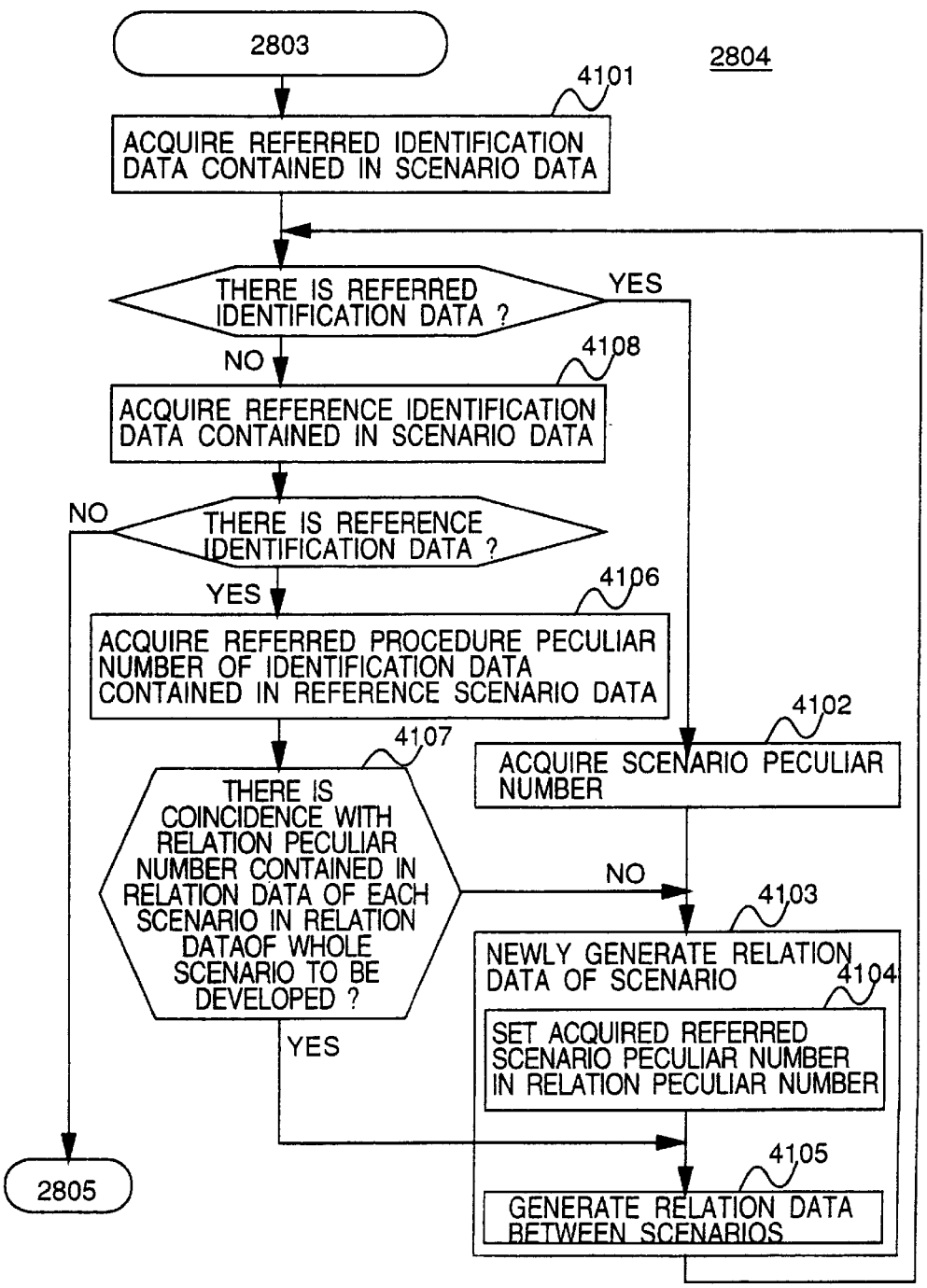
FIG. 41 is a flow chart showing the detailed process of relation data generation of the whole scenario shown in FIG. 28.
Figure 42:
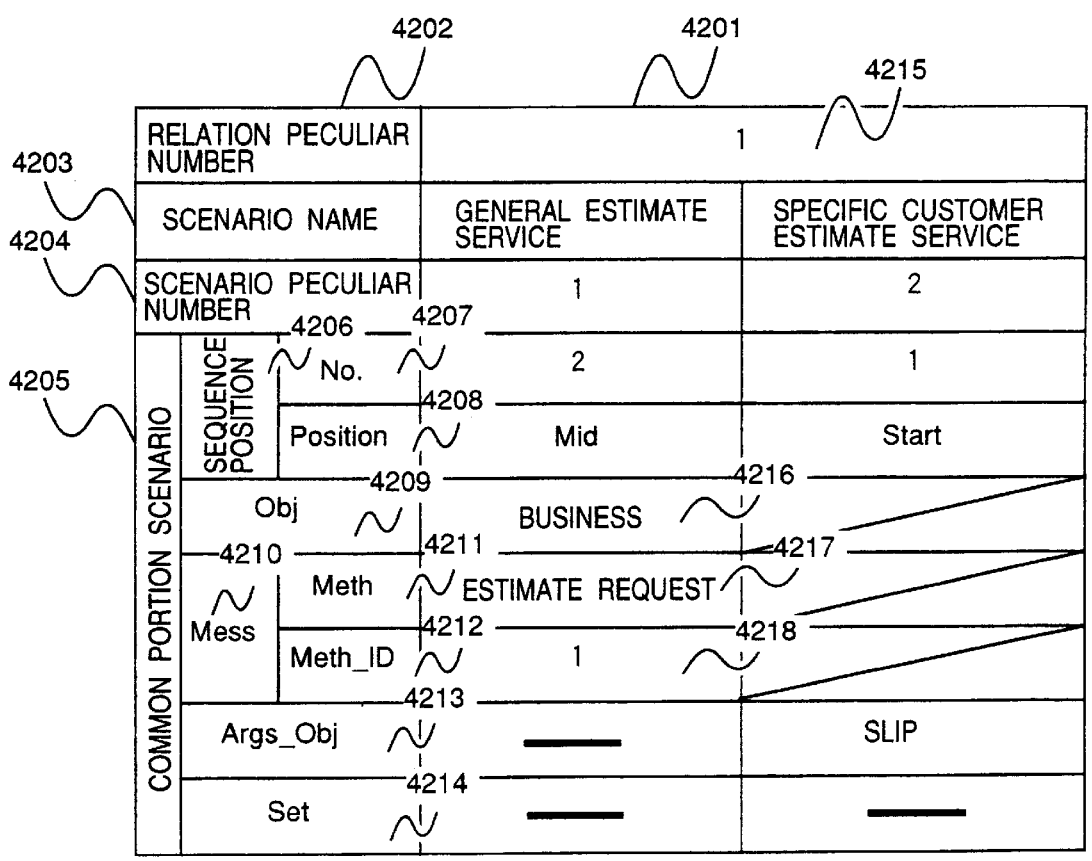
FIG. 42 shows an example of relation data of the whole scenario generated by relation data generation of the whole scenario shown in FIG. 41.

FIG. 41 is a detailed flow chart of the process 2804 for generating relation data of the whole scenario of the development subject. FIG. 42 shows an example of relation data of a scenario generated by the process shown in FIG. 41. By referring to FIGS. 41 and 42, the process 2804 for generating relation data of the whole scenario of the development subject will hereafter be described in detail.

First of all, referred data 220 of the identification data 217 contained in the scenario data 206 of the scenario selected as described above is acquired (step 4101). In the case where there is referred data, the scenario peculiar number 221 of the scenario is acquired (step 4102). Then, relation data 4201 of the scenario is newly generated (step 4103). The acquired scenario peculiar number 221 is first set in a relation peculiar number 4202 (step 4104). Here, the scenario peculiar number 3402 of the referred scenario data (FIG. 39A) has been set as the relation peculiar number 4202 of the relation data 4201 of the scenario. From the referred data 220 of the acquired identification data 217, relation data between scenarios is generated (step 4105). As relation data between scenarios, respective scenario names 4203 and scenario peculiar numbers 4204 are generated. As common portion scenario 4205, procedure call sequence data common to scenarios is generated. As the common portion scenario 4205, there are held position data 4206 in which the procedure call sequence is defined, a component name 4209 which holds the procedure, a procedure name 4211, a peculiar number 4212, and procedure attribute data 4213 and 4214 of the procedure call sequence. In case of the referred scenario, all of relation data between the above described scenarios are set.

The reference procedure data 219 of the identification data 217 contained in the scenario data 206 of the scenario selected as described above is acquired (step 4108). In the case where there is reference procedure data, the referred procedure peculiar number 4006 contained in the identification data 217 of the referred scenario is acquired (step 4106). Then, it is determined whether the relation peculiar number 4202 coinciding with the referred procedure peculiar number 4006 is present in the existing relation data 218 of whole scenario of development subject (step 4107). If there is no coincidence with the referred procedure peculiar number 4006, then relation data of the scenario is newly generated (step 4103) and the acquired referred procedure peculiar number 4006 is set as the relation peculiar number 4202 (step 4104). If there is a relation peculiar number 4202 which coincides with the referred procedure peculiar number 4006, then relation data of the scenario having the coincident relation peculiar number is updated (step 4105). In the case of a reference scenario, data included in the above described relation data between scenarios other than the component name 4209 holding the procedure concerning the commonly specified procedure call sequence, the procedure name 4211, and the peculiar number 4212 are set.

Then, relation data of the whole scenario of the development subject are displayed on the scenario relation diagram editor (step 2805). A scenario relation diagram editor 4301 includes an area 4302 for displaying relations among scenarios of the whole development subject and an area 4303 for displaying relation data.

Figure 43:
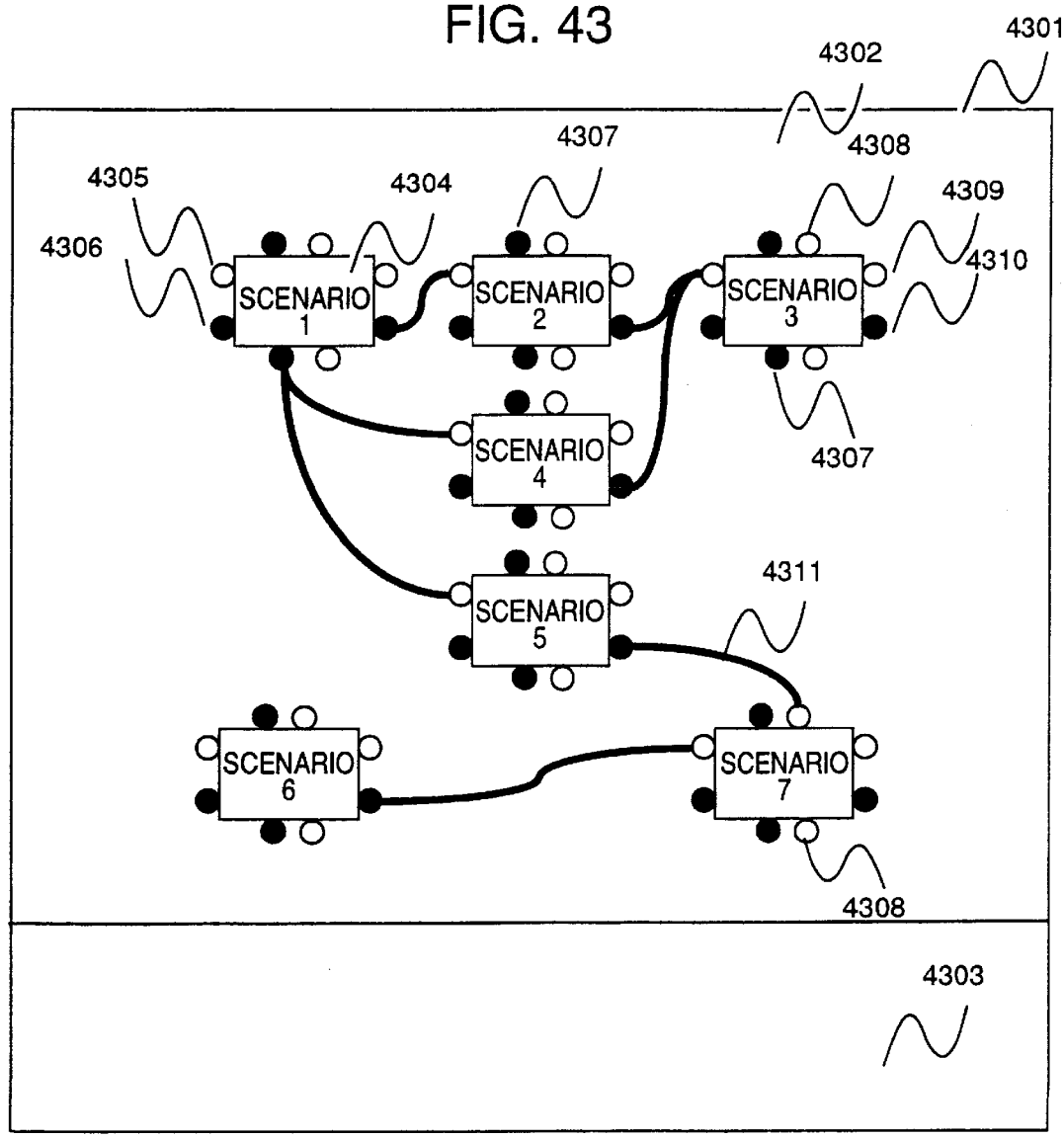
FIG. 43 shows a display example of relation data of the whole scenario shown in FIG. 28.

FIG. 43 shows an example of the method for displaying relation data of the whole scenario of the development subject.

The area 4302 for displaying relations among scenarios of the whole development subject includes a figure 4304 representing a scenario defined by the user and a connection line 4311 representing a relation between scenarios. Furthermore, terminals (4305 through 4310) representing relations between scenarios are displayed in classified cases depending upon the position of the identically specified procedure call sequence in the scenario. The terminals 4305 and 4306 are used when the position of the identically specified procedure is located at the top of the scenario. The terminals 4307 and 4308 are used when the position of the identically specified procedure is located in an intermediate position of the scenario. The terminals 4309 and 4310 are used when the position of the identically specified procedure is located in an end position of the scenario. Furthermore, relations of reference procedure and referred procedure between identically procedures are represented by terminal shapes. In the present embodiment, reference terminals are represented by 4305, 4308 and 4309, whereas referred terminals are represented by 4306, 4307 and 4310.

Figure 44:
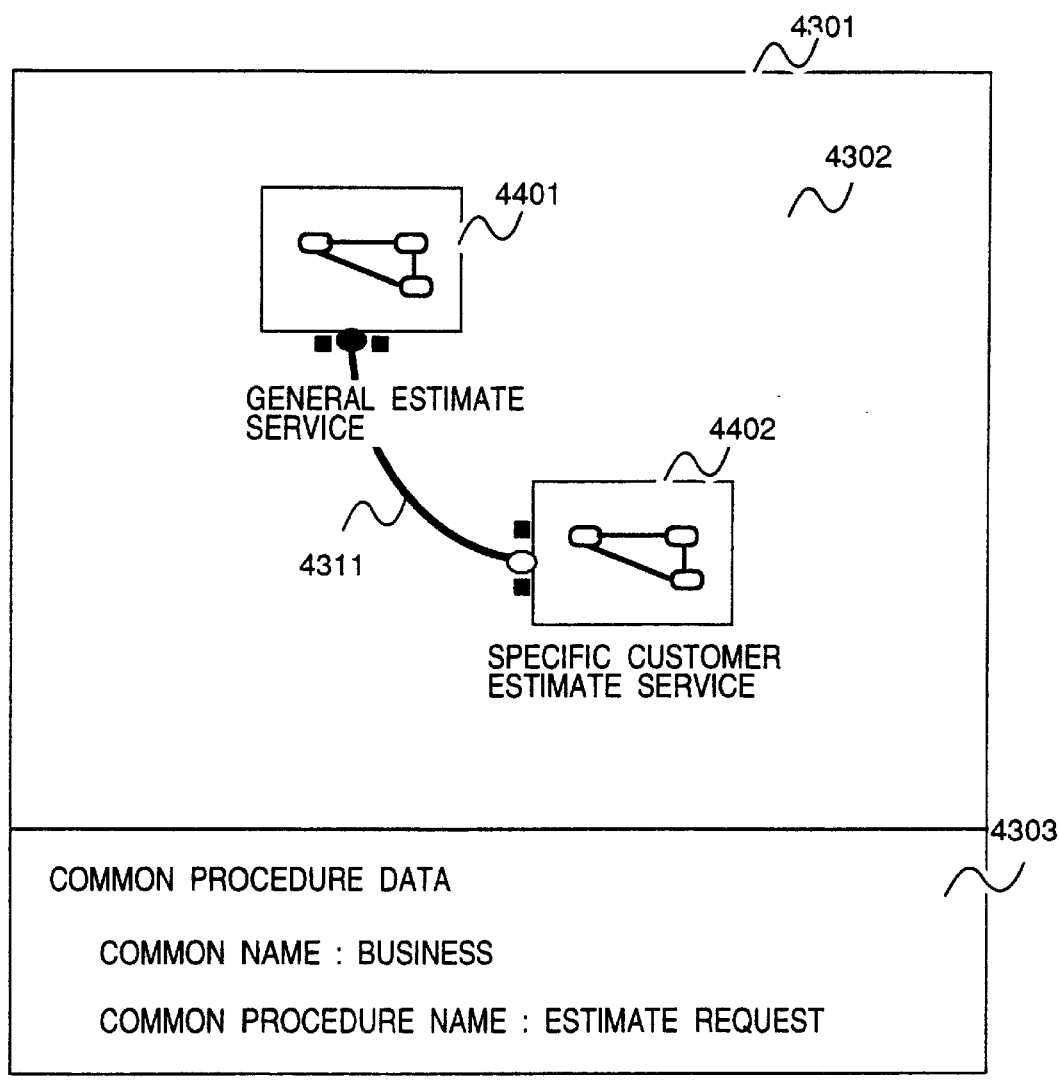
FIG. 44 shows a display example of relation data of the whole scenario shown in FIG. 28.

FIG. 44 shows an example of the display method of relation data of whole scenario of development subject applied to sales management.

Here, the area 4302 displaying the relations among scenarios of the whole development subject includes FIGS. 4401 and 4402 representing scenarios defined by the user and a connection line 4311 representing the relation between scenarios. If the relation connection line 4311 is selected, a part of the relation data of scenario is displayed in the area 4303 for displaying relation data.

According to the present invention, various attributes of system components are defined by means of interactive operation and the procedure call sequence is defined by taking a scenario as the unit and by means of interactive operation. Thereby, the requirement of a large-scale system can be easily acquired. According to the present invention, therefore, it becomes unnecessary to investigate the components needed for the system and describe a program beforehand unlike the conventional technique. In addition, it is unnecessary to describe a program whenever a change concerning components of the requirement is made. Even a system engineer having no programming knowledge can create and alter the requirement. Furthermore, since scenarios can be inputted by means of interactive operation, the requirement can be easily created and altered in a site of advance arrangement with the customer.

Furthermore, according to the present invention, a program for displaying the whole procedure call sequence of the system in an animation form can be automatically created by integrating the defined and inputted scenarios. According to the present invention, therefore, a change of the requirement caused when the whole visualized requirement of the system is evaluated by the system engineer with the customer can be easily effected interactively in that site by taking a scenario as the unit. In addition, the change can be easily displayed in that site in an animation form. Furthermore, works needed when the requirement is changed as in the conventional technique can be reduced.

Furthermore, according to the present invention, relations in a large amount of requirement of a large-scale system which can be easily acquired by the above described conventional technique can be visualized and displayed without requiring a new operation of the user, especially for a requirement explicitly specified in relation by the user. According to the present invention, therefore, relations of the whole requirement of the system can be easily confirmed.

Furthermore, according to the present invention, relations in the whole requirement of the system are displayed and consequently a scenario which is desired to be edited can be easily retrieved.

What is claimed is:

1. A requirement acquiring system comprising:
    means for inputting a requirement by using a requirement input device, said requirement input device including:
        means for arranging components of a development subject on a screen of a computer terminal;
        means for specifying, for each of the arranged components, a component name, a data item name, and a procedure name to be held by said component;
        means for displaying, for each procedure of the component, a list of procedures held by a component as a menu, selecting from said menu a procedure call sequence between components containing said procedure or a procedure call sequence within the component, repeating said displaying operation and said selecting operation, and thereby specifying a procedure call sequence held by the component, said procedure call sequence being an order of calling procedures held by components;
    means for generating component data, procedure call sequence data and scenario data, said component data having a record of said specified component name, data item name and procedure name, said procedure call sequence data having a record of said procedure call sequence, said scenario data holding names and peculiar numbers for said component data and said procedure call sequence data;
    said means for specifying a procedure call sequence held by the component comprising means for responding to a certain component name and a certain procedure name included in first scenario data of a certain requirement having identical names with a component name and a procedure name included in second scenario data, and means for specifying identity of the component and the procedure of the second scenario data with the component and the procedure of the first scenario data;
    means for generating identification data in each scenario data on the basis of a scenario peculiar number of each of said scenario data specified in identity;
    means for separately defining, for each requirement, procedures to be called subsequently to said procedures specified in identity and generating separate scenario data;
    means for generating whole identification data from said generated identification data of the scenario data;
    means for generating relation data among whole visualized requirements as scenario relation data from identification data of a group of requirements generated by said repetition; and
    means for displaying figures representing all of the requirements, and for displaying connection lines between relating requirements, on the basis of the relation data of the scenario, and thereby displaying relation data of the whole scenario.

2. A requirement acquiring system according to claim 1, wherein said means for generating identification data of each scenario data for each requirement specified in identity comprises means for generating, as identification data of scenario data, a part of scenario data associated with said component and procedure specified in identity, and wherein said means for displaying the relation data of the whole scenario comprises displaying relation data of the scenario by selecting displayed connection lines representing relations.

3. A requirement acquiring system according to claim 1, wherein said means for generating identification data of the scenario data for each requirement specified in identity comprises means for generating, as identification data of scenario data, a part of scenario data associated with said component and procedure specified in identity and sequence positions of procedures specified in identity in each requirement, and wherein said means for displaying the relation data of the whole scenario displays the relation data of the whole scenario by specifying and displaying positions of connection lines between relating requirements on the basis of sequence positions, in each requirement, of procedures, specified in identity, of relation data of the scenario.

4. A requirement acquiring system according to claim 1, wherein said means for specifying identity of the component and the procedure of the second scenario data with the component and the procedure of the first scenario data comprises means for specifying reference to the component and procedure of the first scenario data to be effected by the second scenario data, wherein said means for generating identification data of scenario data for each requirement specified in identity comprises means for generating a direction of said specified reference as identification data of scenario data, and wherein said means for displaying the relation data of the whole scenario comprises means for displaying, by means of connection lines between relating requirements, reference to the first scenario to be effected by the second scenario.

* * * * *